(12) United States Patent
Yano et al.

(10) Patent No.: US 11,114,259 B2
(45) Date of Patent: Sep. 7, 2021

(54) SWITCH BODY

(71) Applicant: Panasonic Intellectual Property Management Co., Ltd., Osaka (JP)

(72) Inventors: Kojiro Yano, Okayama (JP); Kenichi Matsumoto, Okayama (JP); Ryo Nakae, Okayama (JP); Masanori Mitsuoka, Okayama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/485,660

(22) PCT Filed: Dec. 26, 2017

(86) PCT No.: PCT/JP2017/046629
§ 371 (c)(1),
(2) Date: Aug. 13, 2019

(87) PCT Pub. No.: WO2018/150741
PCT Pub. Date: Aug. 23, 2018

(65) Prior Publication Data
US 2020/0312585 A1 Oct. 1, 2020

(30) Foreign Application Priority Data

Feb. 15, 2017 (JP) .............................. JP2017-026103
Mar. 22, 2017 (JP) .............................. JP2017-055246

(51) Int. Cl.
*H01H 13/04* (2006.01)
*H01H 13/10* (2006.01)
(Continued)

(52) U.S. Cl.
CPC ............ *H01H 13/10* (2013.01); *H01H 13/04* (2013.01); *H01H 13/14* (2013.01); *H01H 13/50* (2013.01)

(58) Field of Classification Search
CPC .......... H01H 2215/004; H01H 13/702; H01H 13/64; H01H 13/785; H01H 13/00;
(Continued)

(56) References Cited

U.S. PATENT DOCUMENTS 5,999,084 A   12/1999  Armstrong
6,274,825 B1   8/2001  Aaltonen et al.
(Continued)

FOREIGN PATENT DOCUMENTS

JP   10-13517 A    1/1998
JP   11-132872 A   5/1999
(Continued)

OTHER PUBLICATIONS

Non-Final Office Action dated Jun. 11, 2020, issued in U.S. Appl. No. 16/485,561. (17 pages).
(Continued)

*Primary Examiner* — Ahmed M Saeed
(74) *Attorney, Agent, or Firm* — Westerman, Hattori, Daniels & Adrian, LLP

(57) ABSTRACT

The switch body includes: a wiring substrate where first to fourth fixed contact members are formed; and a movable contact member including a pressure receiving part opposite from the second fixed contact member, a first outer edge facing the first fixed contact member, and a second outer edge facing the third fixed contact member. The fourth fixed contact member is formed in a region outside a projection region being a projection of the movable contact member on the wiring substrate and is in a position facing the first outer
(Continued)

edge when the second outer edge is moved to a region where the second fixed contact member is formed.

10 Claims, 25 Drawing Sheets

(51) Int. Cl.
  *H01H 13/14* (2006.01)
  *H01H 13/50* (2006.01)
(58) Field of Classification Search
  CPC .............. H01H 13/48; H01H 13/7006; H01H 2011/0075; H01H 2201/036; H01H 2025/048; H01H 2221/012; H01H 25/008; H01H 25/041; H01H 13/10; H01H 13/04; H01H 13/14; H01H 13/50
  See application file for complete search history.

(56) References Cited

U.S. PATENT DOCUMENTS

| | | | |
|---|---|---|---|
| 6,313,731 | B1 | 11/2001 | Vance |
| 6,563,415 | B2 | 5/2003 | Armstrong |
| 2008/0142350 | A1* | 6/2008 | Karaki ................. H01H 13/702 200/512 |
| 2014/0184231 | A1 | 7/2014 | Chern et al. |
| 2015/0027866 | A1* | 1/2015 | Morimoto ................. H01H 1/36 200/11 R |
| 2015/0090579 | A1 | 4/2015 | Kurikawa et al. |
| 2019/0362914 | A1 | 11/2019 | Yano et al. |

FOREIGN PATENT DOCUMENTS

| | | |
|---|---|---|
| JP | 2001-507162 A | 5/2001 |
| JP | 2001-324397 A | 11/2001 |
| JP | 2001-330527 A | 11/2001 |
| JP | 2001-350581 A | 12/2001 |
| JP | 2003-139628 A | 5/2003 |
| JP | 2005-71783 A | 3/2005 |
| JP | 2006-40808 A | 2/2006 |
| JP | 2012-4129 A | 1/2012 |
| JP | 2016-115401 A | 6/2016 |
| JP | 2016-159776 A | 9/2016 |
| WO | 98/28763 A1 | 7/1998 |
| WO | 2013/187397 A1 | 12/2013 |

OTHER PUBLICATIONS

International Search Report dated Mar. 20, 2018, issued in related International Application No. PCT/JP2017/046628 (2 pages).
International Search Report dated Mar. 20, 2018, issued in related International Application No. PCT/JP2017/046627 (2 pages).
International Search Report dated Apr. 3, 2018, issued in counterpart International Application No. PCT/JP2017/046629 (2 pages).
Final Office Action dated Dec. 10, 2020, issued in U.S. Appl. No. 16/485,561 (17 pages).

* cited by examiner

SWITCH BODY

CROSS-REFERENCE TO RELATED APPLICATION

The present application is the U.S. National Phase under 35 U.S.C. § 371 of International Application No. PCT/JP2017/046629, filed on Dec. 26, 2017, which claims the benefit of priority of Japanese Patent Application No. 2017-026103, filed on Feb. 15, 2017 and Japanese Patent Application No. 2017-055246, filed on Mar. 22, 2017, the entire contents of which are incorporated herein by reference.

TECHNICAL FIELD

The present disclosure relates to switch bodies used in operation units of various electronic devices.

BACKGROUND ART

Recently, there have been provided various electronic devices include a switch body in which a movable contact member is mounted on a wiring substrate serving as a base, for the purpose of enabling various types of operations.

Patent Literature 1 discloses a conventional switch body in which a movable contact member is mounted on a wiring substrate, for example. Formed on the wiring substrate are a circular first fixed contact member (in Patent Literature 1, the second fixed contact denoted by reference sign "1a") and a ring shaped second fixed contact member (in Patent Literature 2, the first fixed contact denoted by reference sign "1b") placed to surround the first fixed contact member. The movable contact member is an elastic metal part with a convex upward dome shape and is formed into a circular shape in a top view. The movable contact member is mounted on an upper surface of the wiring substrate so as to make an outer periphery thereof be in contact with the second fixed contact member. And, a central part of the movable contact member faces the first fixed contact member with a predetermined gap therebetween. When the central part of the movable contact member is pressed toward the wiring substrate and deformed, the movable contact member comes into contact with the first fixed contact member. Consequently, in the conventional switch body, the first fixed contact member and the second fixed contact member are electrically connected via the movable contact member. In summary, the conventional switch body is switched from an off state in which the first fixed contact member and the second fixed contact member are electrically insulated from each other, to an on state in which the first fixed contact member and the second fixed contact member are electrically connected to each other.

In the conventional switch body, the position of the movable contact member relative to the wiring substrate (base) depends on the position of the fixed contact members (the first fixed contact member and the second fixed contact member). To change the position of the movable contact member (movable electrode), change of the positions of the fixed contact members (fixed electrodes) is required.

The present disclosure relates to solutions to that prior problem and an object thereof would be to propose a switch body capable of changing a position of the movable electrode without changing positions of the fixed electrodes formed on the base.

CITATION LIST

Patent Literature

Patent Literature 1: JP 2006-40808 A

SUMMARY OF INVENTION

A switch body of one aspect according to the present disclosure includes: a base; and a movable electrode. The base includes: a first fixed electrode; a second fixed electrode placed next to the first fixed electrode to be electrically independent from the first fixed electrode; a third fixed electrode placed next to the second fixed electrode and on an opposite side of the second fixed electrode from the first fixed electrode; and a fourth fixed electrode placed next to the first fixed electrode and on an opposite side of the first fixed electrode from the second fixed electrode. The movable electrode includes; a pressure receiving part opposite from the second fixed electrode of the base; a first outer edge facing the first fixed electrode; and a second outer edge facing the third fixed electrode. The movable electrode is designed to allow movement of an opposite surface from the pressure receiving part toward the second fixed electrode when the pressure receiving part is pressed toward the base and then deformed. The fourth fixed electrode is formed in a region outside a projection region being a projection of the movable electrode on the base and is in a position facing the first outer edge of the movable electrode when the second outer edge of the movable electrode is moved to a region where the second fixed electrode is formed.

DESCRIPTION OF EMBODIMENTS

1. Embodiments 1.1 Embodiment 1

1.1.1 Outline

Figure 1:
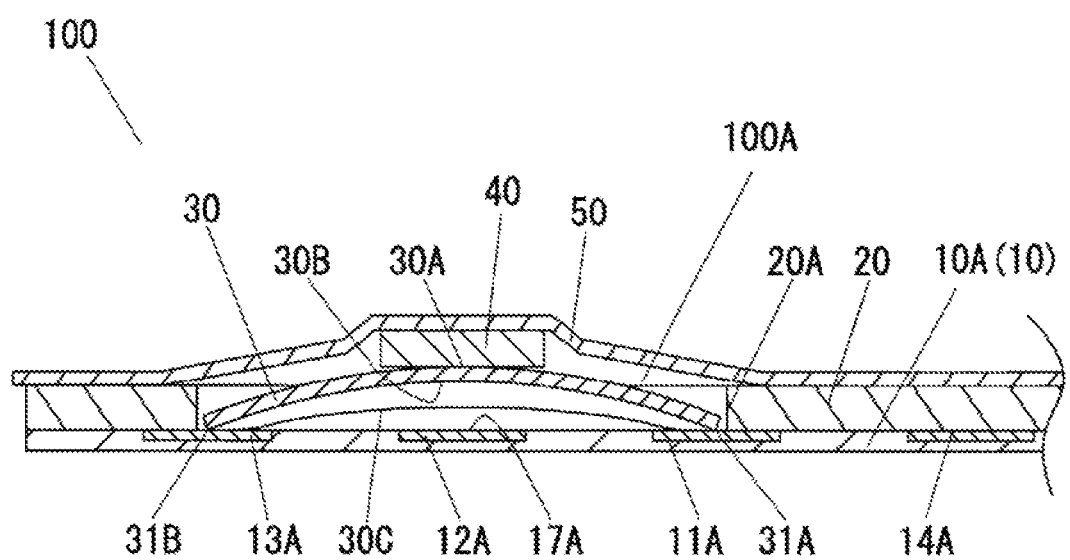
FIG. 1 is a section of a switch body of Embodiment 1.

FIG. 1 shows a switch body 100 of the present embodiment. The switch body 100 is an input device for providing input to various electronic devices. The switch body 100 includes: a wiring substrate 10 including a first fixed electrode 11A, a second fixed electrode 12A placed next to the first fixed electrode 11A to be electrically independent from the first fixed electrode 11A, a third fixed electrode 13A placed next to the second fixed electrode 12A and on an opposite side of the second fixed electrode 12A from the first fixed electrode 11A, and a fourth fixed electrode 14A placed next to the first fixed electrode 11A and on an opposite side of the first fixed electrode 11A from the second fixed electrode 12A; and a movable electrode 30 including a pressure receiving part 30A opposite from the second fixed electrode 12A.

The movable electrode 30 is mounted on the wiring substrate 10. Accordingly, the movable electrode 30 includes a first outer edge 31A in contact with the first fixed electrode 11A, the first outer edge 31A being part of an outer limit of the movable electrode 30. Similarly, the movable electrode 30 includes a second outer edge 31B in contact with the second fixed electrode 12A, the first outer edge 31A being part of an outer limit of the movable electrode 30. The movable electrode 30 is designed to electrically interconnect the first fixed electrode 11A and the second fixed electrode 12A by making the opposite surface from the pressure receiving part 30A (the movable electrode part 30B) in contact with the second fixed electrode 12A when the pressure receiving part 30A is pressed toward the wiring substrate 10 and deformed.

The fourth fixed electrode 14A is formed in a region outside a projection region being a projection of the movable electrode 30 on the wiring substrate 10. And, the fourth fixed electrode 14A is in a position in contact with the first outer edge 31A of the movable electrode 30 when the second outer edge 31B of the movable electrode 30 is moved to a region where the second fixed electrode 12A is formed.

The switch body 100 of the present embodiment can offer advantageous effects of being capable of changing a position of the movable electrode 30 relative to the wiring substrate 10 without changing positions of the fixed electrodes (the first to fourth fixed electrodes 11A to 14A) formed in the wiring substrate 10.

In summary, it is possible to offer advantageous effects of realizing a switch body capable of changing a position of the movable electrode relative to the wiring substrate without changing positions of the fixed electrodes formed on the wiring substrate.

Especially, in the present embodiment, the first fixed electrode 11A is one of a plurality of first fixed electrodes 11A to 11C. The second fixed electrode 12A is one of a plurality of second fixed electrodes 12A to 12C. The third fixed electrode 13A is one of a plurality of third fixed electrodes 13A to 13C. The fourth fixed electrode 14A is one of a plurality of fourth fixed electrodes 14A to 14C. The movable electrode 30 is one of a plurality of movable electrodes 30. The plurality of movable electrodes 30 are designed to electrically interconnect the plurality of first fixed electrodes 11A to 11C and the plurality of second fixed electrodes 12A to 12C when the movable electrodes 30 are pressed toward the wiring substrate 10 and deformed, thereby coming into contact with the plurality of second fixed electrodes 12A to 12C, respectively.

1.1.2 Configuration

Hereinafter, the switch body 100 of the present embodiment is described with reference to FIG. 1 to FIG. 6.

Figure 2:
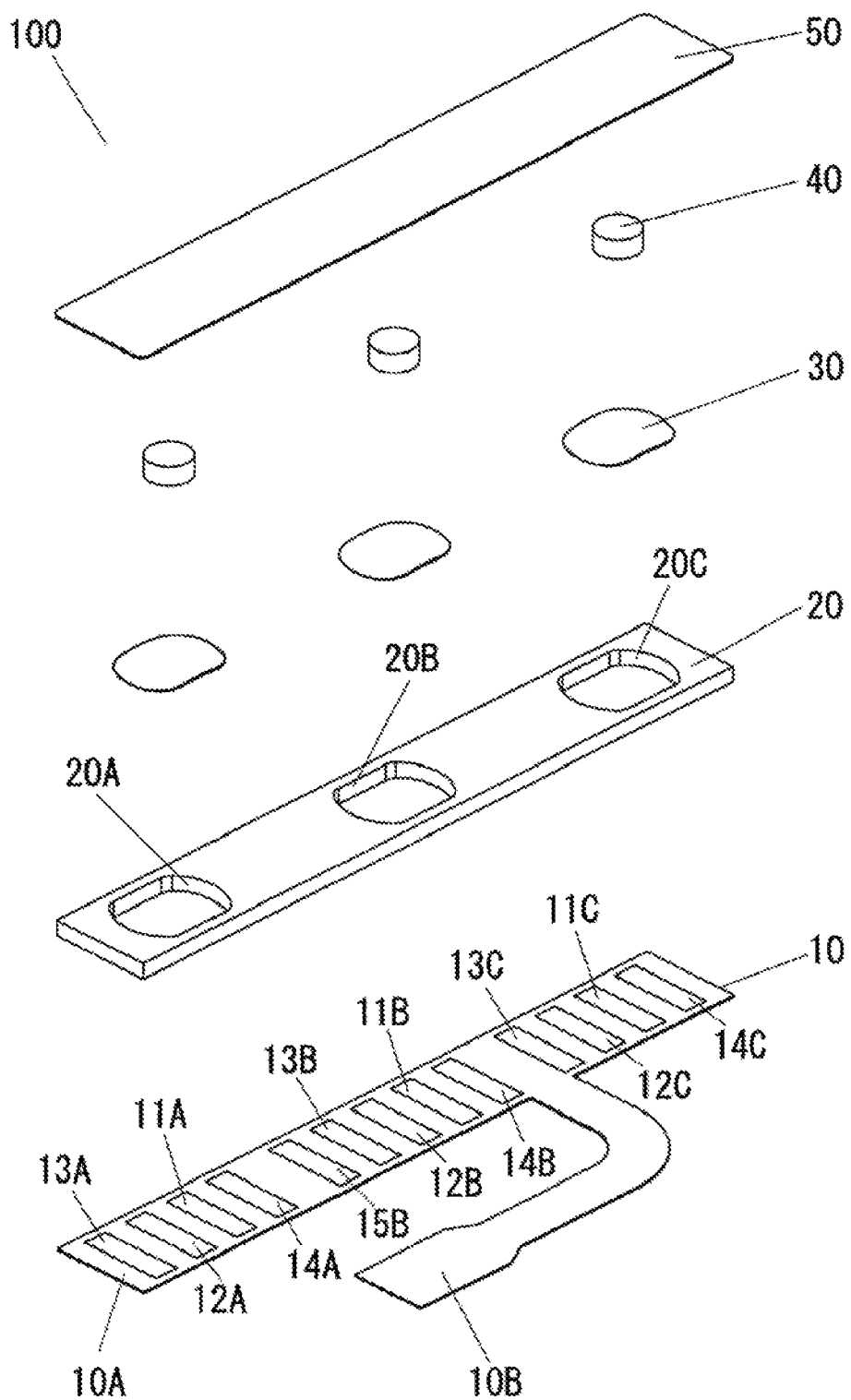
FIG. 2 is an exploded perspective view of the switch body.

As shown in FIG. 1 and FIG. 2, the switch body 100 includes the wiring substrate 10, a spacer 20, the movable electrode (movable contact member) 30, a pressing part 40, and a protective sheet 50. On an upper surface of the wiring substrate 10, the first fixed electrode (first fixed contact member) 11A, the second fixed electrode (second fixed contact member) 12A, the third fixed electrode (third fixed contact member) 13A, and the fourth fixed electrode (fourth fixed contact member) 14A, which each are formed into a strip shape, are arranged side by side.

Preferably, the first fixed electrode 11A and the third fixed electrode 13A are electrically interconnected by a connection wire formed in the wiring substrate 10, for example. The second fixed electrode 12A is formed between the first fixed electrode 11A and the third fixed electrode 13A so as to be electrically independent from the first fixed electrode 11A and the third fixed electrode 13A. In other words, the second fixed electrode 12A is placed next to the first fixed electrode 11A. The third fixed electrode 13A is placed next to the second fixed electrode 12A and on an opposite side of the second fixed electrode 12A from the first fixed electrode 11A.

Figure 4:
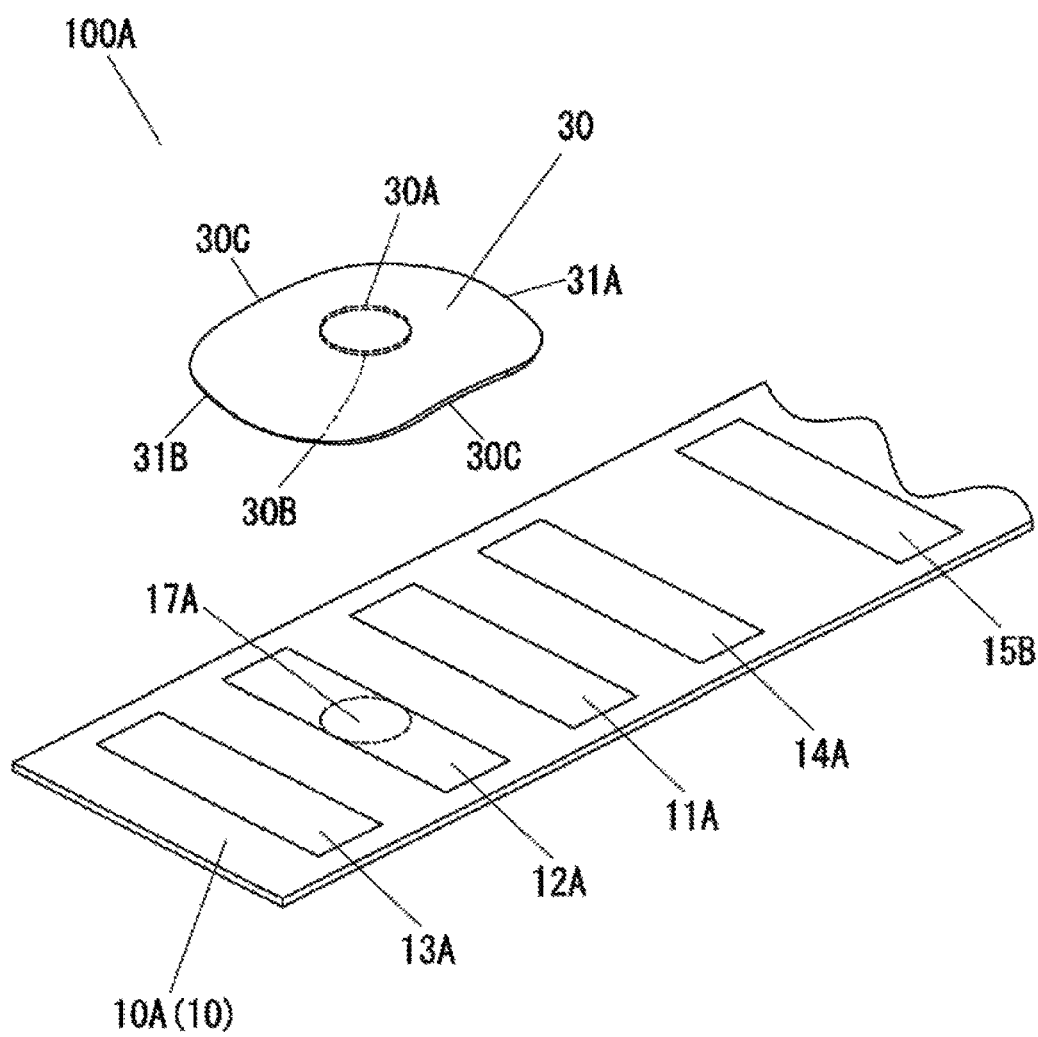
FIG. 4 is an explanatory view of a configuration of a switch unit of the switch body.

The fourth fixed electrode 14A is placed next to the first fixed electrode 11A and on an opposite side of the first fixed electrode 11A from the second fixed electrode 12A. Stated differently, the first fixed electrode 11A is formed between the second fixed electrode 12A and the fourth fixed electrode 14A. Preferably, the second fixed electrode 12A and the fourth fixed electrode 14A are electrically interconnected by a connection wire formed in the wiring substrate 10, for example. As shown in FIG. 4, the switch body 100 includes at least a switch unit 100A constituted by the movable electrode 30, the first fixed electrode 11A, and the second fixed electrode 12A.

Figure 5:
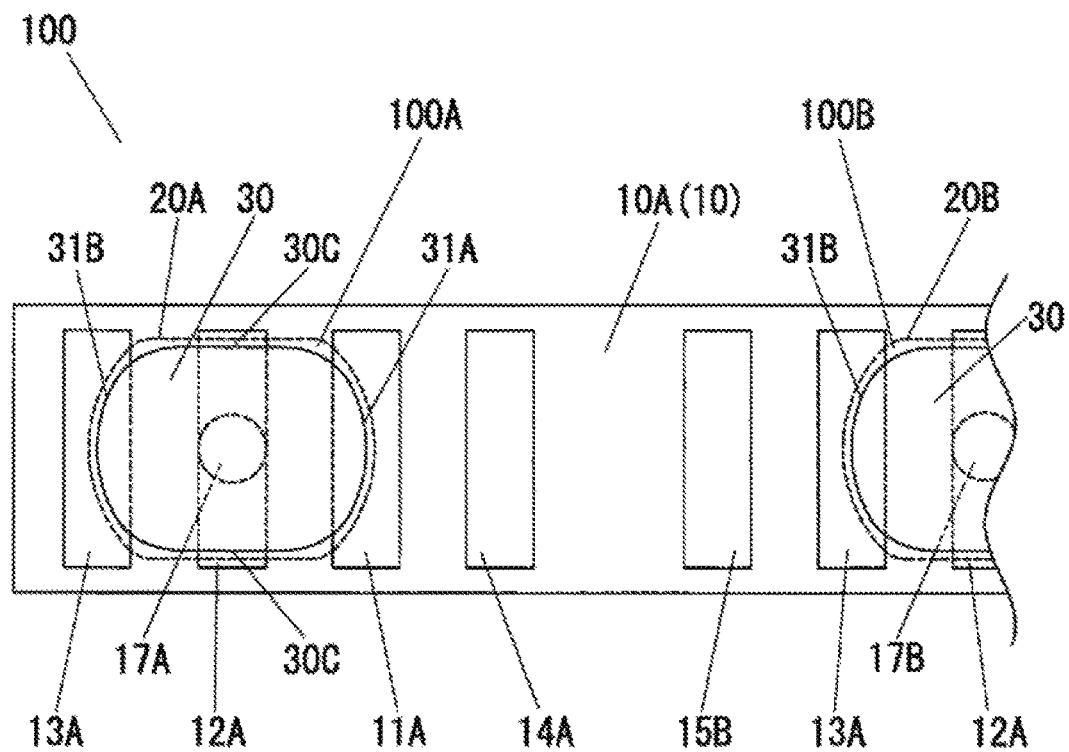
FIG. 5 is a partially enlarged top view of the switch body.

As shown in FIG. 1, FIG. 4, and FIG. 5, the movable electrode 30 is a member of an elastic metal thin plate formed to be convex upward (i.e., a metal dome). The movable electrode 30 is mounted on part of the upper surface of the wiring substrate 10 exposed via an opening 20A of the spacer 20 so that an outer edge (first outer edge) 31A which has an arc shape and is part of an outer limit of the movable electrode 30 is in contact with the first fixed electrode 11A. Similarly, the movable electrode 30 is mounted on part of the upper surface of the wiring substrate 10 exposed via the opening 20A of the spacer 20 so that an outer edge (second outer edge) 31B which has an arc shape and is part of an outer limit of the movable electrode 30 is in contact with the third fixed electrode 13A. Especially, the first outer edge 31A and the second outer edge 31B are opposite parts in a length axis of the outer limit of the movable electrode 30 and are opposite from each other with regard to a central axis of the movable electrode 30.

The movable electrode 30 includes the pressure receiving part 30A and the opposite surface from the pressure receiving part 30A faces the second fixed electrode 12A with a predetermined gap f therebetween. As shown in FIG. 4, as to the movable electrode 30, part of the opposite surface from the pressure receiving part 30A corresponding to the pressure receiving part 30A constitutes a movable electrode part (movable contact part) 30B. A region of the second fixed electrode 12A facing the movable electrode part 30B constitutes a fixed electrode part (fixed contact part) 17A.

The movable electrode 30 is designed to make the opposite surface from the pressure receiving part 30A (the movable electrode part 30B) in contact with the fixed electrode part 17A of the second fixed electrode 12A when the pressure receiving part 30A is pressed toward the upper surface of the wiring substrate 10 and deformed. Accordingly, the first fixed electrode 11A and the second fixed electrode 12A are electrically connectable via the movable electrode 30. Therefore, switching from an off state in which the first fixed electrode 11A are the second fixed electrode 12A are electrically insulated from each other to an on state in which the first fixed electrode 11A are the second fixed electrode 12A are electrically connected to each other can be made.

As shown in FIG. 1, the pressing part 40 is placed in a position facing the pressure receiving part 30A of the movable electrode 30 and is held under a lower surface of the protective sheet 50. The protective sheet 50 is placed to cover the opening 20A of the spacer 20 and is held on an upper surface of the spacer 20.

Figure 6:
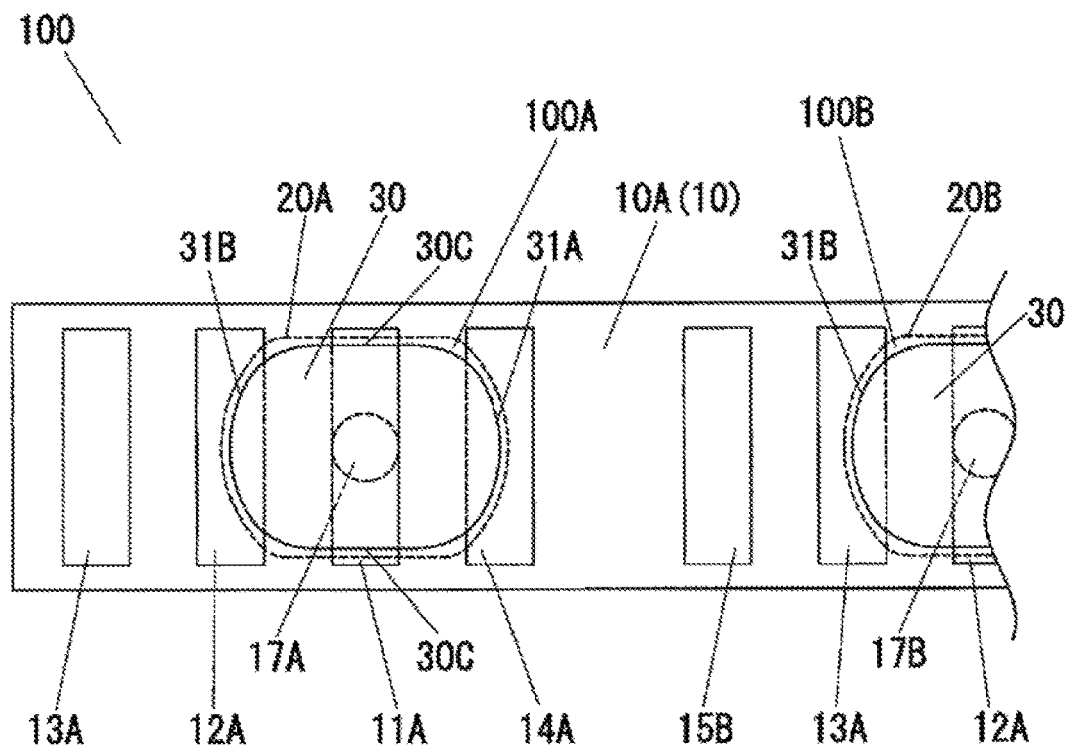
FIG. 6 is an explanatory view of a scene where a position of a movable contact member relative to a wiring substrate in the switch body is changed.

As shown in FIG. 5, the first fixed electrode 11A, the second fixed electrode 12A, and the third fixed electrode 13A are positioned on part of the upper surface of the wiring substrate 10 corresponding to the inside of the opening 20A of the spacer 20. And, the fourth fixed electrode 14A is positioned on part of the upper surface of the wiring substrate 10 corresponding to the outside of the opening 20A of the spacer 20. Accordingly, the fourth fixed electrode 14A overlaps with the spacer 20. Therefore, unnecessary exposure of the fourth fixed electrode 14A can be reduced and undesired corrosion such as oxidation can be also reduced. Further, the fourth fixed electrode 14A is formed in a region outside a projection region being a projection of the movable electrode 30 on the wiring substrate 10. As shown in FIG. 6, the fourth fixed electrode 14A is in a position in contact with the outer edge 31A of the movable electrode 30 when the outer edge 31B of the movable electrode 30 is moved to a region where the second fixed electrode 12A is formed.

Note that, it is preferable that an outer shape of the first fixed electrode 11A is same as an outer shape of the second fixed electrode 12A.

According to this configuration, the switch body 100 enables changing the position of the movable electrode 30 relative to the wiring substrate 10 from the position shown in FIG. 5 to the position shown in FIG. 6 without changing the positions of the first fixed electrode 11A, the second fixed electrode 12A, the third fixed electrode 13A, and the fourth fixed electrode 14A formed on the wiring substrate 10 serving as the base.

FIG. 5 shows that the movable electrode 30 is mounted on the wiring substrate 10 so as to make the pressure receiving part 30A corresponds to the second fixed electrode 12A. In this case, a partial region of the second fixed electrode 12A constitutes the fixed electrode part 17A allowed to be in contact with the movable electrode part 30B. Note that, the outer edge 31A of the movable electrode 30 is in contact with the first fixed electrode 11A. The outer edge 31B of the movable electrode 30 is in contact with the third fixed electrode 13A.

In contrast, FIG. 6 shows that the movable electrode 30 is moved and mounted on the wiring substrate 10 so as to make the pressure receiving part 30A correspond to the first fixed electrode 11A. In this case, a partial region of the first fixed electrode 11A constitutes the fixed electrode part 17A allowed to be in contact with the movable electrode part 30B. Note that, the outer edge 31A of the movable electrode 30 is in contact with the fourth fixed electrode 14A. The outer edge 31B of the movable electrode 30 is in contact with the second fixed electrode 12A.

In summary, the switch body 100 is configured so that the outer edge 31A which is part of the outer limit of the movable electrode 30 is positioned in the region where the fourth fixed electrode 14A is formed, when the outer edge 31B which is part of the outer limit of the movable electrode 30 is moved to the region where the second fixed electrode 12A is formed.

Note that, in the switch body 100 shown in FIG. 6, as to the movable electrode 30, when the pressure receiving part 30A is pressed toward the wiring substrate 10 and deformed, the opposite surface from the pressure receiving part 30A (the movable electrode part 30B) comes into contact with the fixed electrode part 17A of the first fixed electrode 11A. Consequently, the first fixed electrode 11A and the second fixed electrode 12A are electrically connected through the movable electrode 30. Therefore, switching from the off state in which the first fixed electrode 11A are the second fixed electrode 12A are electrically insulated from each other to the on state in which the first fixed electrode 11A are the second fixed electrode 12A are electrically connected to each other can be made.

Also in each of states shown in FIG. 5 and FIG. 6, the switch body 100 can be switched from the off state in which the first fixed electrode 11A are the second fixed electrode 12A are electrically insulated from each other to the on state in which the first fixed electrode 11A are the second fixed electrode 12A are electrically connected to each other. Therefore, it is possible to change the position of the movable electrode 30 without changing the positions of the fixed electrodes (the first fixed electrode 11A, the second fixed electrode 12A, the third fixed electrode 13A, and the fourth fixed electrode 14A). Therefore, various types of switch bodies 100 different in the position of the movable electrode 30 can be produced by one type of wiring substrate 10.

Further, as shown in FIG. 5, the switch body 100 may be configured so that the outer edge 31A and the outer edge 31B of the movable electrode 30 are in contact with upper surfaces of the first fixed electrode 11A and the third fixed electrode 13A, respectively. According to this configuration, the movable electrode 30 can be mounted on the wiring substrate 10 symmetrically and thus operation feeling of touch can be stabilized.

Note that, in the state shown in FIG. 6, the outer edge 31A and the outer edge 31B of the movable electrode 30 are in contact with upper surfaces of the second fixed electrode 12A and the fourth fixed electrode 14A, respectively. Therefore, the movable electrode 30 can be mounted on the wiring substrate 10 symmetrically and thus operation feeling of touch can be stabilized.

Accordingly, regardless of whether the switch body 100 is in the state shown in FIG. 5 or the state shown in FIG. 6, the movable electrode 30 can be mounted on the upper surface of the wiring substrate 10 so that the movable electrode 30 is not inclined relative to the upper surface of the wiring substrate 10. Thus operation feeling of touch can be stabilized.

Hereinafter, detailed configuration and description of the switch body 100 is given.

Figure 3:
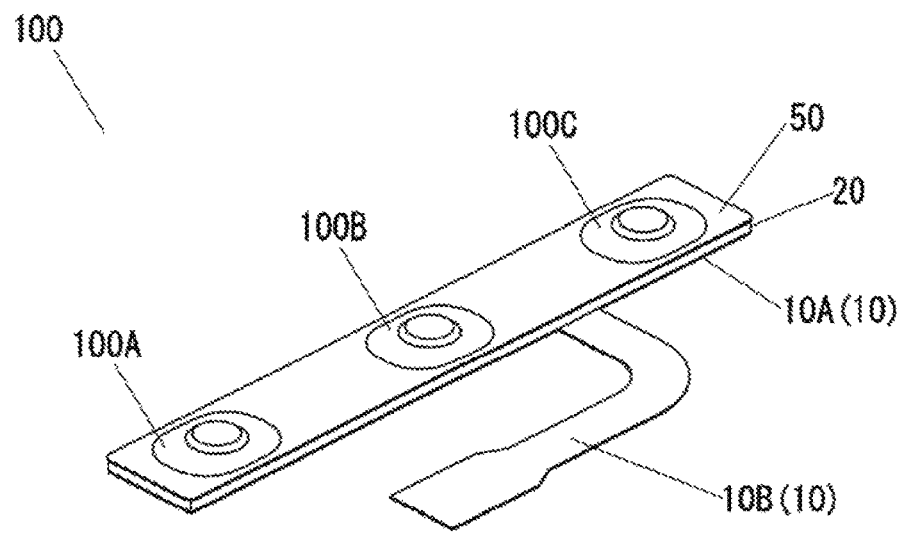
FIG. 3 is a perspective view of the switch body.

As shown in FIG. 1 to FIG. 3, the switch body 100 includes the wiring substrate (base) 10, the spacer 20, the three movable electrodes (movable contact members) 30, the three pressing parts 40, and the protective sheet 50.

The wiring substrate 10 is a wiring substrate formed with predetermined patterned conductors. The wiring substrate 10 may be made by use of a flexible substrate (FPC) made of polyimide which has flexibility, for example. The wiring substrate 10 includes a body part 10A which has a strip shape with a predetermined width, and an extending part 10B with a predetermined width extending outward from the body part 10A.

Formed on an upper surface of the body part 10A of the wiring substrate 10 of the body part 10A are the first fixed electrodes (first fixed contact members) 11A to 11C, the second fixed electrodes (second fixed contact members) 12A to 12C, the third fixed electrodes (third fixed contact members) 13A to 13C, the fourth fixed electrodes (fourth fixed contact members) 14A to 14C, and a fifth fixed electrode (fifth fixed contact member) 15B. The wiring substrate 10 is used as a base (support) in which the first fixed electrodes 11A to 11C, the second fixed electrodes 12A to 12C, the third fixed electrodes 13A to 13C, the fourth fixed electrodes 14A to 14C, and the fifth fixed electrode 15B are formed and which supports them.

As shown in FIG. 3, the switch body 100 includes three switch units (the switch units 100A to 100C). Note that, the switch units 100A to 100C are arranged in line at equal intervals.

As shown in FIG. 4, the switch unit 100A is constituted by the movable electrode 30, the first fixed electrode 11A, the second fixed electrode 12A, the third fixed electrode 13A, and the fourth fixed electrode 14A. The switch unit 100B is constituted by the movable electrode 30, the first fixed electrode 11B, the second fixed electrode 12B, the third fixed electrode 13B, the fourth fixed electrode 14B, and the fifth fixed electrode 15B. The switch unit 100C is constituted by the movable electrode 30, the first fixed electrode 11C, the second fixed electrode 12C, the third fixed electrode 13C, and the fourth fixed electrode 14C. Note that, as to the switch units 100B and 100C, the same components as the switch unit 100A may not be described but different components from the switch unit 100A may be described.

Next, the first fixed electrode 11A, the second fixed electrode 12A, the third fixed electrode 13A, and the fourth fixed electrode 14A which constitute the switch unit 100A are described. As shown in FIG. 2 and other figures, the third fixed electrode 13A, the second fixed electrode 12A, the first fixed electrode 11A, and the fourth fixed electrode 14A are arranged in the length axis of the body part 10A in this order. The first fixed electrode 11A and the third fixed electrode 13A are electrically connected via a wiring line provided to the body part 10A. The second fixed electrode 12A and the fourth fixed electrode 14A are electrically connected via a wiring line provided to the body part 10A.

And, the first fixed electrode 11A and the second fixed electrode 12A are electrically independent from each other and electrically connected to connection terminals formed on a top end of the extending part 10B by connection lines provided to the wiring substrate 10, respectively.

Next, the first fixed electrode 11B, the second fixed electrode 12B, the third fixed electrode 13B, the fourth fixed electrode 14B and the fifth fixed electrode 15B which constitute the switch unit 100B are described. Note that, configurations of the first fixed electrode 11B, the second fixed electrode 12B, the third fixed electrode 13B, and the fourth fixed electrode 14B are same as configurations of the first fixed electrode 11A, the second fixed electrode 12A, the third fixed electrode 13A, and the fourth fixed electrode 14A which has been already described, and therefore descriptions thereof may be omitted. Therefore, in the following, mainly the configuration of the fifth fixed electrode 15B is described.

As shown in FIG. 2, the fifth fixed electrode 15B is placed next to the third fixed electrode 13B. As described in detail, the fifth fixed electrode 15B is placed next to the third fixed electrode 13B and on an opposite side of the third fixed electrode 13B from the second fixed electrode 12B. The fifth fixed electrode 15B is electrically connected to the second fixed electrode 12B and the fourth fixed electrode 14B through wiring lines provided to the body part 10A.

Note that, also in the switch unit 100B, the first fixed electrode 11B and the second fixed electrode 12B are electrically independent from each other and electrically connected to connection terminals formed on the top end of the extending part 10B by connection lines provided to the wiring substrate 10, respectively.

Configurations of the first fixed electrode 11C, the second fixed electrode 12C, the third fixed electrode 13C, and the fourth fixed electrode 14C which constitute the switch unit 100C are same as configurations of the first fixed electrode 11A, the second fixed electrode 12A, the third fixed electrode 13A, and the fourth fixed electrode 14A which has been already described, and therefore descriptions thereof may be omitted.

Note that, the first fixed electrodes 11A to 11C, the second fixed electrodes 12A to 12C, the third fixed electrodes 13A to 13C, the fourth fixed electrodes 14A to 14C, and the fifth fixed electrode 15B, which has been already described, each have an almost strip shape in a top view and may preferably have the same visible shape.

The spacer 20 has a predetermined thickness and is made of insulating resin material. The spacer 20 is a strip shaped member with an outer shape which is same as that of the body part 10A of the wiring substrate 10 in a top view. The spacer 20 is fixed to the upper surface of the wiring substrate 10 with adhesive such as thermally curable adhesive and ultraviolet curable (UV curable) adhesive applied on a lower surface of the spacer 20. In the spacer 20, the openings 20A to 20C are formed. The openings 20A to 20C are arranged in line with equal intervals.

The openings 20A to 20C are formed in positions corresponding to the first fixed electrodes 11A to 11C, respectively. The first fixed electrodes 11A to 11C, the second fixed electrodes 12A to 12C, and the third fixed electrodes 13A to 13C are exposed through the openings 20A to 20C of the spacer 20, respectively. The openings 20A to 20C have top view shapes slightly larger than a top view shape of the movable electrode 30. In the present embodiment, the openings 20A to 20C have ellipse shapes (oval shapes) in their top views. The movable electrodes 30 are accommodated inside the openings 20A to 20C, respectively. Consequently, the movable electrodes 30 are held with positions thereof being limited in the horizontal direction.

Note that, in the present embodiment, the spacer 20 where the three openings 20A to 20C are formed is placed on the wiring substrate 10. Alternatively, three spacers each including a single opening 20A only can be used. These spacers may be placed on the upper surface of the wiring substrate 10 to be arranged side by side.

The movable electrode 30 is made of an elastic thin metal plate and is formed into a convex upward dome shape. In a top view, the movable electrode 30 has a so-called ellipse shape (oval shape) obtained by cutting from a circle shape off opposite ends along parallel straight lines. As shown in FIG. 4, in a top view, the movable electrode 30 includes two straight sides 30C formed by cutting along parallel straight lines and the outer edges 31A and 31B which have arc shapes and remain after cutting. Note that, the reference signs for the straight sides 30C and the outer edges 31A and 31B are presented in only FIG. 1, FIG. 4, FIG. 5, and FIG. 6, and omitted in other figures.

In the present embodiment, the three movable electrodes 30 are accommodated in the openings 20A to 20C of the spacer 20 and mounted on the upper surface of the wiring substrate 10. Accordingly, the movable electrodes 30 have lower ends of the outer edges 31A and 31B be in contact with upper surfaces of the first fixed electrodes 11A to 11C and the third fixed electrodes 13A to 13C of the wiring substrate 10, respectively. Note that, the movable electrode 30 is formed of an object with a circular shape in a top view thereof to have an ellipse shape. Height positions of lower ends of the straight sides 30C are higher than the lower ends of the outer edges 31A and 31B. Therefore, as apparent from FIG. 1 and its related part, the second fixed electrodes 12A to 12C are not in contact with the movable electrodes 30.

As shown in FIG. 4, the movable electrode 30 includes the pressure receiving part 30A and the movable electrode part 30B. The pressure receiving part 30A is positioned in a central part of the movable electrode 30. Stated differently, the pressure receiving part 30A includes a region of the movable electrode 30 which protrudes most upward. Stated differently, the pressure receiving part 30A includes a region which is most apart from the upper surface of the wiring substrate 10 in a normal direction of that upper surface. As shown in FIG. 4, part of the opposite surface of the movable electrode 30 from the pressure receiving part 30A which corresponds to the pressure receiving part 30A constitutes the movable electrode part 30B. The movable electrode parts 30B of the respective movable electrodes 30 face the upper surfaces of the second fixed electrodes 12A to 12C with predetermined gap therebetween. Note that, the reference signs for the pressure receiving part 30A and the movable electrode part 30B are presented in only FIG. 1, FIG. 4, FIG. 5, and FIG. 6, and omitted in other figures.

In this regard, as shown in FIG. 4, a region of the second fixed electrode 12A facing the movable electrode part 30B constitutes the fixed electrode part 17A. Note that, no detailed illustration and indication by the reference signs are given, but regions of the second fixed electrodes 12B and 12C facing the movable electrode parts 30B of the movable electrodes 30 constitute the fixed electrode parts 17B and 17C, respectively.

As shown in FIG. 2, the pressing part 40 is a member made of insulating resin material and having a solid cylindrical shape. In the present embodiments, the three pressing parts 40 are individually fixed to the lower surface of the protective sheet 50.

Note that, the protective sheet 50 and the pressing part 40 are welded by laser irradiation or ultrasonic treatment. The pressing parts 40 face the pressure receiving parts 30A of the movable electrodes 30, individually. In other words, the pressing parts 40 are placed on the upper surfaces of the central parts of the movable electrodes 30, individually. Note that, to weld the protective sheet 50 and the pressing part 40, they may preferably be made of the same material. Alternatively, the pressing part 40 may be fixed to the protective sheet 50 with thermally curable adhesive or ultraviolet curable (UV curable) adhesive. Alternatively, the pressing part 40 may be fixed to the protective sheet 50 by pressing the pressing part 40 into the lower surface of the protective sheet 50 with heating.

The protective sheet 50 is made of an insulating film. The protective sheet 50 is placed above the spacer 20 to cover the openings 20A to 20C. And, the protective sheet 50 has its outer periphery fixed to the upper surface of the spacer 20. Accordingly, the openings 20A to 20C of the spacer 20 are closed by the protective sheet 50 and thus sealed. Alternatively, the protective sheet 50 may be fixed to surround the entire outer limits or their vicinity of the openings 20A to 20C of the spacer 20. Note that, in the present embodiment, the protective sheet 50 is welded to the upper surface of the spacer 20 by laser irradiation or ultrasonic treatment. To weld the protective sheet 50 and the spacer 20, they may preferably be made of the same material. Alternatively, the protective sheet 50 may be held on the upper surface of the spacer 20 with thermally curable adhesive, ultraviolet curable (UV curable) adhesive, or glue.

In the present embodiment, the single protective sheet 50 covers the openings 20A to 20C. Alternatively, the openings 20A to 20C may be individually covered with three protective sheets smaller than the protective sheet 50.

The switch body 100 is configured as above. And, as described above, the switch body 100 is configured to include the three switch units 100A to 100C arranged side by side. Note that, the technical concept derived from the present invention may apply to the switch body including the single switch unit 100A only.

Next, operation of the switch body 100 is described briefly with reference to an operation of the switch unit 100A as one example. Note that, operations of the switch units 100B and 100C are similar to the operation of the switch unit 100A. When the pressing part 40 is pressed downward by way of the protective sheet 50, resultant pressing force is transferred to the pressure receiving part 30A of the movable electrode 30 through the pressing part 40. The movable electrode 30 is inverted to be convex downward with a click. Hence, the movable electrode part 30B of the movable electrode 30 and the fixed electrode part 17A of the second fixed electrode 12A are in contact with each other. As a result, the first fixed electrode 11A and the second fixed electrode 12A are electrically interconnected by the movable electrode 30 and thus the switch unit 100A is turned into the on state. After the pressing force is removed, the movable electrode 30 is recovered to its original convex upward shape by its own restoration force, and therefore turned into the off state.

Note that, it may be expected that stability of electrical connection in a switching operation is improved when the first fixed electrode 11A and the third fixed electrode 13A are electrically connected. However, it is sufficient that an electric path between the first fixed electrode 11A and the second fixed electrode 12A is made via the movable electrode 30. Accordingly, the first fixed electrode 11A and the third fixed electrode 13A may not always be electrically connected each other. Like the switch body 100 of the present embodiment, each of the outer edges 31A and 31B of the movable electrode 30 may be made to be in contact with one of the first fixed electrode 11A and the third fixed electrode 13A by providing the third fixed electrode 13A. In this case, the movable electrode 30 can be mounted on the wiring substrate 10 in a symmetrical manner. Thus, this may result in improvement of stability of operation feeling of touch.

As shown in FIG. 6, the fourth fixed electrode 14A of the switch body 100 of the present embodiment is placed in a position in contact with the outer edge 31A which is part of the outer limit of the movable electrode 30 when the outer edge 31B which is other part of the outer limit of the movable electrode 30 is moved to the region where the second fixed electrode 12A is formed. Stated differently, the fourth fixed electrode 14A is placed so that a distance between inner sides of the second fixed electrode 12A and the fourth fixed electrode 14A is shorter than the length of the movable electrode 30 (the distance between the outer edges 31A and 31B) and outer sides of the second fixed electrode 12A and the fourth fixed electrode 14A is longer than the length of the movable electrode 30.

According to this configuration, the switch body 100 allows changing the position of the movable electrode 30 relative to the wiring substrate 10 from the position shown in FIG. 5 to the position shown in FIG. 6 without changing the positions of the first fixed electrode 11A, the second fixed electrode 12A, the third fixed electrode 13A, and the fourth fixed electrode 14A formed in the wiring substrate 10.

FIG. 5 and FIG. 6 do not show the pressing part 40 and the protective sheet 50 but omit them only for concise explanation. Note that, as to the spacer 20, FIG. 5 and FIG. 6 shows the opening 20A only and the opening 20A is illustrated by a broken line. Note that, in FIG. 6, the spacer 20 is different in the position of the opening 20A in accordance with change in the position of the aforementioned movable electrode 30.

FIG. 5 shows that the movable electrode 30 is mounted on the wiring substrate 10 so that the pressure receiving part 30A corresponds to the second fixed electrode 12A. In this case, a partial region of the second fixed electrode 12A constitutes the fixed electrode part 17A in contact with the movable electrode part 30B. Note that, the outer edge 31A of the movable electrode 30 is in contact with the first fixed electrode 11A. The outer edge 31B of the movable electrode 30 is in contact with the third fixed electrode 13A.

In contrast, FIG. 6 shows that the movable electrode 30 is moved and then mounted on the wiring substrate 10 so that the pressure receiving part 30A corresponds to the first fixed electrode 11A. In this case, a partial region of the first fixed electrode 11A constitutes the fixed electrode part 17A in contact with the movable electrode part 30B. Note that, the outer edge 31A of the movable electrode 30 is in contact with the fourth fixed electrode 14A. The outer edge 31B of the movable electrode 30 is in contact with the second fixed electrode 12A.

In summary, the switch body 100 is configured so that the outer edge 31A being part of the outer limit of the movable electrode 30 is in a position within a region where the fourth fixed electrode 14A is formed when the outer edge 31B being part of the outer limit of the movable electrode 30 is moved into a region where the second fixed electrode 12A is formed.

Note that, in the switch body 100 shown in FIG. 6, regarding the movable electrode 30, when the pressure receiving part 30A is pressed to get closer to the upper surface of the wiring substrate 10 and deformed, the opposite surface from the pressure receiving part 30A (the movable electrode part 30B) comes into contact with the fixed electrode part 17A of the first fixed electrode 11A. Accordingly, the first fixed electrode 11A and the second fixed electrode 12A are electrically connected through the movable electrode 30. Therefore, switching can be made from the off state where the first fixed electrode 11A and the second fixed electrode 12A are electrically insulated, to the on state where they are electrically connected. In summary, the switching operation can be made from regardless of whether the switch body 100 is in the state shown in FIG. 5 or the state shown in FIG. 6.

As described above, the switch body 100 can be switched from the off state where the first fixed electrode 11A and the second fixed electrode 12A are electrically insulated to the on state where they are electrically connected, regardless of the switch body 100 is in the state shown in FIG. 5 or the state shown in FIG. 6. In summary, the position of the movable electrode 30 can be changed without changing the positions of the fixed electrodes (the first fixed electrode 11A, the second fixed electrode 12A, the third fixed electrode 13A, and the fourth fixed electrode 14A). Therefore, various types of switch bodies different in the position of the movable electrode 30 can be produced by one type of wiring substrate 10.

Note that, also the switch unit 100C is same as the aforementioned switch unit 100A in configuration of the positions of the fixed electrodes (the first fixed electrode 11C, the second fixed electrode 12C, the third fixed electrode 13C, and the fourth fixed electrode 14C) and therefore enables change of the position of the movable electrode 30 without changing the positions of the fixed electrodes.

Also the switch unit 100B is same as the aforementioned switch unit 100A in configuration of the positions of the fixed electrodes (the first fixed electrode 11B, the second fixed electrode 12B, the third fixed electrode 13B, and the fourth fixed electrode 14B) and therefore enables change of the position of the movable electrode 30 without changing the positions of the fixed electrodes.

Moreover, the switch unit 100B includes the fifth fixed electrode 15B in addition to the same configuration as the aforementioned switch unit 100A. The fifth fixed electrode 15B and the second fixed electrode 12B are electrically connected to each other by a connection line. Further, the first fixed electrode 11B and the third fixed electrode 13B are electrically connected each other by a connection line. And the fifth fixed electrode 15B is in a position in contact with the outer edge 31B being part of the outer limit of the movable electrode 30 when the outer edge 31A being other part of the outer limit of the movable electrode 30 is moved to the region where the second fixed electrode 12B is formed. Stated differently, the fifth fixed electrode 15B is placed so that a distance between inner sides of the second fixed electrode 12B and the fifth fixed electrode 15B is shorter than the length of the movable electrode 30 and outer sides of the second fixed electrode 12B and the fifth fixed electrode 15B is longer than the length of the movable electrode 30.

Consequently, the switch unit 100B enables changing the position of the movable electrode 30 more freely than the switch units 100A and 100C. Accordingly, by appropriately setting the number and positions of the fixed electrodes formed in the wiring substrate 10, the degree of freedom of possible positions of the movable electrode 30 can be changed appropriately.

As described above, the switch body 100 enables change of the position of the movable electrode 30 without changing the positions of the fixed electrodes. Therefore, for the switch body 100, there is no need to prepare wiring substrates with the fixed electrodes positions of which are changed in accordance with the position of the movable electrode 30. Therefore, various types of switch bodies 100 different in the position of the movable electrode 30 can be produced by one type of wiring substrate 10.

In this connection, an electronic device where a switch body is installed may generally include a plurality of buttons, and positions of individual buttons are determined in accordance with design terms and conditions such as design of the electronic device and layouts of electronic parts. Therefore there is a need to produce a switch body where positions of switch units are adjusted in accordance with positions of buttons required by an electronic device where the switch body is mounted.

The switch body 100 of the present embodiment is configured to allow change in the position of the movable electrode 30 in each of the switch units 100A to 100C. Therefore, according to the switch body 100, positions of the switch units 100A to 100C and distances therebetween (e.g., a distance between the switch unit 100A and the switch unit 100C) can be set appropriately. Differently from conventional switch bodies, the switch body 100 enables positions of switch units and distances therebetween without preparing wiring substrates including the first fixed electrodes and the second fixed electrodes which are positioned in accordance with positions of buttons required by various electronic devices.

Note that, the switch body 100 of the present embodiment may not necessarily include the plurality of switch units 100A to 100C but may be configured as a switch body including the switch unit 100A only, for example.

1.2 Embodiment 2

Figure 7:
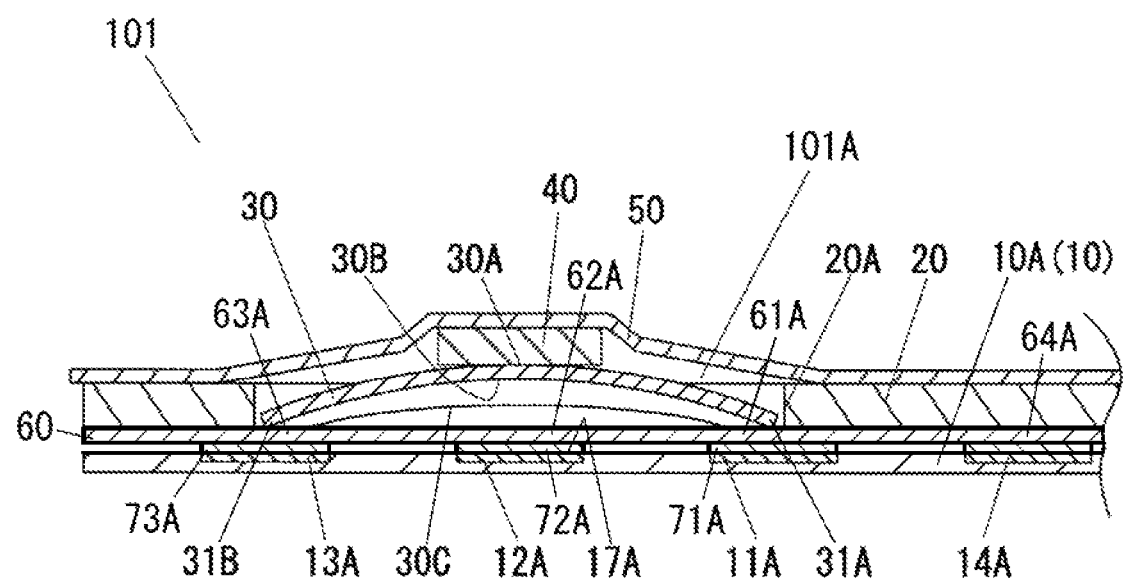
FIG. 7 is a section of a switch body of Embodiment 2.
Figure 8:
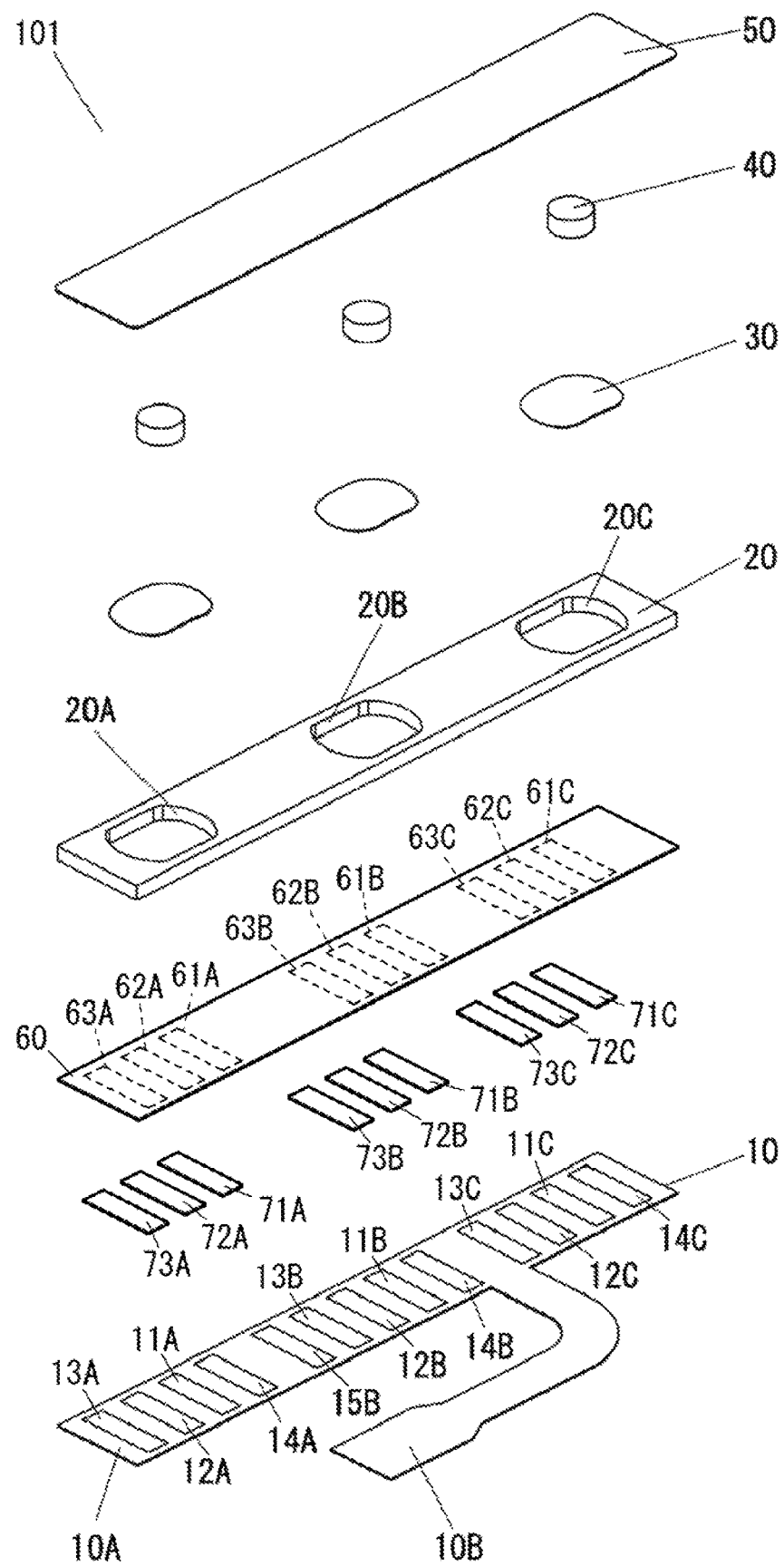
FIG. 8 is an exploded perspective view of the switch body.
Figure 9:
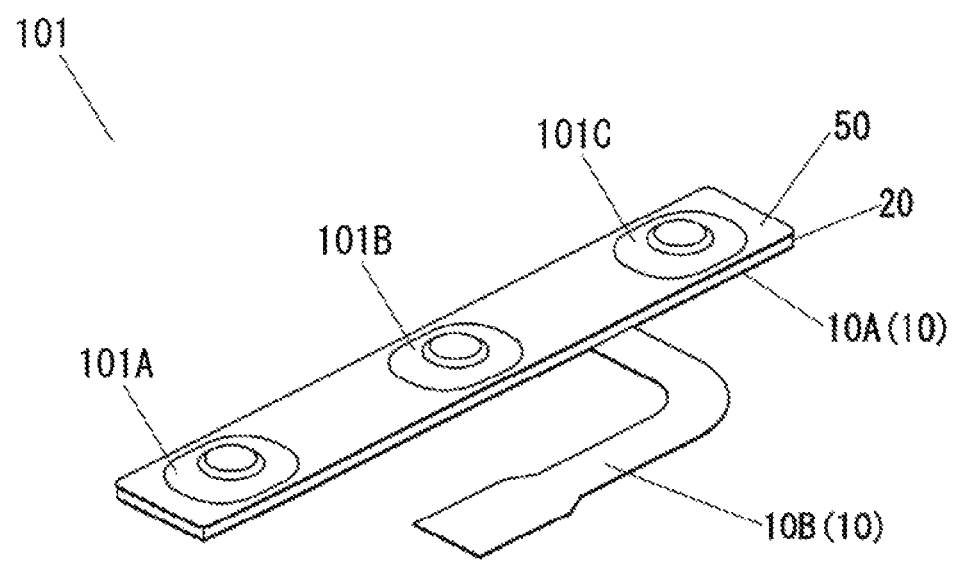
FIG. 9 is a perspective view of the switch body.

FIG. 7 to FIG. 9 show a switch body 101 of the present embodiment. The switch body 101 is an input device for providing input to various electronic devices. Similarly to the switch body 100 of Embodiment 1, the switch body 101 includes the wiring substrate 10, the spacer 20, the plurality of movable electrodes 30, the pressing parts 40, and the protective sheet 50. Further, the switch body 101 includes an insulating sheet 60, a plurality of first elastic members 71A, 71B, and 71C, a plurality of second elastic members 72A, 72B, and 72C, and a plurality of third elastic members 73A, 73B, and 73C.

As shown in FIG. 8, the insulating sheet 60 is an insulator (dielectric member) with a rectangular sheet. The insulating sheet 60 is placed between the body part 10A of the wiring substrate 10 and the spacer 20. The insulating sheet 60 has a size capable of covering the entire surface of the body part 10A of the wiring substrate 10. Accordingly, the insulating sheet 60 covers the first fixed electrodes 11A to 11C, the second fixed electrodes 12A to 12C, the third fixed electrodes 13A to 13C, the fourth fixed electrodes 14A to 14C, and the fifth fixed electrode 15B, collectively. Portions of the insulating sheet 60 which cover the first fixed electrodes 11A to 11C function as first insulators 61A to 61C, respectively. Portions of the insulating sheet 60 which cover the second fixed electrodes 12A to 12C function as second insulators 62A to 62C, respectively. Portions of the insulating sheet 60 which cover the third fixed electrodes 13A to 13C function as third insulators 63A to 63C, respectively. In the present embodiment, the insulating sheet 60 is attached to a surface of the spacer 20 facing the wiring substrate 10 (the lower surface thereof in FIG. 7) in advance.

As shown in FIG. 8, the first elastic members 71A to 71C have rectangular flat plate shapes. Outer shapes of the first elastic members 71A to 71C are almost same as outer shapes of the first fixed electrodes 11A to 11C, respectively. The first elastic members 71A to 71C are placed between the first insulators 61A to 61C of the insulating sheet 60 and the first fixed electrodes 11A to 11C, respectively. As shown in FIG. 8, the second elastic members 72A to 72C have rectangular flat plate shapes. Outer shapes of the second elastic members 72A to 72C are almost same as outer shapes of the second fixed electrodes 12A to 12C, respectively. The second elastic members 72A to 72C are placed between the second insulators 62A to 62C of the insulating sheet 60 and the second fixed electrodes 12A to 12C, respectively. As shown in FIG. 8, the third elastic members 73A to 73C have rectangular flat plate shapes. Outer shapes of the third elastic members 73A to 73C are almost same as outer shapes of the third fixed electrodes 13A to 13C, respectively. The third elastic members 73A to 73C are placed between the third insulators 63A to 63C of the insulating sheet 60 and the third fixed electrodes 13A to 13C, respectively. In the present embodiment, the first elastic members 71A to 71C, the second elastic members 72A to 72C, and the third elastic members 73A to 73C are provided to the surface of the insulating sheet 60 facing the wiring substrate 10 (the lower surface thereof in FIG. 7), in advance. In this regard, the first elastic members 71A to 71C, the second elastic members 72A to 72C, and the third elastic members 73A to 73C are in positions corresponding to the first insulators 61A to 61C, the second insulators 62A to 62C, and the third insulators 63A to 63C, respectively.

In the present embodiment, the first to third elastic members 71A to 71C, 72A to 72C, and 73A to 73C each are electrically conductive. Further, as to each of the first to third elastic members 71A to 71C, 72A to 72C, and 73A to 73C, a first surface in its thickness axis includes a rough surface and a second surface in its thickness axis includes a flat surface. In one example, as to each of the first to third elastic members 71A to 71C, 72A to 72C, and 73A to 73C, a first surface in its thickness axis includes a plurality of protrusions.

The plurality of movable electrodes 30 are placed inside the openings 20A, 20B, and 20C of the spacer 20, respectively. In this regard, within the opening 20A, the movable electrode part 30B of the movable electrode 30 faces the second insulator 62A, and the outer edges 31A and 31B of the movable electrode 30 face the first and third insulators 61A and 63A, respectively. Similarly, within the opening 20B, the movable electrode part 30B of the movable electrode 30 faces the second insulator 62B, and the outer edges 31A and 31B of the movable electrode 30 face the first and third insulators 61B and 63B, respectively. Further, within the opening 20C, the movable electrode part 30B of the movable electrode 30 faces the second insulator 62C and the outer edges 31A and 31B of the movable electrode 30 face the first and third insulators 61C and 63C, respectively.

As shown in FIG. 9, the switch body 101 includes three switch units 101A, 101B, and 101C. The switch unit 101A is constituted by the movable electrode 30, the first to third fixed electrodes 11A, 12A, and 13A, the first to third insulators 61A, 62A, and 63A, and the first to third elastic members 71A, 72A, and 73A. Similarly, the switch unit 101B is constituted by the movable electrode 30, the first to third fixed electrodes 11B, 12B, and 13B, the first to third insulators 61B, 62B, and 63B, and the first to third elastic members 71B, 72B, and 73B. Further, the switch unit 101C is constituted by the movable electrode 30, the first to third fixed electrodes 11C, 12C, and 13C, the first to third insulators 61C, 62C, and 63C, and the first to third elastic members 71C, 72C, and 73C.

The three switch units 101A, 101B, and 101C have the same structure and therefore an explanation of the switch unit 101A may apply to the switch units 101B and 101C mutatis mutandis and thus in the following only the switch unit 101A is described in detail.

In the switch unit 101A, the movable electrode 30, the first to third fixed electrodes 11A, 12A, and 13A, the first to third insulators 61A, 62A, and 63A, the first to third elastic members 71A, 72A, and 73A function as capacitors with electrostatic capacitances (the first to third pressure sensors C1 to C3 being electrostatic pressure sensors).

As shown in FIG. 7, the first pressure sensor C1 is constituted by the outer edge 31A of the movable electrode 30, the first fixed electrode 11A, the first insulator 61A, and the first elastic member 71A. In other words, the first pressure sensor C1 is constituted by the first fixed electrode 11A serving as an electrode, a predetermined part of the movable electrode 30 supported on the first fixed electrode 11A (the outer edge 31A), and an insulator between the first fixed electrode 11A and the predetermined part (the first insulator 61A). The first pressure sensor C1 further includes an elastic member (the first elastic member 71A) between the first insulator 61A and the first fixed electrode 11A.

As shown in FIG. 7, the second pressure sensor C2 is constituted by the outer edge 31B of the movable electrode 30, the third fixed electrode 13A, the third insulator 63A, and the third elastic member 73A. In other words, the second pressure sensor C2 is constituted by the third fixed electrode 13A serving as an electrode, a predetermined part of the movable electrode 30 supported on the third fixed electrode 13A (the outer edge 31B), and an insulator between the third fixed electrode 13A and the predetermined part (the third insulator 63A). The second pressure sensor C2 further includes an elastic member (the third elastic member 73A) between the third insulator 63A and the third fixed electrode 13A.

Each of the first pressure sensor C1 and the second pressure sensor C2 is a pressure sensor facing the concave surface of the movable electrode 30 (the lower surface thereof in FIG. 7) and supporting the movable electrode 30. The first pressure sensor C1 and the second pressure sensor C2 are on opposite sides in the length axis of the movable electrode 30 with regard to the central axis of the movable electrode 30.

As shown in FIG. 7, the third pressure sensor C3 is constituted by the movable electrode part 30B of the movable electrode 30, the second fixed electrode 12A, the second insulator 62A, and the second elastic member 72A. The third pressure sensor C3 includes an elastic member (the second elastic member 72A) between the second fixed electrode 12A serving as an electrode, and the second insulator 62A.

As shown in FIG. 7, differently from the first and second pressure sensors C1 and C2, the third pressure sensor C3 is not a pressure sensor facing the concave surface of the movable electrode 30 and supporting the movable electrode 30. The third pressure sensor C3 faces the concave surface of the movable electrode 30 but is away from the movable electrode 30.

In the switch unit 101A, when the outer edge 31A of the movable electrode 30 (part thereof corresponding to the first pressure sensor C1 is pressed, the first pressure sensor C1 sees pressure higher than that acting on the second pressure sensor C2. The electrostatic capacitances of the first and second pressure sensors C1 and C2 are increased with increase in amount of pressing (stroke) of the movable electrode 30. However, change in electrostatic capacitance of the first pressure sensor C1 becomes larger than change in electrostatic capacitance of the second pressure sensor C2. In contrast, when the outer edge 31B of the movable electrode 30 (part thereof corresponding to the second pressure sensor C2 is pressed, change in electrostatic capacitance of the second pressure sensor C2 becomes larger than change in electrostatic capacitance of the first pressure sensor C1. Accordingly, the switch unit 101A can identify which part of the movable electrode 30 has been pressed by an inputter, in the predetermined direction crossing the central axis of the movable electrode 30.

When the central part of the movable electrode 30 is pressed, almost equal pressures act on the first and second pressure sensors C1 and C2. Hence, electrostatic capacitances of the first and second pressure sensors C1 and C2 are increased with increase in amount of pressing (stroke) of the movable electrode 30. On the other hand, the third pressure sensor C3 does not support the movable electrode 30 and therefore sees change in its electrostatic capacitance smaller than those of the first and second pressure sensors C1 and C2. When amount of pressing (stroke) of the movable electrode 30 increases and reaches a prescribed value, the movable electrode 30 is elastically deformed and then a click is produced. When elastically deformed, the movable electrode 30 comes into contact with the insulating sheet 60 (the second insulator 62A). In summary, elastic deformation of the movable electrode 30 causes a large change in a distance between the movable electrode part 30B and the second fixed electrode 12A. Such a large change in that distance may cause a large change in electrostatic capacitance of the third pressure sensor C3.

Each of the first to third pressure sensors C1 to C3 is an electrostatic pressure sensor and therefore can be used as a proximity sensor for sensing an object with the ground potential (e.g., fingers or hands of an inputter). This utilizes pseudo capacitors formed between an object with the ground potential and the pressure sensors (C1 to C3). In one example, the switch unit 101A can detect fingers or hands of an inputter close to the movable electrode 30 by the first to third pressure sensors C1 to C3.

In this regard, the fourth fixed electrode 14A is in a position facing the outer edge 31A being part of the outer limit of the movable electrode 30 when the outer edge 31B being part of the outer limit of the movable electrode 30 is moved to a region where the second fixed electrode 12A is formed. Therefore, when the spacer 20 is moved so that the outer edge 31B of the movable electrode 30 is positioned inside the region where the second fixed electrode 12A is formed, the movable electrode 30, the first, second, and fourth fixed electrodes 11A, 12A, and 14A, the first to third insulators 61A, 62A, and 63A, and the first to third elastic members 71A, 72A, and 73A function as capacitors with electrostatic capacitances (the first to third pressure sensors C1 to C3 being electrostatic pressure sensors). In this case, the outer edge 31A of the movable electrode 30, the fourth fixed electrode 14A, the first insulator 61A, and the first elastic member 71A constitute the first pressure sensor C1. And, the outer edge 31B of the movable electrode 30, the second fixed electrode 12A, the second insulator 62A, and the second elastic member 72A constitute the second pressure sensor C2. Further, the movable electrode part 30B of the movable electrode 30, the first fixed electrode 11A, the second insulator 62A, and the second elastic member 72A constitute the third pressure sensor C3.

As described above, the switch unit 101A enables changing the position of the movable electrode 30 relative to the wiring substrate 10 without changing the positions of the first fixed electrode 11A, the second fixed electrode 12A, the third fixed electrode 13A, and the fourth fixed electrode 14A formed in the wiring substrate 10.

Also the switch unit 101C is same as the aforementioned switch unit 101A in configuration of the positions of the fixed electrodes (the first fixed electrode 11C, the second fixed electrode 12C, the third fixed electrode 13C, and the fourth fixed electrode 14C) and therefore enables change of the position of the movable electrode 30 without changing the positions of the fixed electrodes.

Also the switch unit 101B is same as the aforementioned switch unit 101A in configuration of the positions of the fixed electrodes (the first fixed electrode 11B, the second fixed electrode 12B, the third fixed electrode 13B, and the fourth fixed electrode 14B) and therefore enables change of the position of the movable electrode 30 without changing the positions of the fixed electrodes.

Moreover, the switch unit 101B includes the fifth fixed electrode 15B in addition to the same configuration as the aforementioned switch unit 101A. Consequently, the switch unit 101B enables changing the position of the movable electrode 30 more freely than the switch units 101A and 101C.

As described above, the switch body 101 enables change of the position of the movable electrode 30 without changing the positions of the fixed electrodes. Therefore, for the switch body 101, there is no need to prepare wiring substrates with the fixed electrodes positions of which are changed in accordance with the position of the movable electrode 30. Therefore, various types of switch bodies 101 different in the position of the movable electrode 30 can be produced by one type of wiring substrate 10.

Note that, the switch body 101 of the present embodiment may not necessarily include the plurality of switch units 101A to 101C but may be configured as a switch body including the switch unit 101A only, for example.

2. Variations

The aforementioned embodiments are some of various embodiments according to the present disclosure. The above embodiments may be modified in accordance with design or the like, provided they still can achieve the purpose of the present disclosure. The following is a list of possible variations of the above embodiments.

For example, in the switch body (100; 101), the pressing parts 40 and the protective sheet 50 are optional. It is sufficient that the insulating sheet 60 is provided to prevent direct contact between the movable electrode 30 and the first to third elastic members (71A to 71C, 72A to 72C, 73A to 73C) or the first to third fixed electrodes (11A to 11C, 12A to 12C, 13A to 13C). In one example, the insulating sheet 60 may include at least the first to third insulators (61A to 61C, 62A to 62C, 63A to 63C).

In the switch body 101, the insulating sheet 60 may be attached in advance to the spacer 20 or the wiring substrate 10. The first to third elastic members (71A to 71C, 72A to 72C, 73A to 73C) may be attached in advance to the insulating sheet 60 or the wiring substrate 10.

Examples of the switch body which the technical concept derived from the present disclosure applies may include input devices (switch bodies) of input systems of Variations 1 to 4 described below. Simply, the switch bodies of the following Variations 1 to 4 may include a component corresponding to a fourth fixed electrode (14A to 14C).

2.1 Variation 1

2.1.1 Outline

Figure 10:
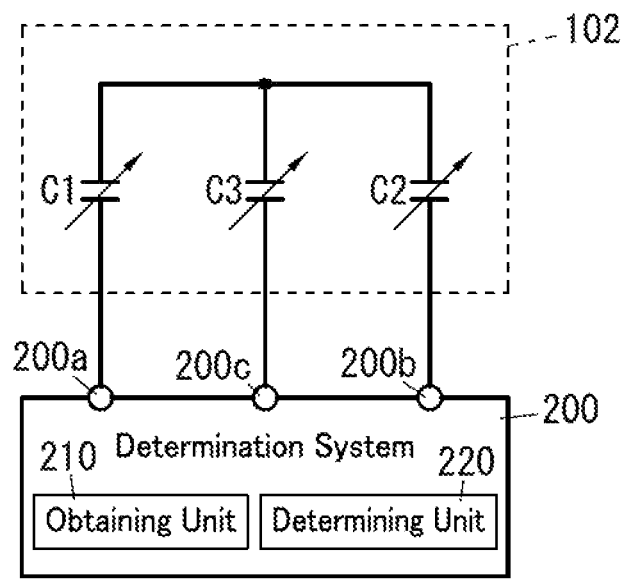
FIG. 10 is a schematic diagram of an input system including an input device of Variation 1.
Figure 11:
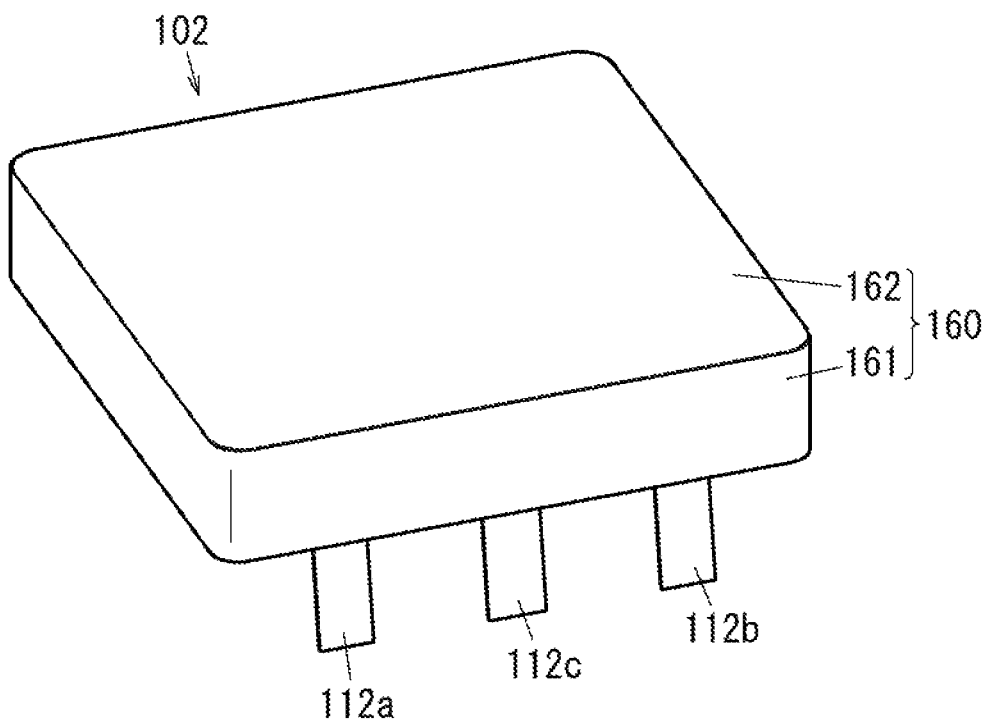
FIG. 11 is a perspective view of the input device.
Figure 12:
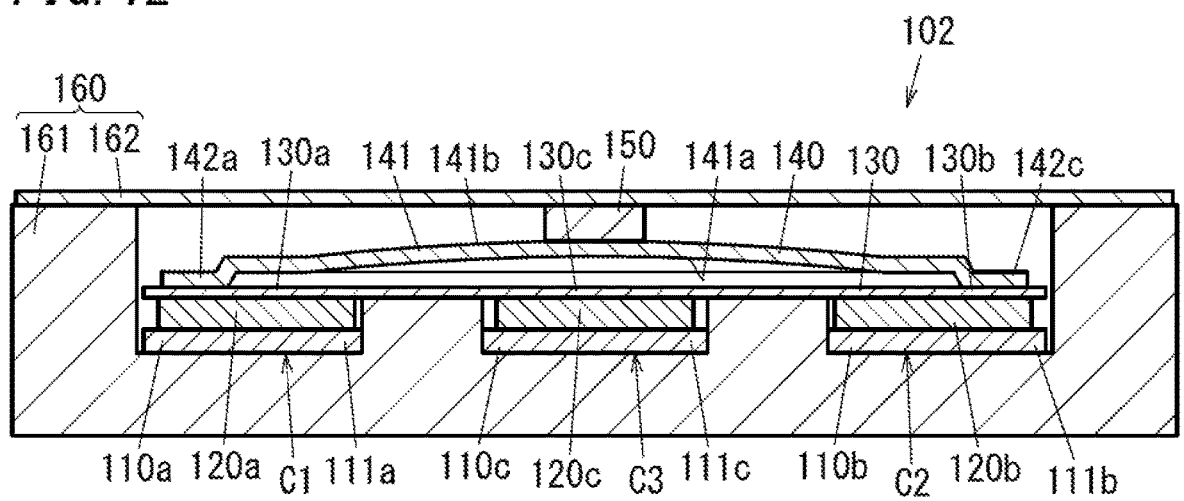
FIG. 12 is an explanatory view of an operation of the input device with a metal dome being not pressed.
Figure 13:
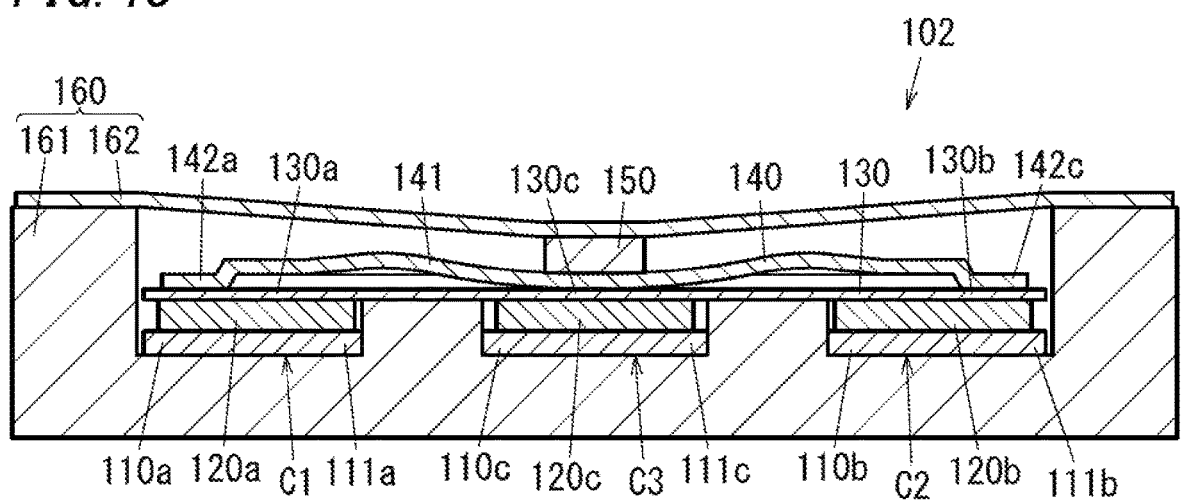
FIG. 13 is an explanatory view of an operation of the input device with the metal dome being pressed.

FIG. 10 is an illustration of an input system of the present variation. The input system includes an input device 102 and a determination system 200. FIG. 11 is an illustration of the input device 102. The input device 102 includes, as shown in FIG. 12 and FIG. 13, a metal dome 140, and first, second, and third pressure sensors C1, C2, and C3. The first and second pressure sensors C1 and C2 face a concave surface 141a of the metal dome 140 and support the metal dome 140. Therefore, even before the metal dome 140 is elastically deformed and then a click is produced, pressing force applied on the metal dome 140 (pressing force applied on a convex surface 141b of the metal dome 140) can be measured by the first and second pressure sensors C1 and C2. After the metal dome 140 is elastically deformed and then a click is produced, pressing force applied on the metal dome 140 can be measured by the first to third pressure sensors C1 to C3. To sum up, irrespective of production of a click (irrespective of occurrence of elastic deformation of the metal dome 140), pressing force on the metal dome 140 can be measured.

2.1.2 Input Device

Hereinafter, the input device 102 is described in more detail with reference to FIG. 10 to FIG. 17. Note that, FIG. 12 corresponds to a section taken along line X-X in FIG. 17.

Figure 14:
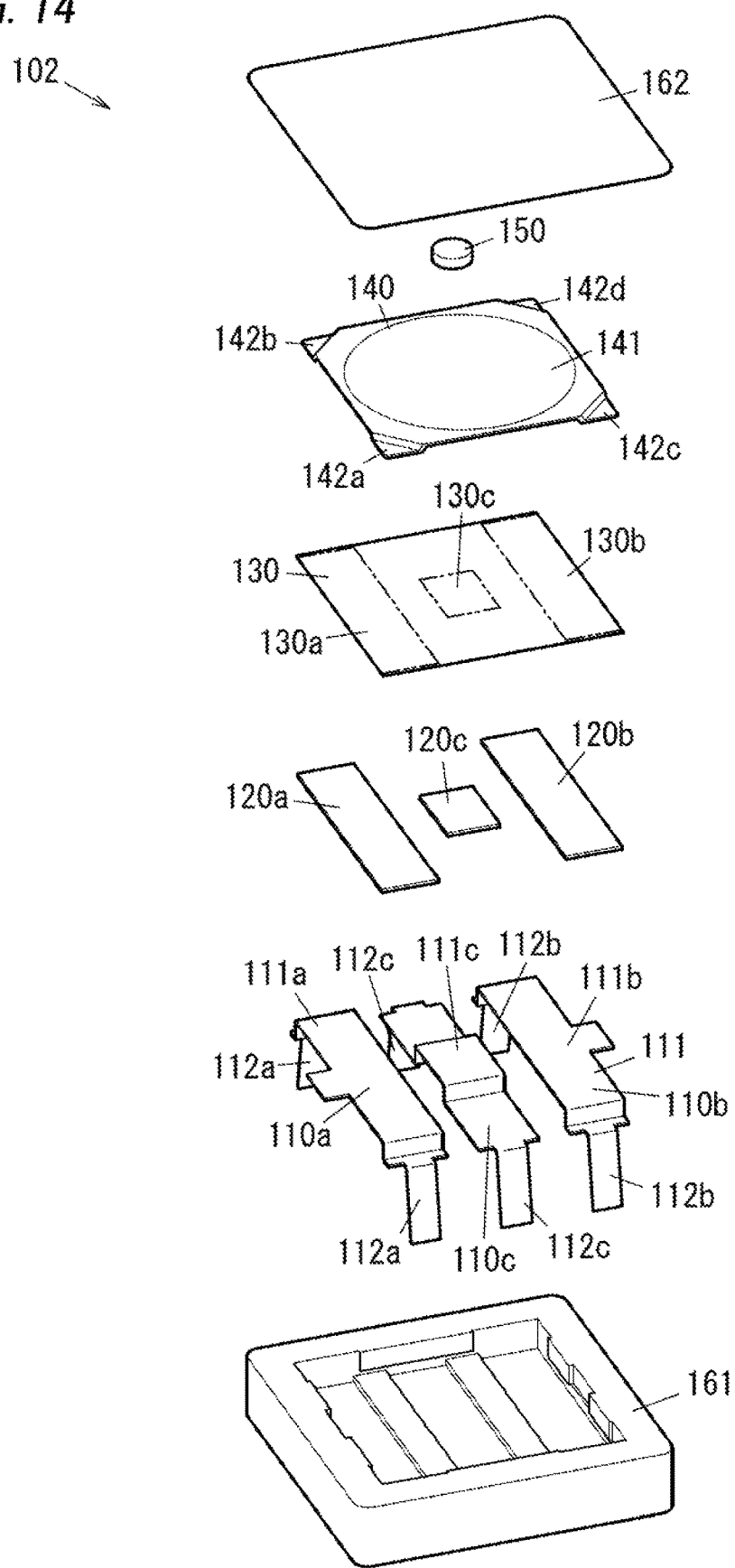
FIG. 14 is an exploded perspective view of the input device.

As shown in FIG. 14, the input device 102 includes first to third electrically conductive members 110a, 110b, and 110c, first to third elastic members 120a, 120b, and 120c, an insulating sheet 130, the metal dome 140, and a pressing member 150. Further, the input device 102 includes a housing 160 (see FIG. 11 to FIG. 13).

As shown in FIG. 12 and FIG. 13, the housing 160 accommodates the first to third electrically conductive members 110a, 110b, and 110c, the first to third elastic members 120a, 120b, and 120c, the insulating sheet 130, the metal dome 140, and the pressing member 150. The housing 160 includes a body 161 and a cover 162. The body 161 has a flat quadrangle (e.g., square) box shape and also has an opening in a first surface in a thickness axis thereof (an upper surface in FIG. 12 and FIG. 13). The cover 162 has a flat quadrangle (e.g., square) plate shape. The cover 162 is attached to the first surface of the body 161 to cover the opening in the first surface of the body 161. The body 161 and the cover 162 have electrically insulating properties. For example, the body 161 and the cover 162 are made of resin material with electrically insulating properties. Especially, the cover 162 has flexibility. Hence, it is possible to push or press the metal dome 140 accommodated in the housing 160 through the cover 162. An opposite surface of the cover 162 from the metal dome 140 provides an operation area of the input device 102.

As shown in FIG. 14, the first electrically conductive member 110a includes an electrode 111a and a pair of terminals 112a. The electrode 111a has a rectangular flat plate shape. The pair of terminals 112a protrude from opposite ends in a length axis of the electrode 111a. Directions in which the pair of terminals 112a protrude from the electrode 111a are directions crossing the length axis and a width axis, of the electrode 111a. The second electrically conductive member 110b includes an electrode 111b and a pair of terminals 112b. The electrode 111b has a rectangular flat plate shape. The pair of terminals 112b protrude from opposite ends in a length axis of the electrode 111b. Directions in which the pair of terminals 112b protrude from the electrode 111b are directions crossing the length axis and a width axis, of the electrode 111b. The third electrically conductive member 110c includes an electrode 111c and a pair of terminals 112c. The electrode 111c has a rectangular flat plate shape. In this regard, the electrode 111c has a central part in a length axis thereof which protrudes in a thickness axis thereof from opposite ends thereof. The pair of terminals 112c protrude from opposite ends in the length axis of the electrode 111c. Directions in which the pair of terminals 112c protrude from the electrode 111c are directions crossing the length axis and a width axis, of the electrode 111c. The first to third electrically conductive members 110a, 110b, and 110c may be made of metal plates.

As shown in FIG. 12 and FIG. 13, the first to third electrically conductive members 110a to 110c are embedded in the body 161 by insert molding. Accordingly, the electrodes 111a to 111c of the first to third electrically conductive members 110a to 110c are used as fixed electrodes. And, the body 161 is used as a base (support) supporting the electrodes (fixed electrodes) 111a to 111c. Regarding the first electrically conductive member 110a, the electrode 111a is exposed on a bottom surface of the body 161 and the pair of terminals 112a protrude from a second surface in the thickness axis of the body 161 (a lower surface in FIG. 12 and FIG. 13). Regarding the second electrically conductive member 110b, the electrode 111b is exposed on the bottom surface of the body 161 and the pair of terminals 112b protrude from the second surface in the thickness axis of the body 161. Regarding the third electrically conductive member 110c, the central part in the thickness axis of the electrode 111c is exposed on the bottom surface of the body 161 and the pair of terminals 112c protrude from the second surface in the thickness axis of the body 161.

As shown in FIG. 14, the first elastic member 120a has a rectangular flat plate shape. The first elastic member 120a has an outer shape that is almost identical to an outer shape of the electrode 111a of the first electrically conductive member 110a. The first elastic member 120a is placed on the electrode 111a. The second elastic member 120b has a rectangular flat plate shape. The second elastic member 120b has an outer shape that is almost identical to an outer shape of the electrode 111b of the second electrically conductive member 110b. The second elastic member 120b is placed on the electrode 111b. The third elastic member 120c has a rectangular flat plate shape. The third elastic member 120c has an outer shape that is almost identical to an outer shape of the central part in the length axis of the electrode 111c of the third electrically conductive member 110c. The third elastic member 120c is placed on the central part in the length axis of the electrode 111c. In the present embodiment, the first to third elastic members 120a to 120c each have electrically conductive properties.

Figure 15:
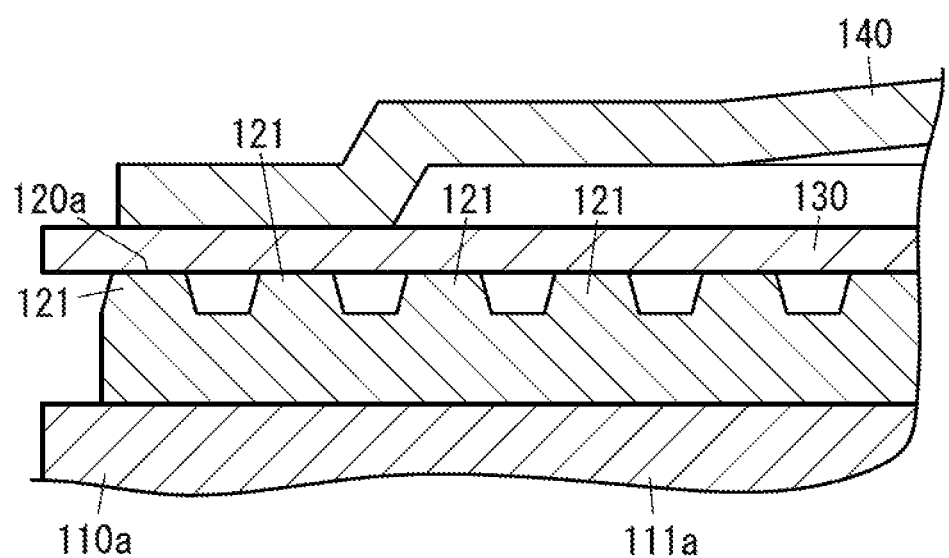
FIG. 15 is a partially enlarged view of the input device with the metal dome being not pressed.
Figure 16:
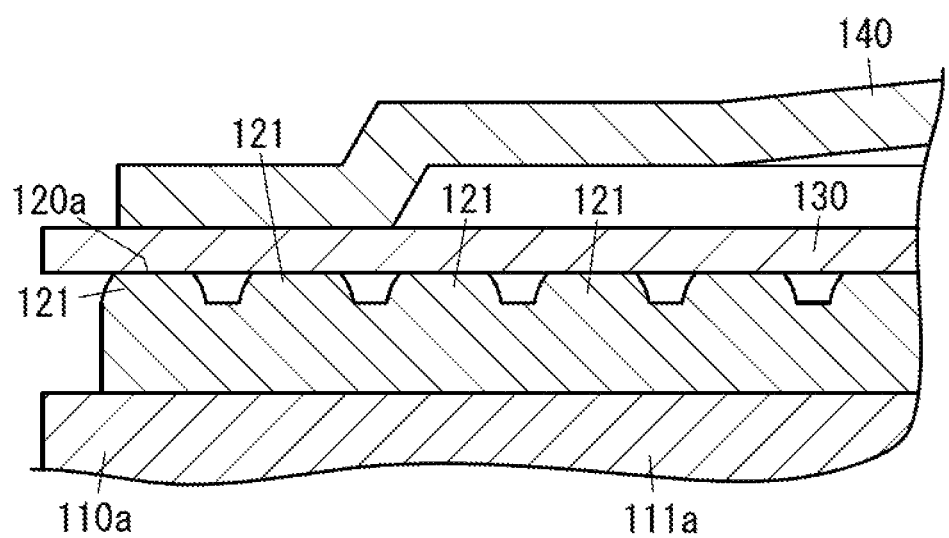
FIG. 16 is a partially enlarged view of the input device with the metal dome being pressed.

In addition, a first surface in a thickness axis of the first elastic member 120a includes a rough surface and a second surface in the thickness axis of the first elastic member 120a includes a flat surface. In one example, as shown in FIG. 15 and FIG. 16, the first surface in the thickness axis of the first elastic member 120a includes a plurality of protrusions 121. Similarly, a first surface in a thickness axis of each of the second and third elastic members 120b and 120c includes a rough surface and a second surface in the thickness axis of each of the second and third elastic members 120b and 120c includes a flat surface.

As shown in FIG. 14, the insulating sheet 130 is an insulator (dielectric member) with a quadrangle (e.g., square) sheet shape. The insulating sheet 130 has a size capable of covering the first to third elastic members 120a, 120b, and 120c collectively. The insulating sheet 130 includes a first portion 130a for covering the first elastic member 120a, a second portion 130b for covering the second elastic member 120b, and a third portion 130c for covering the third elastic member 120c.

Figure 17:
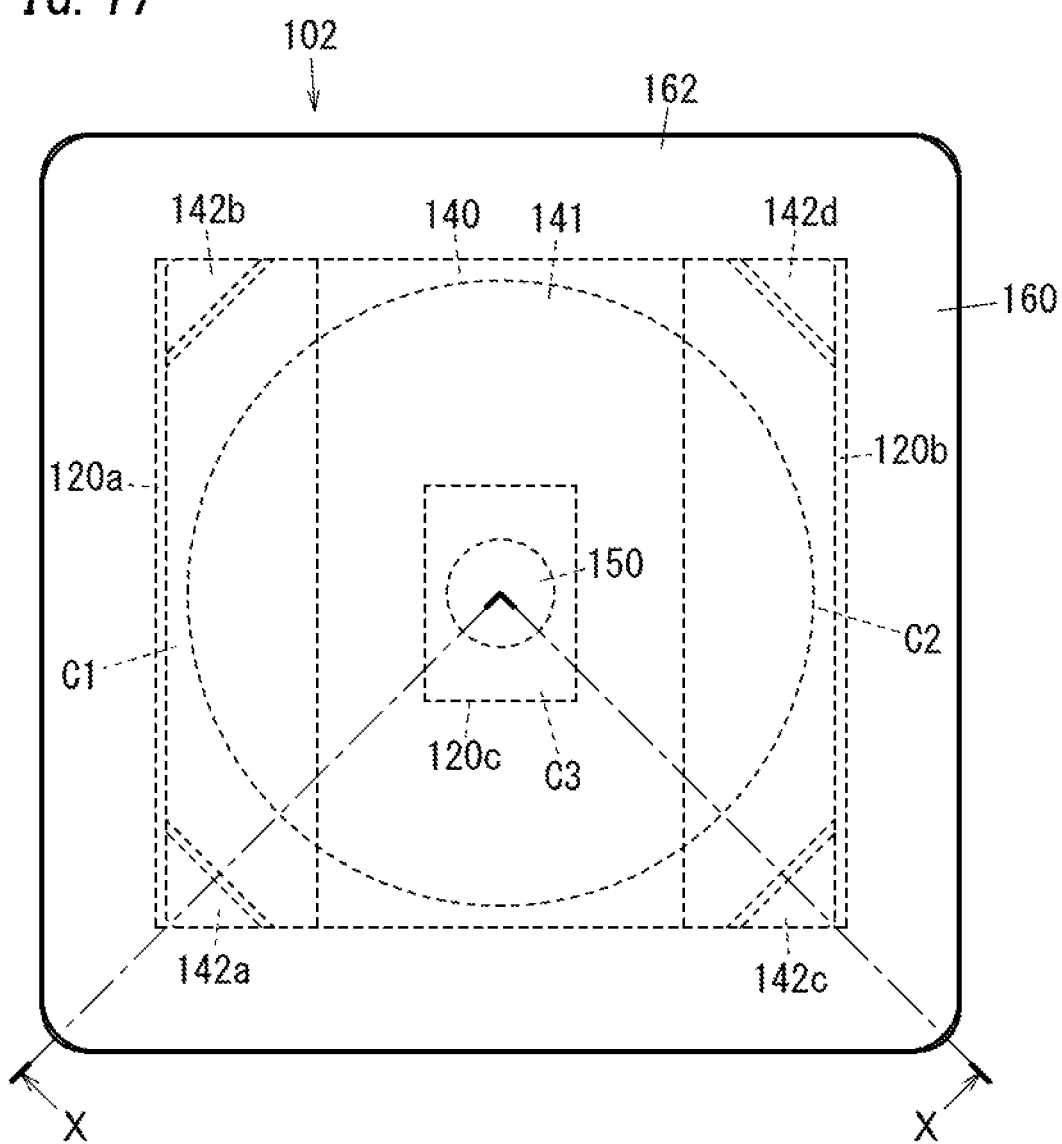
FIG. 17 is a plan of the input device.

As shown in FIG. 14 and FIG. 17, the metal dome 140 has a quadrangle (e.g., square) plate shape as a whole. The metal dome 140 includes, at its center part, an elastically deformable part 141 with a dome shape. As shown in FIG. 12, a first surface in a thickness axis of the elastically deformable part 141 (a lower surface in FIG. 12) defines the concave surface 141a, and a second surface (an upper surface in FIG. 12) defines the convex surface 141b. As shown in FIG. 13, when the convex surface 141b of the elastically deformable part 141 is pressed, the elastically deformable part 141 is elastically deformed and thus a click is produced. In more detail, such elastic deformation causes inversion of a central part (power receiving part) of the elastically deformable part 141, and therefore the elastically deformable part 141 is changed from a convex state to a concave state. Further, the metal dome 140 includes, at its individual four corners, legs (first to fourth legs) 142a to 142d defining outer edges. The first to fourth legs 142a to 142d protrude in directions opposite to a direction in which the elastically deformable part 141 protrudes. As shown in FIG. 17, one of the outer edges of the metal dome 140 (the first and second legs 142a and 142b) is placed on the first elastic member 120a. Another of the outer edges of the metal dome 140 (the third and fourth legs 142c and 142d) is placed on the second elastic member 120b. The metal dome 140 serves as a movable electrode.

The pressing member 150 is a member for assisting causing elastic deformation of the elastically deformable part 141 of the metal dome 140. As shown in FIG. 14, the pressing member 150 has a circular disk shape. Further, the pressing member 150 has an outer shape smaller than an outer shape of the elastically deformable part 141 of the metal dome 140. As shown in FIG. 12, the pressing member 150 is placed between a central part of the convex surface 141b of the metal dome 140 and the cover 162. Especially, the pressing member 150 is fixed to the cover 162. Note that, the pressing member 150 has electrically insulating properties.

In the input device 102, the first, second, and third electrically conductive members 110a, 110b, and 110c, the first, second, and third elastic members 120a, 120b, and

120c, the insulating sheet 130, and the metal dome 140 serve as capacitors with electrostatic capacitances. In other words, the first, second, and third electrically conductive members 110a, 110b, and 110c, the first, second, and third elastic members 120a, 120b, and 120c, the insulating sheet 130, and the metal dome 140 constitute the first, second, and third pressure sensors C1, C2, and C3. In FIG. 10, the input device 102 is illustrated as an equivalent circuit. The first, second and third pressure sensors C1, C2, and C3 include the metal dome 140 as a common electrode and thus are electrically coupled with each other.

In more detail, as shown in FIG. 12 and FIG. 13, the first pressure sensor C1 is constituted by the electrode 111a of the first electrically conductive member 110a, the first elastic member 120a, the first portion 130a of the insulating sheet 130, and the first and second legs 142a and 142b of the metal dome 140. In other words, the first pressure sensor C1 is constituted by the electrode 111a, a predetermined part (the first and second legs 142a and 142b) of the metal dome 140 supported on the electrode 111a, and an insulator (the first portion 130a) between the electrode 111a and the predetermined part. Additionally, the first pressure sensor C1 includes an elastic member (the first elastic member 120a) between the insulator (the first portion 130a) and the electrode 111a. In this regard, the first elastic member 120a includes the plurality of protrusions 121. Therefore, as shown in FIG. 16, the plurality of protrusions 121 are crushed when the first elastic member 120a is pressed by the metal dome 140. Thus, the first elastic member 120a is thinned as a whole and simultaneously a contact area between the first elastic member 120a and the insulating sheet 130 is increased. Therefore, a linearity of change in electrostatic capacitance to pressing force on the first pressure sensor C1 is improved in contrast to a case where only the thickness of the first elastic member 120a is changed. Note that, the aforementioned predetermined part (parts of the first and second legs 142a and 142b in contact with the insulating sheet 130) resting on the insulating sheet 130 may preferably include one or more predetermined flat surface regions. According to this configuration, the one or more flat surface regions are placed near and opposite the electrode 111a. The one or more flat surface regions assist the metal dome 140 to press a greater number of protrusions 121. Thus, change in electrostatic capacitance can be increased. In the present embodiment, entire surfaces of the first and second legs 142a and 142b facing the insulating sheet 130 are flat surface regions.

As shown in FIG. 12 and FIG. 13, the second pressure sensor C2 is constituted by the electrode 111b of the second electrically conductive member 110b, the second elastic member 120b, the second portion 130b of the insulating sheet 130, and the third and fourth legs 142c and 142d of the metal dome 140. In other words, the second pressure sensor C2 is constituted by the electrode 111b, a predetermined part (the third and fourth legs 142c and 142d) of the metal dome 140 supported on the electrode 111b, and an insulator (the second portion 130b) between the electrode 111b and the predetermined part. Additionally, the second pressure sensor C2 includes an elastic member (the second elastic member 120b) between the insulator (the second portion 130b) and the electrode 111b. In this regard, the second elastic member 120b includes the plurality of protrusions 121 in a similar manner to the first elastic member 120a. Therefore, a linearity of change in electrostatic capacitance to pressing force on the second pressure sensor C2 is improved. Similarly to the aforementioned situation, parts of the third and fourth legs 142c and 142d in contact with the insulating sheet 130 may preferably include one or more predetermined flat surface regions. In the present embodiment, entire surfaces of the third and fourth legs 142c and 142d facing the insulating sheet 130 are flat surface regions.

Each of the first pressure sensor C1 and the second pressure sensor C2 is a pressure sensor facing the concave surface 141a of the metal dome 140 and supporting the metal dome 140. The first pressure sensor C1 and the second pressure sensor C2 are on opposite sides, in a predetermined direction crossing the central axis of the metal dome 140, with respect to the central axis. In the present embodiment, the predetermined direction is a direction perpendicular to the central axis of the metal dome 140 and also a direction in which the first leg 142a and the third leg 142c (or the second leg 142b and the fourth leg 142d) are arranged. In summary, in FIG. 17, the predetermined direction is parallel to left and right directions. Further, each of the first pressure sensor C1 and the second pressure sensor C2 is an electrostatic pressure sensor.

The third pressure sensor C3 is constituted by the electrode 111c of the third electrically conductive member 110c, the third elastic member 120c, the third portion 130c of the insulating sheet 130, and the elastically deformable part 141 of the metal dome 140. The third pressure sensor C3 further includes an elastic member (the third elastic member 120c) between an insulator (the third portion 130c of the insulating sheet 130) and the electrode 111c. In this regard, similarly to the first elastic member 120a, the third elastic member 120c includes a plurality of protrusions. Therefore, a linearity of change in electrostatic capacitance to pressing force on the third pressure sensor C3 is improved.

The third pressure sensor C3 is an electrostatic pressure sensor analogous to the first and second pressure sensors C1 and C2. However, as shown in FIG. 12, the third sensor C3 is different from the first and second pressure sensors C1 and C2 and is not a pressure sensor facing the concave surface 141a of the metal dome 140 and supporting the metal dome 140. The third pressure sensor C3 is placed facing the concave surface 141a of the metal dome 140 but is spaced apart from the metal dome 140. The third pressure sensor C3 is placed facing the concave surface 141a of the metal dome 140 and functions as a detector for detecting elastic deformation of the metal dome 140 (the elastically deformable part 141) caused by pressing the convex surface 141b of the metal dome 140.

Figure 18:
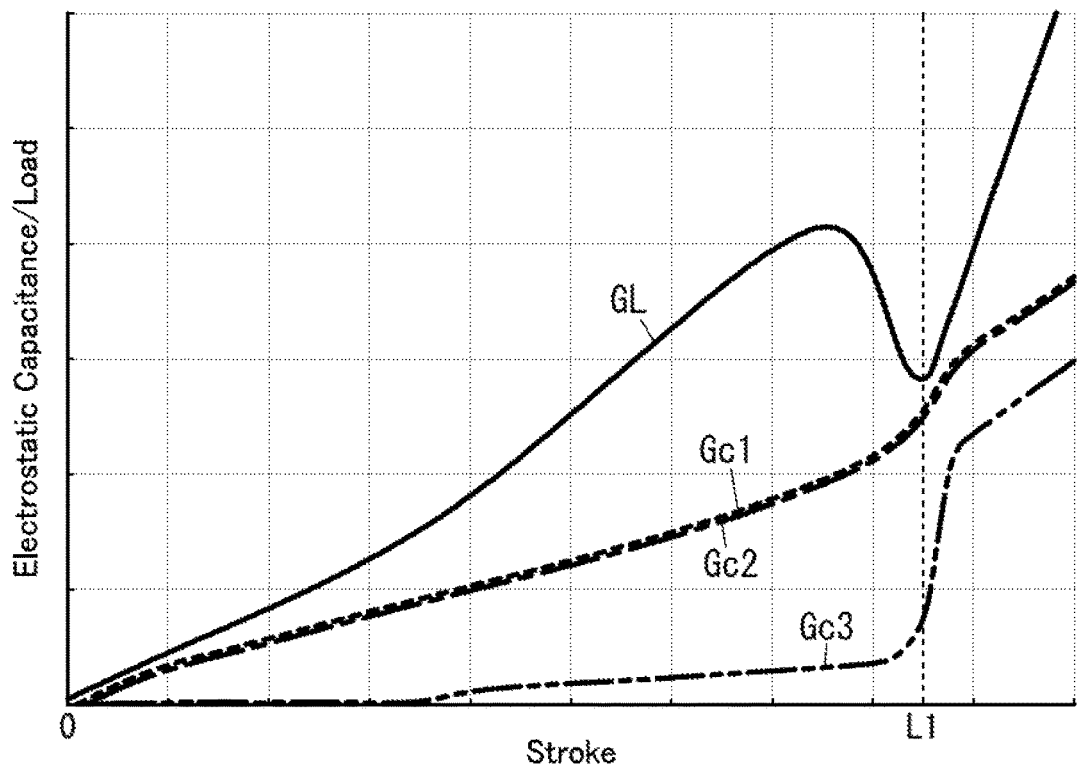
FIG. 18 is a graph representing a relation between amount of pressing (stroke) of the metal dome and load on the metal dome as well as electrostatic capacitances of the pressure sensors in relation to the input device.
Figure 19:
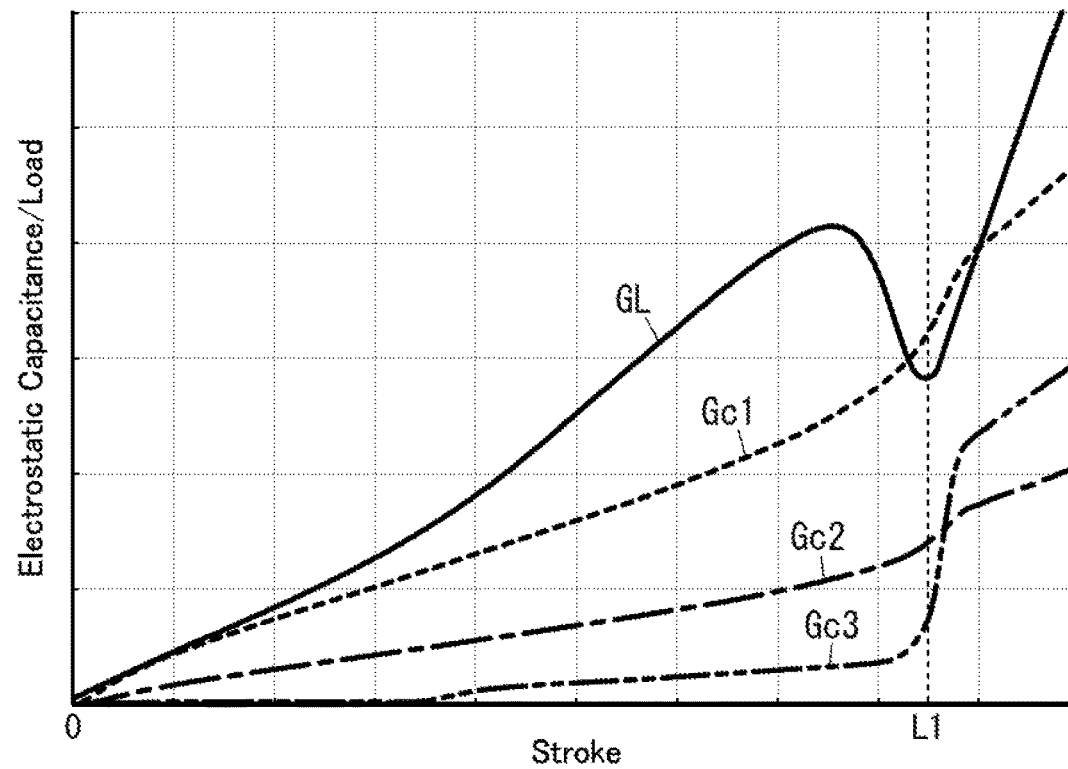
FIG. 19 is another graph representing a relation between amount of pressing (stroke) of the metal dome and load on the metal dome as well as electrostatic capacitances of the pressure sensors in relation to the input device.

FIG. 18 and FIG. 19 relate to the input device 102 and show relations between amount of pressing (stroke) of the metal dome 140 and load (pressing force) on the metal dome 140 as well as electrostatic capacitances of the pressure sensors C1 to C3.

A graph shown in FIG. 18 corresponds to a situation where the central part in the predetermined direction of the metal dome 140 (part corresponding to the third pressure sensor C3) is pressed. In FIG. 18, Gc1 denotes an electrostatic capacitance of the first pressure sensor C1, Gc2 denotes an electrostatic capacitance of the second pressure sensor C2, and Gc3 denotes an electrostatic capacitance of the third pressure sensor C3. Additionally, GL denotes load on the metal dome 140.

The first and second pressure sensors C1 and C2 supports the metal dome 140 and are on opposite sides of the metal dome 140, in the predetermined direction crossing the central axis of the metal dome 140, with respect to the central axis. Therefore, when the central part of the metal dome 140 is pressed, almost equal pressures act on the first and second pressure sensors C1 and C2. Hence, electrostatic capacitances of the first and second pressure sensors C1 and C2 are increased with increase in amount of pressing (stroke) of the metal dome 140. On the other hand, the third pressure sensor C3 does not support the metal dome 140 and therefore sees change in its electrostatic capacitance smaller than those of the first and second pressure sensors C1 and C2. When amount of pressing (stroke) of the metal dome 140 increases and reaches a prescribed value L1, the elastically deformable part 141 of the metal dome 140 is elastically deformed and then a click is produced. As shown in FIG. 13, the elastically deformable part 141 of the metal dome 140 comes into contact with the third portion 130c when elastically deformed. In summary, elastic deformation of the elastically deformable part 141 causes a large change in a distance between the central part of the elastically deformable part 141 and the electrode 111c. Such a large change in that distance may cause a large change in electrostatic capacitance of the third pressure sensor C3.

A graph shown in FIG. 19 corresponds to a situation where a first end in the predetermined direction of the metal dome 140 (left part in FIG. 17, i.e., part corresponding to the first pressure sensor C1) is pressed. Also in FIG. 19, Gc1 denotes electrostatic capacitance of the first pressure sensor C1, Gc2 denotes electrostatic capacitance of the second pressure sensor C2, and Gc3 denotes electrostatic capacitance of the third pressure sensor C3. Additionally, GL denotes the load on the metal dome 140.

As described above, the first and second pressure sensors C1 and C2 supports the metal dome 140 and are on opposite sides of the metal dome 140, in the predetermined direction crossing the central axis of the metal dome 140, with respect to the central axis. Therefore, when the part of the metal dome 140 corresponding to the first pressure sensor C1 is pressed, the first pressure sensor C1 sees pressure higher than that acting on the second pressure sensor C2. The electrostatic capacitances of the first and second pressure sensors C1 and C2 are increased with increase in amount of pressing (stroke) of the metal dome 140. However, change in electrostatic capacitance of the first pressure sensor C1 becomes larger than change in electrostatic capacitance of the second pressure sensor C2. In contrast, when a second end in the predetermined direction of the metal dome 140 (right part in FIG. 17, i.e., part corresponding to the second pressure sensor C2) is pressed, change in electrostatic capacitance of the second pressure sensor C2 becomes larger than change in electrostatic capacitance of the first pressure sensor C1. Accordingly, the input device 102 can identify which part of the metal dome 140 has been pressed by an inputter, in the predetermined direction crossing the central axis of the metal dome 140.

Each of the first to third pressure sensors C1 to C3 is an electrostatic pressure sensor and therefore can be used as a proximity sensor for sensing an object with the ground potential (e.g., fingers or hands of an inputter). This utilizes pseudo capacitors formed between an object with the ground potential and the pressure sensors (C1 to C3). In one example, the input device 102 can detect fingers or hands of an inputter close to the metal dome 140 by the first to third pressure sensors C1 to C3.

For example, as to the input device 102, the electrode 111c may be used as a second fixed electrode, one of the electrodes 111a and 111b may be used as a first fixed electrode and the other may be used as a third fixed electrode, and a fourth fixed electrode may be newly provided. In this case, the shape of the electrode 111c may be same as the shapes of the electrodes 111a and 111b.

2.1.3 Determination System

The determination system 200 is configured to determine input to the input device 102 based on output (an input result) from the input device 102. In the present embodiment, the input result includes values of (changes in) electrostatic capacitances of the first to third pressure sensors C1 and C3 of the input device 102.

As shown in FIG. 10, the determination system 200 includes first to third terminals 200a to 200c. The first to third terminals 200a to 200c are electrically connected to the first to third pressure sensors C1 to C3 of the input device 102, respectively. For example, the first, second and third terminals 200a, 200b, and 200c are connected to one terminal 112a of the first electrically conductive member 110a, one terminal 112b of the second electrically conductive member 110b, and one terminal 112c of the third electrically conductive member 110c. By doing so, the determination system 200 is electrically connected to the first, second and third pressure sensors C1, C2, and C3 (the electrodes 111a, 111b, and 111c).

As shown in FIG. 10, the determination system 200 includes an obtaining unit 210 and a determining unit 220.

The obtaining unit 210 is configured to obtain changes in electrostatic capacitances of the first and second pressure sensors C1 and C2 from the input device 102. Further, the obtaining unit 210 is configured to obtain change in electrostatic capacitance of the third pressure sensor C3 from the input device 102. The obtaining unit 210 can switch sensitivity for obtaining changes in electrostatic capacitances of the plurality of pressure sensors C1 to C3 from the input device 102, between a first level and a second level higher than the first level.

The method for obtaining electrostatic capacitances of pressure sensors (C1, C2, C3) may be selected from conventional various methods. In one example, a switched capacitor method may apply. The switched capacitor method measures (changes in) electrostatic capacitances of pressure sensors, based on amounts of electric charges stored in capacitors constituting the pressure sensors. For example, the obtaining unit 210 repeats alternately a charging process of charging a pressure sensor (capacitor) and a discharging process of charging a determination capacitor with electric charges stored in the pressure sensor by making the pressure sensor discharge, for a predetermined period of time. When a voltage across the determination capacitor reaches a prescribed value, the obtaining unit 210 ends the discharging process and starts the charging process. Accordingly, the number of times that the voltage across the determination capacitor reaches the prescribed value within the predetermined period of time increases with increase in electrostatic capacitance of the pressure sensor. Therefore, change in electrostatic capacitance of the pressure sensor can be determined based on the number of times that the voltage across the determination capacitor reaches the prescribed value within the predetermined period of time. In this regard, increase in the prescribed value may cause decrease in the number of times that the voltage across the determination capacitor reaches the prescribed value within the predetermined period of time. In contrast, decrease in the prescribed value may cause increase in the number of times that the voltage across the determination capacitor reaches the prescribed value within the predetermined period of time. Thus, the prescribed value can be used for adjustment of the sensitivity. Note that, the sensitivity can be adjusted based on a voltage applied across the pressure sensor in the charging process. Alternatively, the sensitivity can be adjusted based on time necessary for charging and/or discharging, for example, time necessary for the determination capacitor to be charged up.

The determining unit 220 is configured to determine which part of the metal dome 140 in the predetermined direction has been pressed (inclination), based on a balance between changes in electrostatic capacitances of the first and second pressure sensors C1 and C2. The balance between changes in electrostatic capacitances of the first and second pressure sensors C1 and C2 can be evaluated based on a relation between amounts of changes in electrostatic capacitances of the first and second pressure sensors C1 and C2. Additionally, the determining unit 220 is configured to determine whether the metal dome 140 has been elastically deformed (a click has been produced), based on change in electrostatic capacitance of the third pressure sensor C3. Further, the determining unit 220 is configured to determine whether a detection target (e.g., fingers of an inputter) is present near the metal dome 140, based on changes in electrostatic capacitances of the plurality of pressure sensors C1 to C3. A detailed operation of the determining unit 220 is described later with reference to flow charts shown in FIG. 24 and FIG. 25.

The determination system 200 is configured to perform a first determination operation and a second determination operation by the obtaining unit 210 and the determining unit 220. The first determination operation is defined as an operation of performing determination of an inclination of the metal dome 140 and determination as to whether elastic deformation of the metal dome 140 has occurred. In other words, the first determination operation may be an operation of measuring amount of pressing of the metal dome 140 and detecting production of the click. The second determination operation is defined as an operation of determining whether a detection target (an object with a ground potential) is in a vicinity of the metal dome 140. Hereinafter, the first and second determination operations of the determination system 200 are described with reference to the flow charts illustrated in FIG. 24 and FIG. 25.

Figure 24:
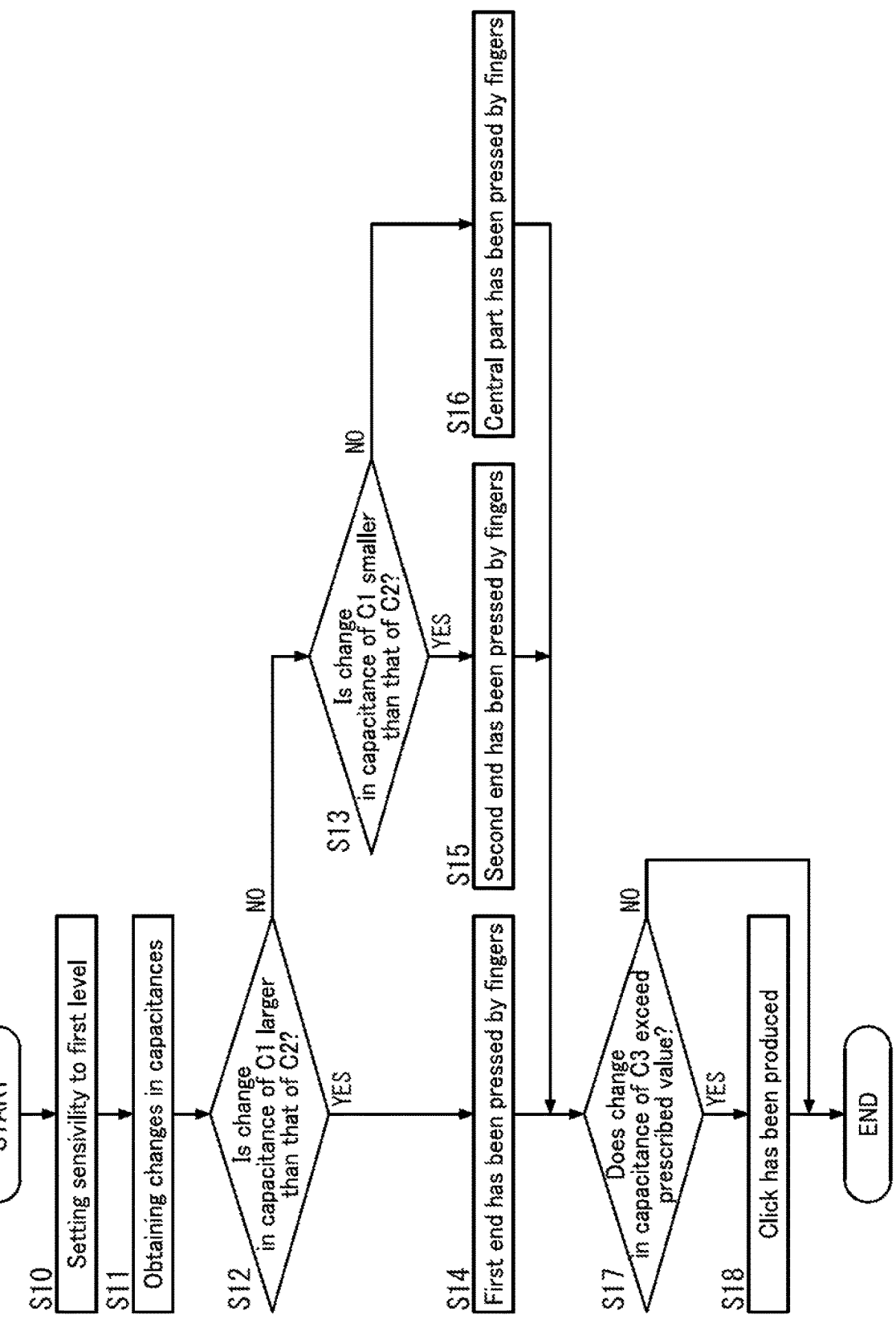
FIG. 24 is a flow chart of a first determination operation of a determination system of the input system.

FIG. 24 shows the flow chart of the first determination operation. First of all, the obtaining unit 210 sets the sensitivity for measuring changes in electrostatic capacitances to the first level (S10).

Next, the obtaining unit 210 obtains the changes in electrostatic capacitances (S11). In detail, the obtaining unit 210 applies a voltage across one of the first to third terminals 200a to 200c and grounds the others. By doing so, the obtaining unit 210 measures changes in electrostatic capacitances of the first to third pressure sensors C1 to C3 in turn.

Figure 20:
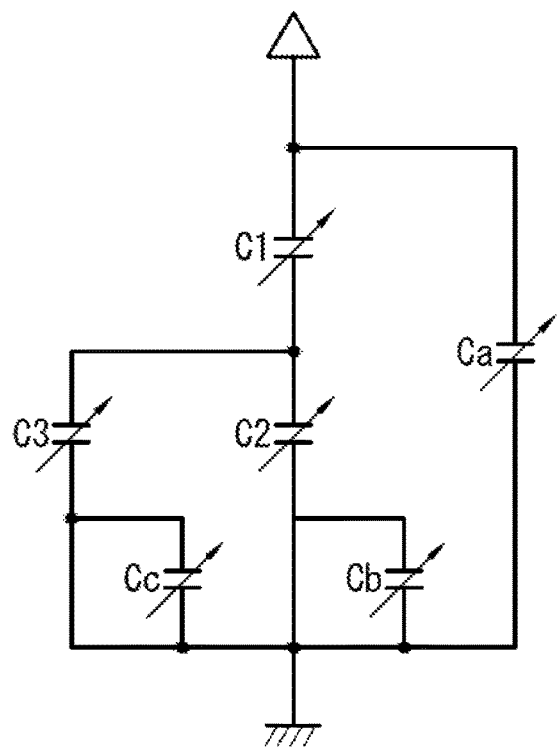
FIG. 20 is an equivalent circuit diagram of the input device in relation to measurement of an electrostatic capacitance of a first pressure sensor.

To measure change in electrostatic capacitance of the first pressure sensor C1, the obtaining unit 210 applies a voltage to the first terminal 200a and grounds the second and third terminals 200b and 200c. As a result, the first pressure sensor C1 is connected to a parallel circuit of the second and third pressure sensors C2 and C3. FIG. 20 shows an equivalent circuit diagram of the input system in this situation. Ca denotes parasitic capacitance produced between the electrode 111a of the first pressure sensor C1 and a ground near the input device 102. Cb denotes parasitic capacitance produced between the electrode 111b of the second pressure sensor C2 and a ground near the input device 102. Cc denotes parasitic capacitance produced between the electrode 111c of the third pressure sensor C3 and a ground near the input device 102. When the second and third pressure sensors C2 and C3 are grounded, effects of parasitic capacitances Cb and Cc can be ignored. Additionally, before a click is produced, the third pressure sensor C3 can be ignored.

Figure 21:
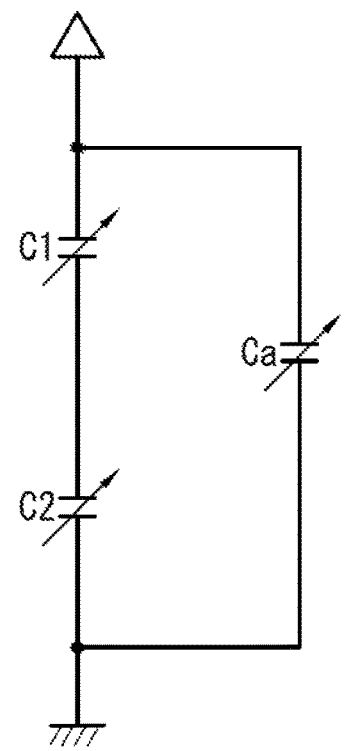
FIG. 21 is a circuit diagram of a more simplified equivalent circuit diagram of FIG. 20.

Therefore, the equivalent circuit diagram of FIG. 20 can be simplified as shown in FIG. 21. The obtaining unit 210 obtains, as change in electrostatic capacitance of the first pressure sensor C1, change in electrostatic capacitance of a parallel circuit of parasitic capacitance Ca and a series circuit of the first and second pressure sensors C1 and C2.

Figure 22:
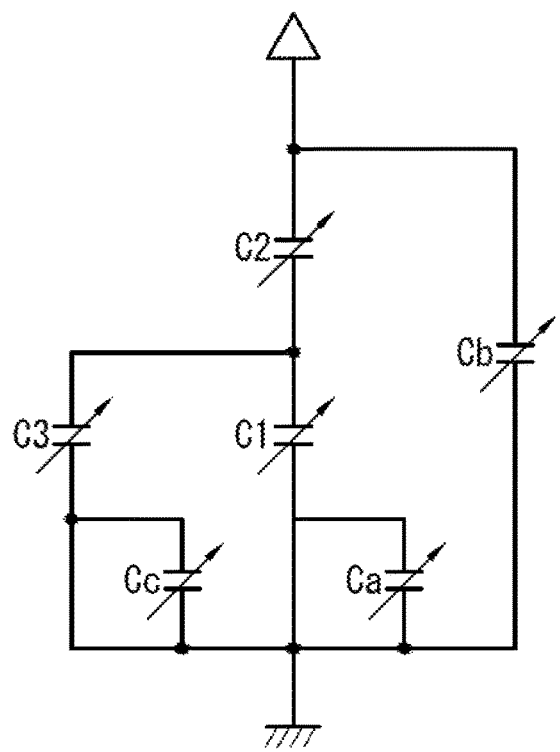
FIG. 22 is an equivalent circuit diagram of the input device in relation to measurement of an electrostatic capacitance of a second pressure sensor.
Figure 23:
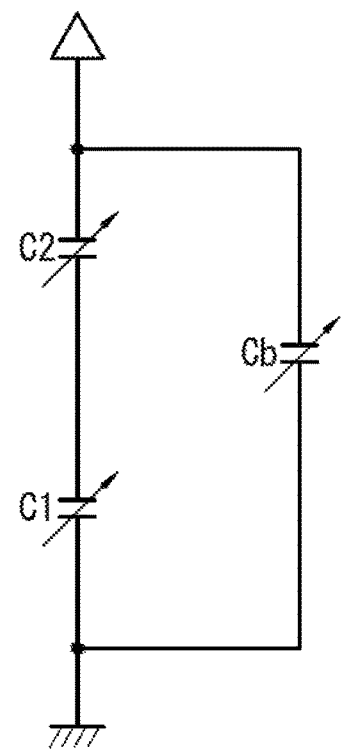
FIG. 23 is a circuit diagram of a more simplified equivalent circuit diagram of FIG. 22.

To measure change in electrostatic capacitance of the second pressure sensor C2, the obtaining unit 210 applies a voltage to the second terminal 200b and grounds the first and third terminals 200a and 200c. As a result, the second pressure sensor C2 is connected to a parallel circuit of the first and third pressure sensors C1 and C3. FIG. 22 shows an equivalent circuit diagram of the input system in this situation. When the first and third pressure sensors C1 and C3 are grounded, effects of parasitic capacitances Ca and Cc can be ignored. Additionally, before a click is produced, the third pressure sensor C3 can be ignored. Therefore, the equivalent circuit diagram of FIG. 22 can be simplified as shown in FIG. 23. The obtaining unit 210 obtains, as change in electrostatic capacitance of the second pressure sensor C2, change in electrostatic capacitance of a parallel circuit of parasitic capacitance Cb and a series circuit of the first and second pressure sensors C1 and C2.

To measure change in electrostatic capacitance of the third pressure sensor C3, the obtaining unit 210 applies a voltage to the third terminal 200c and grounds the first and second terminals 200a and 200b. As a result, the third pressure sensor C3 is connected to a parallel circuit of the first and second pressure sensors C1 and C2. The obtaining unit 210 obtains, as change in electrostatic capacitance of the third pressure sensor C3, change in electrostatic capacitance of a series circuit of the third pressure sensor C3 and a parallel circuit of the first and second pressure sensors C1 and C2.

Changes in electrostatic capacitances of the first to third pressure sensors C1 to C3 are obtained in step S11 and then the determining unit 220 determines which part of the metal dome 140 in the predetermined direction has been pressed (inclination), based on a balance of changes in electrostatic capacitances of the first and second pressure sensors C1 and C2. First, the determining unit 220 compares changes in electrostatic capacitances of the first and second pressure sensors C1 and C2 (S12, S13). Note that, before comparison between changes in electrostatic capacitances of the first and second pressure sensors C1 and C2, the determining unit 220 may perform processing of adjusting magnitudes or amounts of changes in electrostatic capacitances of the first and second pressure sensors C1 and C2 to allow appropriate comparison therebetween. Based on a result of the comparison between changes in electrostatic capacitances of the first and second pressure sensors C1 and C2, the determining unit 220 determines which part of the metal dome 140 in the predetermined direction has been pressed. If change in electrostatic capacitance of the first pressure sensor C1 is larger than change in electrostatic capacitance of the second pressure sensor C2 (S12; YES), the determining unit 220 determines that the first end of the metal dome 140 (the left part thereof in FIG. 17) has been pressed (S14). If change in electrostatic capacitance of the second pressure sensor C2 is larger than change in electrostatic capacitance of the first pressure sensor C1 (S12; NO, S13; YES), the determining unit 220 determines that the second end of the metal dome 140 (the right part thereof in FIG. 17) has been pressed (S15). If change in electrostatic capacitance of the first pressure sensor C1 is equal to change in electrostatic capacitance of the second pressure sensor C2 (S12; NO, S13; NO), the determining unit 220 determines that the central part of the metal dome 140 (the center thereof in FIG. 17) has been pressed (S16). Additionally, based on the balance between changes in electrostatic capacitances of the first and second pressure sensors C1 and C2, the determining unit 220 may determine a degree of pressing (amount of pressing) in addition to pressed part of the metal dome 140 in the predetermined direction. For example, it is considered that amount of pressing increases with increase in changes in electrostatic capacitances of pressure sensors. Therefore, the determining unit 220 may determine amount of pressing in accordance with changes in electrostatic capacitances of pressure sensors (C1, C2).

After steps S14, S15, and S16, the determining unit 220 determines whether the metal dome 140 has been elastically deformed (a click has been produced), based on change in electrostatic capacitance of the third pressure sensor C3. In detail, the determining unit 220 determines whether change in electrostatic capacitance of the third pressure sensor C3 exceeds a prescribed value (S17). This prescribed value defines a threshold value for determining whether the elastically deformable part 141 of the metal dome 140 has been elastically deformed to produce a click. If change in electrostatic capacitance of the third pressure sensor C3 exceeds the prescribed value (S17; YES), the determining unit 220 determines that a click has been produced (S18).

Figure 25:
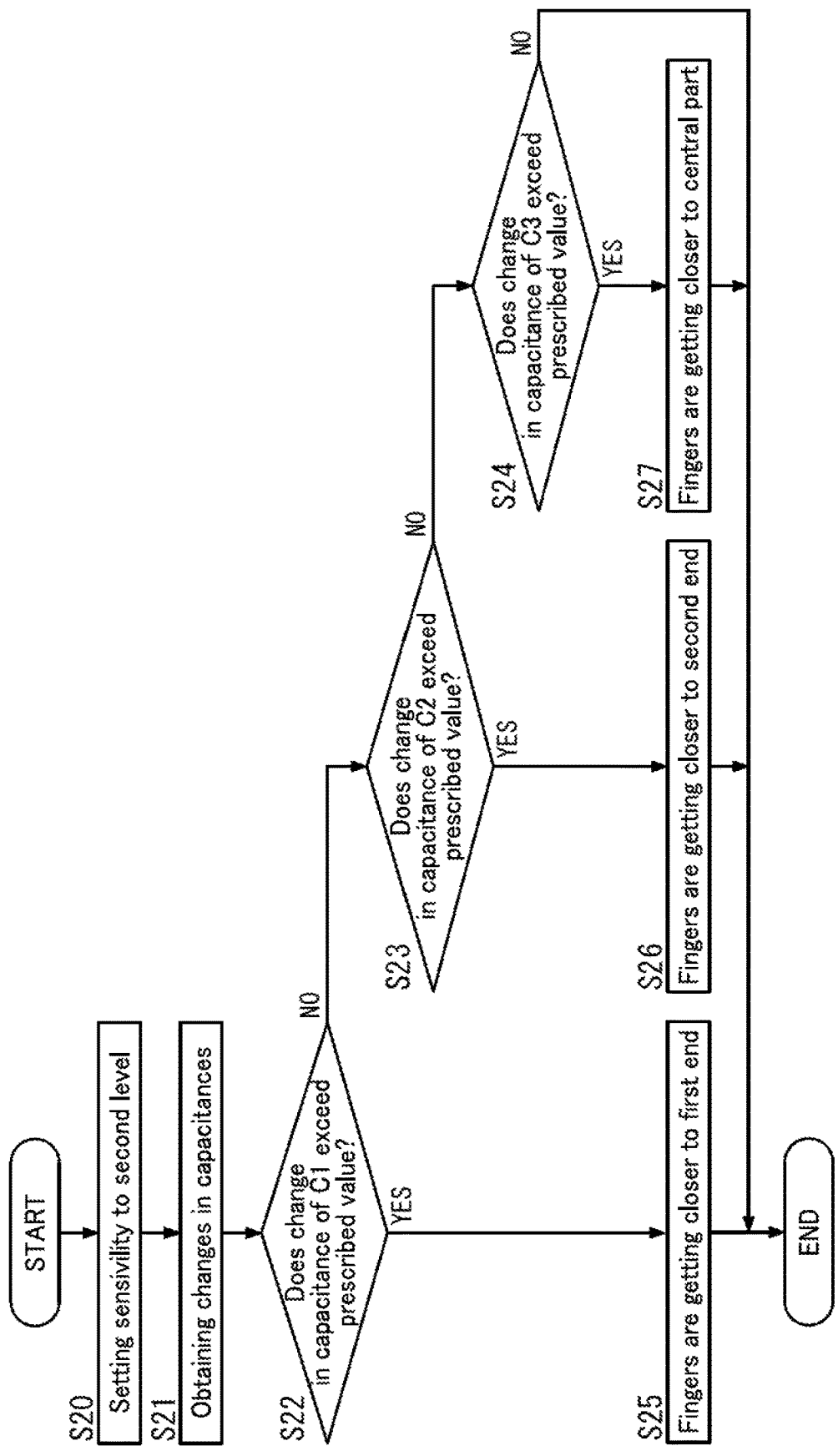
FIG. 25 is a flow chart of a second determination operation of the determination system.

FIG. 25 shows the flow chart of the second determination operation. First of all, the obtaining unit 210 sets the sensitivity for measuring changes in electrostatic capacitances to the second level (S20). As described above, the second level is selected to be higher than the first level. In summary, the obtaining unit 210 makes the sensibility in the second determination operation larger than in the first determination operation. To measure changes in electrostatic capacitances of the first to third pressure sensors C1 to C3 caused by approaching of an object with a ground potential, the sensibility in the second determination operation is made to be larger than in the first determination operation for measuring changes in electrostatic capacitances of the first to third pressure sensors C1 to C3 caused by pressing force. Therefore, it is possible to increase accuracy of determination as to whether a detection target is near the metal dome 140.

Next, the obtaining unit 210 obtains changes in electrostatic capacitances (S21). In detail, the obtaining unit 210 measures changes in electrostatic capacitances of the first to third pressure sensors C1 to C3 in the same manner as step S11.

After step S21, based on changes in electrostatic capacitances of the plurality of pressure sensors C1 to C3, the determining unit 220 determines whether the detection target (e.g., fingers of an inputter) is near the metal dome 140. In detail, the determining unit 220 determines whether changes in electrostatic capacitances of the first to third pressure sensors C1 to C3 exceed respective prescribed values (S22 to S24). If change in electrostatic capacitance of the first pressure sensor C1 exceeds the corresponding prescribed value (S22; YES), the determining unit 220 determines fingers of an inputter is in a vicinity of the first end of the metal dome 140 (the left part thereof in FIG. 17, part thereof corresponding to the first pressure sensor C1) (S25). If change in electrostatic capacitance of the second pressure sensor C2 exceeds the corresponding prescribed value (S23; YES), the determining unit 220 determines fingers of an inputter is in a vicinity of the second end of the metal dome 140 (the right part thereof in FIG. 17, part thereof corresponding to the second pressure sensor C2) (S26). If change in electrostatic capacitance of the third pressure sensor C3 exceeds the corresponding prescribed value (S24; YES), the determining unit 220 determines fingers of an inputter is in a vicinity of the central part of the metal dome 140 (the center thereof in FIG. 17, part thereof corresponding to the third pressure sensor C3) (S27). Note that, the prescribed values for the first to third pressure sensors C1 to C3 may be different or same. The second determination operation uses the first to third pressure sensors C1 to C3 which are also used in the first determination operation. Therefore, no additional sensors are required to determine whether a detection target is in a vicinity of the metal dome 140.

As described above, the determination system 200 is a determination system configured to determine input to the input device 102 based on output from the input device 102, and includes the obtaining unit 210 and the determining unit 220. The obtaining unit 210 obtains changes in electrostatic capacitances of the first and second pressure sensors C1 and C2 from the input device 102. The determining unit 220 determines which part of the metal dome 140 in the predetermined direction has been pressed (inclination), based on the balance between changes in electrostatic capacitances of the first and second pressure sensors C1 and C2. The determination system 200 may be implemented by one or more processors (microprocessors) and one or more memories, for example. In one example, the determination system 200 may be realized by a micro control unit. As described above, the one or more processors execute one or more programs stored in the one or more memories to function as the determination system 200. Stated differently, the one or more programs include a determination program allowing the one or more processors to perform the following determination method. The determination method includes obtaining changes in electrostatic capacitances of the first and second pressure sensors C1 and C2 from the input device 102. Further, the determination method includes determining which part of the metal dome 140 in the predetermined direction has been pressed (inclination), based on the balance between changes in electrostatic capacitances of the first and second pressure sensors C1 and C2.

2.2 Variation 2

Figure 26:
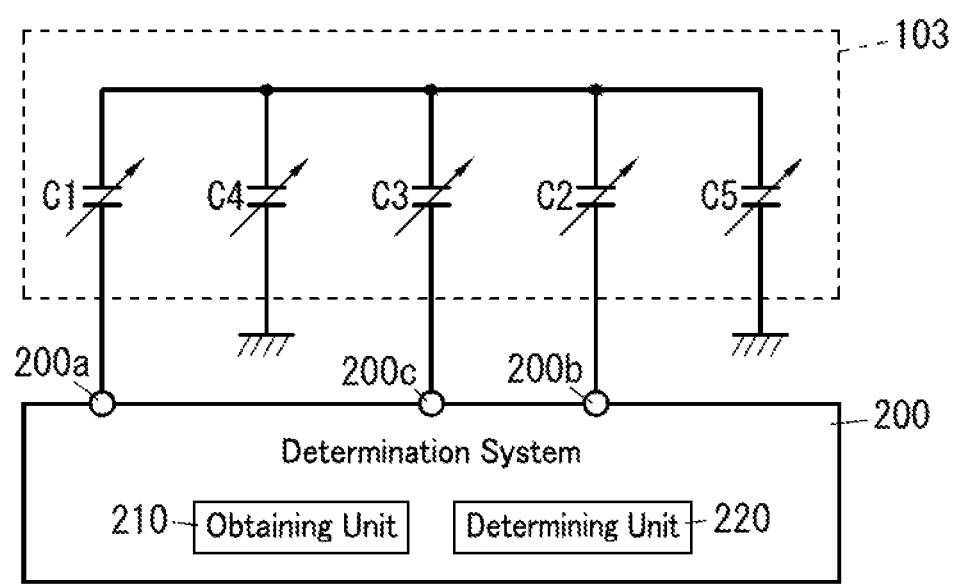
FIG. 26 is a schematic diagram of an input system according to Variation 2.

FIG. 26 is an illustration of an input system of the present embodiment. The input system includes an input device 103 and a determination system 200.

As shown in FIG. 26, the input device 103 includes fourth and fifth pressure sensors C4 and C5 in addition to the first to third pressure sensors C1 to C3.

Figure 27:
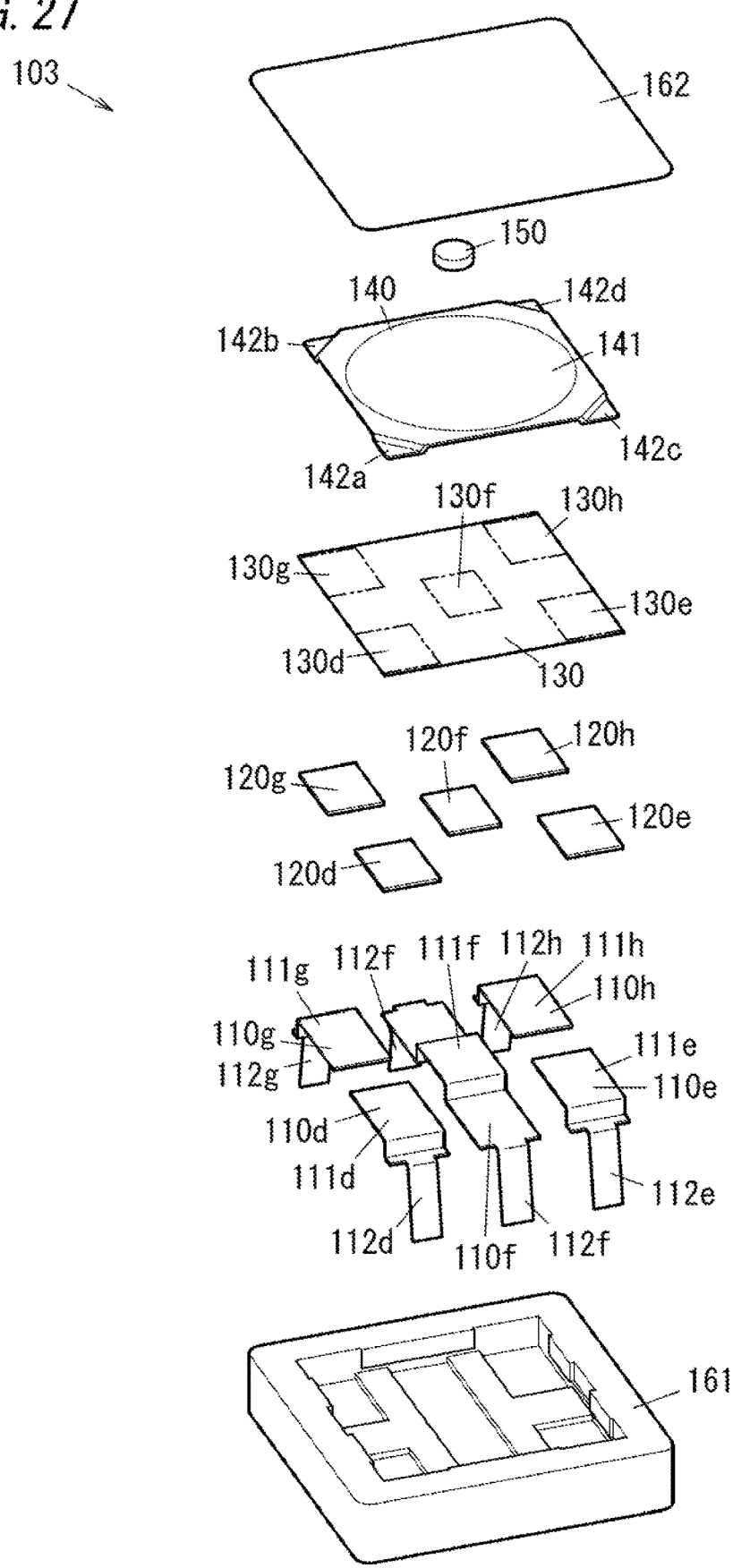
FIG. 27 is a perspective view of an input device of the input system.

Hereinafter, the input device 103 is described in detail with reference to FIG. 27 and FIG. 28. As shown in FIG. 27, the input device 103 includes first to fifth electrically conductive members 110*d* to 110*h*, first to fifth elastic members 120*d* to 120*h*, the insulating sheet 130, the metal dome 140, and the pressing member 150. Additionally, the input device 103 includes the housing 160 (see FIG. 28).

As shown in FIG. 27, the first electrically conductive member 110*d* includes an electrode 111*d* and a terminal 112*d*. The electrode 111*d* has a rectangular flat plate shape. The terminal 112*d* protrudes from one end in a length axis of the electrode 111*d*. A direction in which the terminal 112*d* protrudes from the electrode 111*d* is a direction crossing the length axis and a width axis of the electrode 111*d*. The second, fourth and fifth electrically conductive members 110*e*, 110*g*, and 110*h* each have the same shape as the first electrically conductive member 110*d* and include electrodes 111*e*, 111*g*, and 111*h* and terminals 112*e*, 112*g*, and 112*h*, respectively. The third electrically conductive member 110*f* has the same shape as the third electrically conductive member 110c of the input device 102 and includes an electrode 111f and a pair of terminals 112f The first to fifth electrically conductive members 110d to 110h may be made of metal plates.

The first to fifth electrically conductive members 110d to 110h are embedded in the body 161 by insert molding. Accordingly, the electrodes 111d to 111h of the first to fifth electrically conductive members 110d to 110h are used as fixed electrodes. And, the body 161 is used as a base (support) supporting the electrodes (fixed electrodes) 111d to 111h. In this regard, the electrodes 111d, 111e, 111g, and 111h of the first, second, fourth, and fifth electrically conductive members 110d, 110e, 110g, and 110h are exposed on four corners of the bottom surface of the body 161, respectively. In contrast, a central part of the electrode 111f of the third electrically conductive member 110f is exposed on a center of the bottom surface of the body 161. The terminals 112d, 112e, 112g, and 112h of the first, second, fourth, and fifth electrically conductive members 110d, 110e, 110g, and 110h and the pair of terminals 112f of the third electrically conductive member 110f protrude from the second surface in the thickness axis of the body 161.

As shown in FIG. 27, the first to fifth elastic members 120d to 120h each have a rectangular flat plate shape. The first, second, fourth, and fifth elastic members 120d, 120e, 120g, and 120h have outer shapes almost identical to outer shapes of corresponding electrodes 111d, 111e, 111g, and 111h, respectively. The first, second, fourth, and fifth elastic members 120d, 120e, 120g, and 120h are placed on corresponding electrodes 111d, 111e, 111g, and 111h, respectively. The third elastic member 120f has an outer shape almost identical to an outer shape of a central part in a length axis of the electrode 111f of the third electrically conductive member 110f The third elastic member 120f is placed on the central part in the length axis of the electrode 111f In the present embodiment, the first to fifth elastic members 120d to 120h each are electrically conductive. Additionally, a first surface in a thickness axis of each of the first to fifth elastic members 120d to 120h includes a rough surface and a second surface in the thickness axis of each of the first to fifth elastic members 120d to 120h includes a flat surface. In one example, the first surface in the thickness axis of each of the first to fifth elastic members 120d to 120h includes a plurality of protrusions 121 (see FIG. 15 and FIG. 16) similarly to the first elastic member 120a of the input device 102.

As shown in FIG. 27, the insulating sheet 130 has a size capable of covering the first to fifth elastic members 120d to 120h collectively. The insulating sheet 130 includes first to fifth portions 130d to 130h which cover the first to fifth elastic members 120d to 120h respectively.

The metal dome 140 includes at its four corners the first to fourth legs 142a to 142d similarly to Variation 1. As shown in FIG. 28, the first, second, third and fourth legs 142a, 142b, 142c, and 142d are placed on the first, second, third, and fifth elastic members 120d, 120e, 120g, and 120h, respectively.

In the input device 103, the first to fifth electrically conductive members 110d to 110h, the first to fifth elastic members 120d to 120h, the insulating sheet 130, and the metal dome 140 server as capacitors with electrostatic capacitances. Stated differently, the first to fifth electrically conductive members 110d to 110h, the first to fifth elastic members 120d to 120h, the insulating sheet 130, and the metal dome 140 constitute first to fifth pressure sensors C1 to C5.

In more detail, the first pressure sensor C1 is constituted by the electrode 111d of the first electrically conductive member 110d, the first elastic member 120d, the first portion 130d of the insulating sheet 130, and the first leg 142a of the metal dome 140. In other words, the first pressure sensor C1 is constituted by the electrode 111d, a predetermined part (the first leg 142a) of the metal dome 140 supported on the electrode 111d, and an insulator (the first portion 130d) between the electrode 111d and the predetermined part. The first pressure sensor C1 further includes an elastic member (the first elastic member 120d) between the insulator (the first portion 130d) and the electrode 111d.

The second pressure sensor C2 is constituted by the electrode 111e of the second electrically conductive member 110e, the second elastic member 120e, the second portion 130e of the insulating sheet 130, and the third leg 142c of the metal dome 140. In other words, the second pressure sensor C2 is constituted by the electrode 111e, a predetermined part (the third leg 142c) of the metal dome 140 supported on the electrode 111e, and an insulator (the second portion 130e) between the electrode 111e and the predetermined part. The second pressure sensor C2 further includes an elastic member (the second elastic member 120e) between the insulator (the second portion 130e) and the electrode 111e.

The fourth pressure sensor C4 is constituted by the electrode 111g of the fourth electrically conductive member 110g, the fourth elastic member 120g, the fourth portion 130g of the insulating sheet 130, and the second leg 142b of the metal dome 140. In other words, the fourth pressure sensor C4 is constituted by the electrode 111g, a predetermined part (the second leg 142b) of the metal dome 140 supported on the electrode 111g, and an insulator (the fourth portion 130g) between the electrode 111g and the predetermined part. The fourth pressure sensor C4 further includes an elastic member (the fourth elastic member 120g) between the insulator (the fourth portion 130g) and the electrode 111g.

The fifth pressure sensor C5 is constituted by the electrode 111h of the fifth electrically conductive member 110h, the fifth elastic member 120h, the fifth portion 130h of the insulating sheet 130, and the fourth leg 142d of the metal dome 140. In other words, the fifth pressure sensor C5 is constituted by the electrode 111h, a predetermined part (the fourth leg 142d) of the metal dome 140 supported on the electrode 111h, and an insulator (the fifth portion 130h) between the electrode 111h and the predetermined part. The fifth pressure sensor C5 further includes an elastic member (the fifth elastic member 120h) between the insulator (the fifth portion 130h) and the electrode 111h.

Each of the first, second, fourth, and fifth pressure sensors C1, C2, C4, and C5 is a pressure sensor facing the concave surface 141a of the metal dome 140 and supporting the metal dome 140. As shown in FIG. 28, the first pressure sensor C1 and the second pressure sensor C2 are on opposite sides, in a (first) predetermined direction crossing the central axis of the metal dome 140 (parallel to the left and right directions in FIG. 28), with respect to the central axis of the metal dome 140. In contrast, the first pressure sensor C1 and the second pressure sensor C2 are on the same side, in a second predetermined direction crossing the central axis of the metal dome 140 and the first predetermined direction, with respect to the central axis of the metal dome 140. In the present embodiment, the second predetermined direction is a direction perpendicular to the central axis of the metal dome 140 and the first predetermined direction and also is a direction in which the first leg 142a and the second leg 142b (or the third leg 142c and the fourth leg 142d) are arranged.

Figure 28:
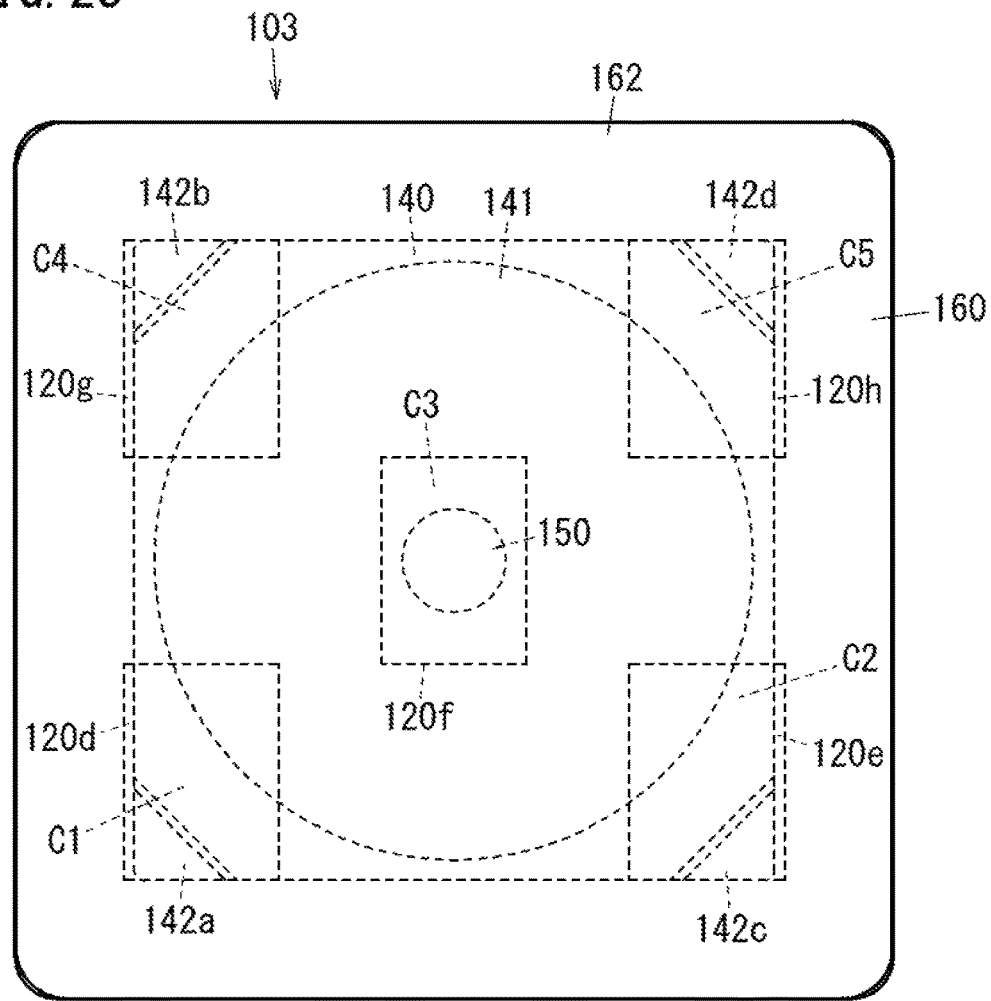
FIG. 28 is a plan of the input device.

In summary, in FIG. 28, the second predetermined direction is parallel to upward and downward directions. Similarly, the fourth pressure sensor C4 and the fifth pressure sensor C5 are on opposite sides, in the first predetermined direction (parallel to the left and right directions in FIG. 28), with respect to the central axis of the metal dome 140. In contrast, the fourth pressure sensor C4 and the fifth pressure sensor C5 are on the same side, in the second predetermined direction (parallel to the upward and downward directions in FIG. 28), with respect to the central axis of the metal dome 140. In particular, the fourth pressure sensor C4 is an additional pressure sensor located on an opposite side from a corresponding pressure sensor which is one of the first pressure sensor C1 and the second pressure sensor C2 (in this situation, the first pressure sensor C1) with regard to the central axis of the metal dome 140 in the second predetermined direction. In addition, the fifth pressure sensor C5 is an additional pressure sensor located on an opposite side from a corresponding pressure sensor which is one of the first pressure sensor C1 and the second pressure sensor C2 (in this situation, the second pressure sensor C2) with regard to the central axis of the metal dome 140 in the second predetermined direction. Therefore, the fourth pressure sensor C4 and the first pressure sensor C1 are on the same side with regard to the central axis of the metal dome 140 in the first predetermined direction. Similarly, the fifth pressure sensor C5 and the second pressure sensor C2 are on the same side with regard to the central axis of the metal dome 140 in the first predetermined direction. Further, each of the first, second, fourth, and fifth pressure sensors C1, C2, C4, and C5 is an electrostatic pressure sensor.

The third pressure sensor C3 is constituted by the electrode 111f of the third electrically conductive member 110f, the third elastic member 120f, the third portion 130f of the insulating sheet 130, and the elastically deformable part 141 of the metal dome 140. The third pressure sensor C3 further includes an elastic member (the third elastic member 120f) between an insulator (the third portion 130f of the insulating sheet 130) and the electrode 111f.

The third pressure sensor C3 is an electrostatic pressure sensor analogous to the first, second, fourth, and fifth pressure sensors C1, C2, C4, and C5. However, the third pressure sensor C3 is different from the first, second, fourth, and fifth pressure sensors C1, C2, C4, and C5 and is not a pressure sensor facing the concave surface 141a of the metal dome 140 and supporting the metal dome 140. The third pressure sensor C3 functions as a similar detector to Variation 1.

The input device 103 described above includes the first to fifth pressure sensors C1 to C5. Each of the first to fifth pressure sensors C1 to C5 is an electrostatic pressure sensor and therefore can be used as a proximity sensor for sensing an object with the ground potential (e.g., fingers or hands of an inputter). In one example, the input device 103 can detect fingers or hands of an inputter close to the metal dome 140 by the first to fifth pressure sensors C1 to C5.

Further, the input device 103 can determine amount of pressing (stroke) of the metal dome 140.

When the central part of the metal dome 140 is pressed, almost equal pressures act on the first, second, fourth, and fifth pressure sensors C1, C2, C4, and C5. Hence, electrostatic capacitances of the first, second, fourth, and fifth pressure sensors C1, C2, C4, and C5 are increased with increase in amount of pressing (stroke) of the metal dome 140. On the other hand, the third pressure sensor C3 does not support the metal dome 140 and therefore sees change in its electrostatic capacitance smaller than those of the first, second, fourth, and fifth pressure sensors C1, C2, C4, and C5. When elastic deformation of the elastically deformable part 141 of the metal dome 140 occurs together with production of a click, the third pressure sensor C3 sees a large change in its electrostatic capacitance.

When a first part of the metal dome 140 in the first predetermined direction (parallel to the left and right directions in FIG. 28) (the left part thereof in FIG. 28, part thereof corresponding to the first and fourth pressure sensors C1 and C4) is pressed, the first pressure sensor C1 sees pressure higher than that acting on the second pressure sensor C2. In addition, the fourth pressure sensor C4 sees pressure higher than that acting on the fifth pressure sensor C5. In contrast, when a second part of the metal dome 140 in the first predetermined direction (parallel to the left and right directions in FIG. 28) (the right part thereof in FIG. 28, part thereof corresponding to the second and fifth pressure sensors C2 and C5) is pressed, the second pressure sensor C2 sees pressure higher than that acting on the first pressure sensor C1. In addition, the fifth pressure sensor C5 sees pressure higher than that acting on the fourth pressure sensor C4. Such differences in pressure can be measured from changes in electrostatic capacitances of the first, second, fourth, and fifth pressure sensors C1, C2, C4, and C5. Therefore, the input device 103 can identify part of the metal dome 140 pressed by an inputter in the first predetermined direction of the metal dome 140.

When a third part of the metal dome 140 in the second predetermined direction (parallel to the upward and downward directions in FIG. 28) (the lower part thereof in FIG. 28, part thereof corresponding to the first and second pressure sensors C1 and C2) is pressed, the first pressure sensor C1 sees pressure higher than that acting on the fourth pressure sensor C4. In addition, the second pressure sensor C2 sees pressure higher than that acting on the fifth pressure sensor C5. In contrast, when a fourth part of the metal dome 140 in the second predetermined direction (parallel to the upward and downward directions in FIG. 28) (the upper part thereof in FIG. 28, part thereof corresponding to the fourth and fifth pressure sensors C4 and C5) is pressed, the fourth pressure sensor C4 sees pressure higher than that acting on the first pressure sensor C1. In addition, the fifth pressure sensor C5 sees pressure higher than that acting on the second pressure sensor C2. Such differences in pressure can be measured from changes in electrostatic capacitances of the first, second, fourth, and fifth pressure sensors C1, C2, C4, and C5. Therefore, the input device 103 can identify part of the metal dome 140 pressed by an inputter in the second predetermined direction of the metal dome 140.

Also in the input device 103, each of the first to fifth pressure sensors C1 to C5 is an electrostatic pressure sensor and therefore can be used as a proximity sensor for sensing an object with the ground potential (e.g., fingers or hands of an inputter). In one example, the input device 103 can detect fingers or hands of an inputter close to the metal dome 140 by the first to fifth pressure sensors C1 to C5.

As shown in FIG. 26, the determination system 200 includes the first to third terminals 200a to 200c. The first to third terminals 200a to 200c are electrically connected to the first to third pressure sensors C1 to C3 of the input device 103, respectively. For example, the first, second and third terminals 200a, 200b, and 200c are connected to the terminal 112d of the first electrically conductive member 110d, the terminal 112e of the second electrically conductive member 110e, and one terminal 112f of the third electrically conductive member 110f, respectively. By doing so, the determination system 200 is electrically connected to the first, second and third pressure sensors C1, C2, and C3 (the electrodes 111d, 111e, and 111f). In contrast, the determination system 200 is not connected to the fourth and fifth pressure sensors C4 and C5 of the input device 103 directly. As shown in FIG. 26, the fourth and fifth pressure sensors C4 and C5 are grounded.

The determination system 200 is configured to perform the first determination operation and the second determination operation by the obtaining unit 210 and the determining unit 220.

In the first determination operation, the obtaining unit 210 applies a voltage to the first terminal 200a and grounds the second and third terminals 200b and 200c to measure change in electrostatic capacitance of the first pressure sensor C1, as described in relation to Variation 1. Further, the fourth and fifth pressure sensors C4 and C5 are grounded. In summary, the obtaining unit 210 obtains change in electrostatic capacitance of the first pressure sensor C1 while the fourth pressure sensor C4 is grounded. Hence, the first pressure sensor C1 is connected to a parallel circuit of the second, third, fourth, and fifth pressure sensors C2, C3, C4, and C5. In this regard, the first and fourth pressure sensors C1 and C4 are on the same side in the first predetermined direction with regard to the central axis of the metal dome 140. Accordingly, when the first end in the first predetermined direction of the metal dome 140 is pressed, not only electrostatic capacitance of the first pressure sensor C1 but also electrostatic capacitance of the fourth pressure sensor C4 may be changed. Therefore, change in electrostatic capacitance of a whole of the input device 103 becomes larger. In conclusion, with regard to pressing of the first end in the first predetermined direction of the metal dome 140, the measurement sensitivity therefor can be improved. This may result in improvement of accuracy for determination of pressed part.

Also in the first determination operation, the obtaining unit 210 applies a voltage to the second terminal 200b and grounds the first and third terminals 200a and 200c to measure change in electrostatic capacitance of the second pressure sensor C2, as described in relation to Variation 1. Further, the fourth and fifth pressure sensors C4 and C5 are grounded. In summary, the obtaining unit 210 obtains change in electrostatic capacitance of the second pressure sensor C2 while the fifth pressure sensor C5 is grounded. Hence, the second pressure sensor C2 is connected to a parallel circuit of the first, third, fourth, and fifth pressure sensors C1, C3, C4, and C5. In this regard, the second and fifth pressure sensors C2 and C5 are on the same side in the first predetermined direction with regard to the central axis of the metal dome 140. Accordingly, when the second end in the first predetermined direction of the metal dome 140 is pressed, not only electrostatic capacitance of the second pressure sensor C2 but also electrostatic capacitance of the fifth pressure sensor C5 may be changed.

Therefore, change in electrostatic capacitance of a whole of the input device 103 becomes larger. In conclusion, with regard to pressing of the second end in the first predetermined direction of the metal dome 140, the measurement sensitivity therefor can be improved. In the present embodiment, the fourth and fifth pressure sensors C4 and C5 are grounded permanently. Therefore, it is unnecessary to provide the determination system 200 with additional terminals for grounding the fourth and fifth pressure sensors C4 and C5.

2.3 Variation 3

Figure 29:
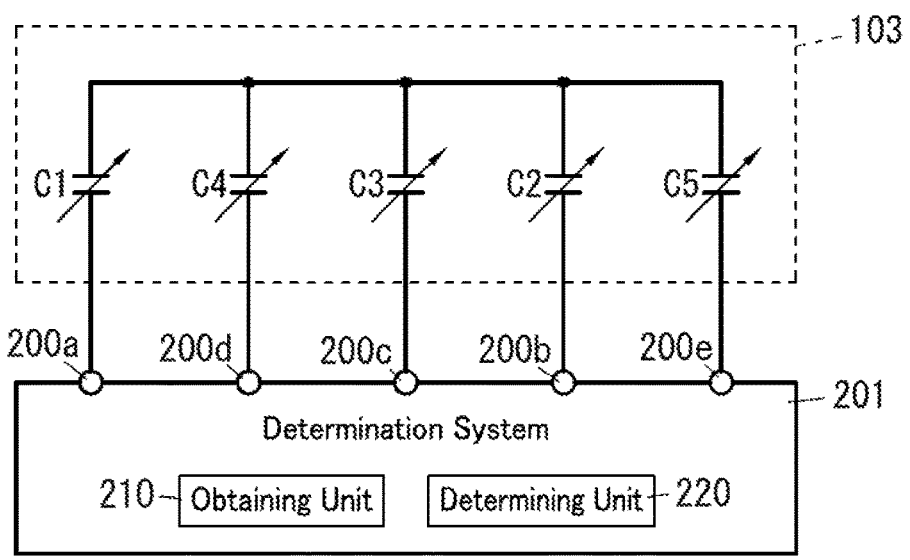
FIG. 29 is a schematic diagram of an input system according to Variation 3.

FIG. 29 shows an input system according to the present embodiment. The input system of the present embodiment includes the input device 103 and a determination system 201.

The determination system 201 is configured to determine input to the input device 103 based on output (an input result) from the input device 103. In the present embodiment, the input result includes values of (changes in) electrostatic capacitances of the first to fifth pressure sensors C1 and C5 of the input device 103. The determination system 201 may be implemented by one or more processors (microprocessors) and one or more memories, similarly to the determination system 200.

As shown in FIG. 29, the determination system 201 includes first to fifth terminals 200a to 200e. The first to fifth terminals 200a to 200e are electrically connected to the first to fifth pressure sensors C1 to C5 of the input device 103, respectively. For example, the first, second and third terminals 200a, 200b, and 200c are connected to the terminal 112d of the first electrically conductive member 110d, the terminal 112e of the second electrically conductive member 110e, and one terminal 112f of the third electrically conductive member 110f, respectively. Additionally, the fourth and fifth terminals 200d and 200e are connected to the terminal 112g of the fourth electrically conductive member 110g and the terminal 112h of the fifth electrically conductive member 110h, respectively. By doing so, the determination system 201 is electrically connected to the first to fifth pressure sensors C1 to C5 (the electrodes 111d to 111h).

The determination system 201 is configured to perform the first determination operation and the second determination operation by the obtaining unit 210 and the determining unit 220, similarly to the determination system 200.

In the first determination operation, the obtaining unit 210 sets the sensitivity for determination of changes in electrostatic capacitances, to the first level. Next, the obtaining unit 210 obtains changes in electrostatic capacitances. In detail, the obtaining unit 210 applies a voltage to any one of the first to fifth terminals 200a to 200e and grounds the others. By doing so, the obtaining unit 210 measures changes in electrostatic capacitances of the first to fifth pressure sensors C1 to C5 in turn.

When the obtaining unit 210 obtains changes in electrostatic capacitances of the first to fifth pressure sensors C1 to C5, the determining unit 220 determines which part of the metal dome 140 in the first predetermined direction has been pressed (inclination), based on a balance of changes in electrostatic capacitances of the first and second pressure sensors C1 and C2. In addition, the determining unit 220 determines which part of the metal dome 140 in the second predetermined direction has been pressed (inclination), based on a balance of changes in electrostatic capacitances of the first and fourth pressure sensors C1 and C4.

In detail, based on a result of the comparison between changes in electrostatic capacitances of the first and second pressure sensors C1 and C2, the determining unit 220 determines which part of the metal dome 140 in the first predetermined direction has been pressed (inclination). The determining unit 220 uses a pair of pressure sensors on opposite sides in the first predetermined direction of the metal dome 140 with regard to the central axis of the metal dome 140. In a concrete example, the determining unit 220 compares changes in electrostatic capacitances of the first and second pressure sensors C1 and C2. If change in electrostatic capacitance of the first pressure sensor C1 is larger than change in electrostatic capacitance of the second pressure sensor C2, the determining unit 220 determines that the first end of the metal dome 140 (the left part thereof in FIG. 28, part thereof corresponding to the first and fourth pressure sensors C1 and C4) has been pressed. If change in electrostatic capacitance of the second pressure sensor C2 is larger than change in electrostatic capacitance of the first pressure sensor C1, the determining unit 220 determines that the second end of the metal dome 140 (the right part thereof in FIG. 28, part thereof corresponding to the second and fifth pressure sensors C2 and C5) has been pressed. If change in electrostatic capacitance of the first pressure sensor C1 is equal to change in electrostatic capacitance of the second pressure sensor C2, the determining unit 220 determines that the central part of the metal dome 140 (the center thereof in FIG. 28, part thereof corresponding to the third pressure sensor C3) has been pressed.

In addition, based on a result of the comparison between changes in electrostatic capacitances of the first and fourth pressure sensors C1 and C4, the determining unit 220 determines which part of the metal dome 140 in the second predetermined direction has been pressed (inclination). The determining unit 220 uses a pair of pressure sensors on opposite sides in the second predetermined direction of the metal dome 140 with regard to the central axis of the metal dome 140. In a concrete example, the determining unit 220 compares changes in electrostatic capacitances of the first and fourth pressure sensors C1 and C4. If change in electrostatic capacitance of the first pressure sensor C1 is larger than change in electrostatic capacitance of the fourth pressure sensor C4, the determining unit 220 determines that the third end of the metal dome 140 (the lower part thereof in FIG. 28, part thereof corresponding to the first and second pressure sensors C1 and C2) has been pressed. If change in electrostatic capacitance of the fourth pressure sensor C4 is larger than change in electrostatic capacitance of the first pressure sensor C1, the determining unit 220 determines that the fourth end of the metal dome 140 (the upper part thereof in FIG. 28, part thereof corresponding to the fourth and fifth pressure sensors C4 and C5) has been pressed. If change in electrostatic capacitance of the first pressure sensor C1 is equal to change in electrostatic capacitance of the fourth pressure sensor C4, the determining unit 220 determines that the central part of the metal dome 140 (the center thereof in FIG. 28, part thereof corresponding to the third pressure sensor C3) has been pressed.

Further, the determining unit 220 determines which part of the metal dome 140 has been pressed, based on a combination of pressed parts in the first and second predetermined directions of the metal dome 140. When the pressed part in the first predetermined direction is determined to be the first end and the pressed part in the second predetermined direction is determined to be the third end, the determining unit 220 determines that a first corner of the metal dome 140 (the left and lower part thereof in FIG. 28, part thereof corresponding to the first pressure sensor C1 only) has been pressed. For example, when the pressed part in the first predetermined direction is determined to be the second end and the pressed part in the second predetermined direction is determined to be the third end, the determining unit 220 determines that a second corner of the metal dome 140 (the right and lower part thereof in FIG. 28, part thereof corresponding to the second pressure sensor C2 only) has been pressed. For example, when the pressed part in the first predetermined direction is determined to be the first end and the pressed part in the second predetermined direction is determined to be the fourth end, the determining unit 220 determines that a third corner of the metal dome 140 (the left and upper part thereof in FIG. 28, part thereof corresponding to the fourth pressure sensor C4 only) has been pressed. For example, when the pressed part in the first predetermined direction is determined to be the second end and the pressed part in the second predetermined direction is determined to be the fourth end, the determining unit 220 determines that a fourth corner of the metal dome 140 (the right and upper part thereof in FIG. 28, part thereof corresponding to the fifth pressure sensor C5 only) has been pressed. For example, it is supposed that the pressed part in the first predetermined direction is determined to be the first end and the pressed part in the second predetermined direction is determined to be the central part. In this supposition, the determining unit 220 determines that a center of the first end of the metal dome 140 (the center part of the left side thereof in FIG. 28, part thereof between the first and fourth pressure sensors C1 and C4) has been pressed. For example, it is supposed that the pressed part in the first predetermined direction is determined to be the second end and the pressed part in the second predetermined direction is determined to be the central part. In this supposition, the determining unit 220 determines that a center of the second end of the metal dome 140 (the center part of the right side thereof in FIG. 28, part thereof between the second and fifth pressure sensors C2 and C5) has been pressed. For example, it is supposed that the pressed part in the first predetermined direction is determined to be the center part and the pressed part in the second predetermined direction is determined to be the third end. In this supposition, the determining unit 220 determines that a center of the third end of the metal dome 140 (the center part of the lower side thereof in FIG. 28, part thereof between the first and second pressure sensors C1 and C2) has been pressed. For example, it is supposed that the pressed part in the first predetermined direction is determined to be the center part and the pressed part in the second predetermined direction is determined to be the fourth end. In this supposition, the determining unit 220 determines that a center of the fourth end of the metal dome 140 (the center part of the upper side thereof in FIG. 28, part thereof between the fourth and fifth pressure sensors C4 and C5) has been pressed. For example, if the pressed parts in the first and second predetermined directions both are determined to be the center parts, the determining unit 220 determines that the center of the metal dome 140 (the center part thereof in FIG. 28, part thereof corresponding to the third pressure sensor C3 only) has been pressed.

Additionally, the determining unit 220 determines whether change in electrostatic capacitance of the third pressure sensor C3 exceeds the prescribed value. If change in electrostatic capacitance of the third pressure sensor C3 exceeds the prescribed value, the determining unit 220 determines that a click has been produced.

In the second determination operation, the obtaining unit 210 sets the sensitivity for measuring changes in electrostatic capacitances to the second level. The second level is selected to be higher than the first level. Next, the obtaining unit 210 obtains changes in electrostatic capacitances. When the obtaining unit 210 obtains changes in electrostatic capacitances of the first to fifth pressure sensors C1 to C5, the determining unit 220 determines whether changes in electrostatic capacitances of the first to fifth pressure sensors C1 to C5 exceed respective prescribed values. If change in electrostatic capacitance of the first pressure sensor C1 exceeds the corresponding prescribed value, the determining unit 220 determines that fingers of an inputter is in a vicinity of the first corner of the metal dome 140 (the left and lower part thereof in FIG. 28, part thereof corresponding to the first pressure sensor C1 only). If change in electrostatic capacitance of the second pressure sensor C2 exceeds the corresponding prescribed value, the determining unit 220 determines that fingers of an inputter is in a vicinity of the second corner of the metal dome 140 (the right and lower part thereof in FIG. 28, part thereof corresponding to the second pressure sensor C2 only). If change in electrostatic capacitance of the third pressure sensor C3 exceeds the corresponding prescribed value, the determining unit 220 determines that fingers of an inputter is in a vicinity of the center of the metal dome 140 (the center part thereof in FIG. 28, part thereof corresponding to the third pressure sensor C3 only). If change in electrostatic capacitance of the fourth pressure sensor C4 exceeds the corresponding prescribed value, the determining unit 220 determines fingers of an inputter is in a vicinity of the third corner of the metal dome 140 (the left and upper part thereof in FIG. 28, part thereof corresponding to the fourth pressure sensor C4 only). If change in electrostatic capacitance of the fifth pressure sensor C5 exceeds the corresponding prescribed value, the determining unit 220 determines fingers of an inputter is in a vicinity of the fourth corner of the metal dome 140 (the right and upper part thereof in FIG. 28, part thereof corresponding to the fifth pressure sensor C5 only). Note that, the prescribed values for the first to fifth pressure sensors C1 to C5 may be different or same.

2.4 Variation 4

Figure 30:
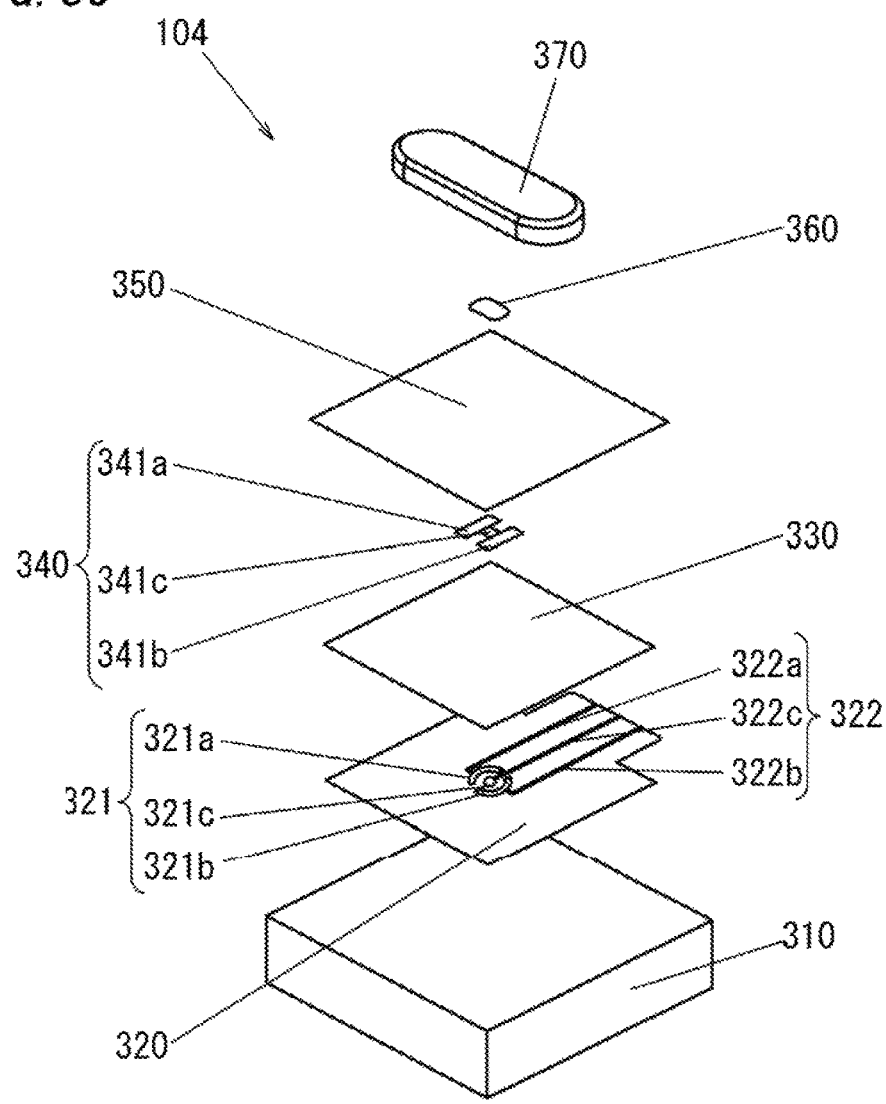
FIG. 30 is a perspective view of an input device of an input system according to Variation 4.
Figure 36:
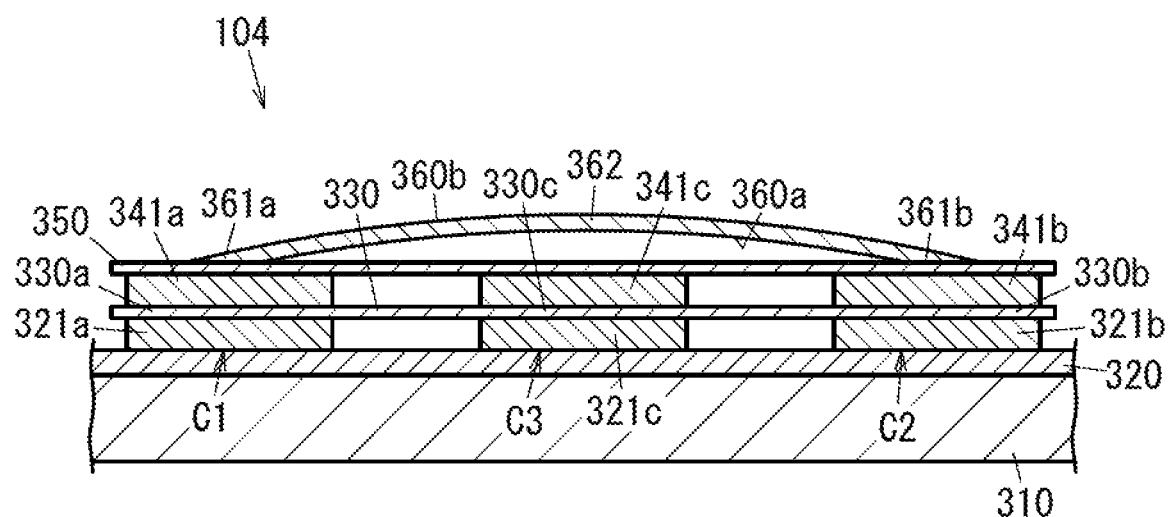
FIG. 36 is an explanatory view of an operation of the input device with a metal dome being not pressed.
Figure 37:
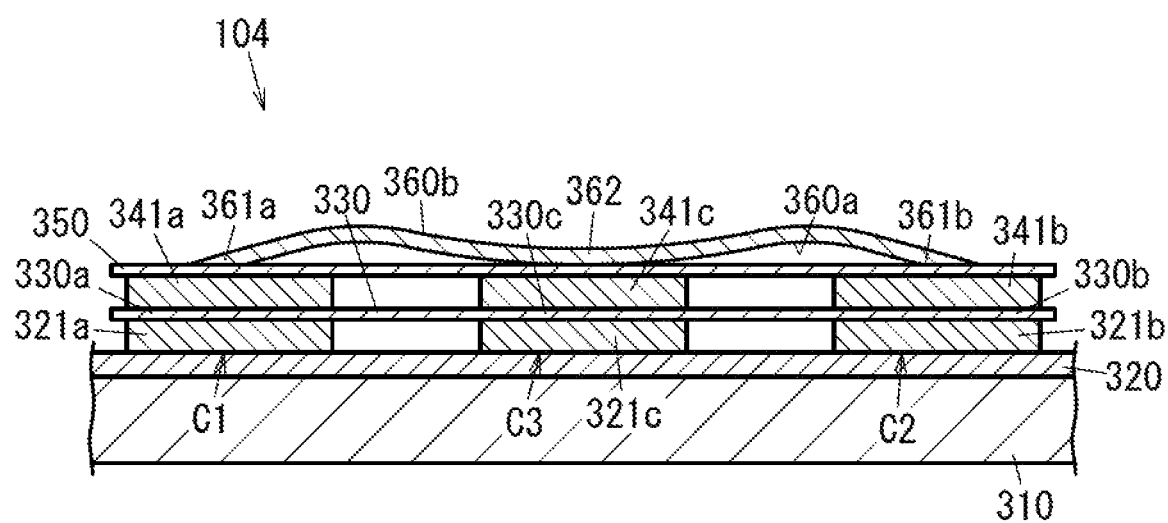
FIG. 37 is an explanatory view of an operation of the input device with the metal dome being pressed.

FIG. 30 shows an input device 104 used in an input system of the present embodiment. As shown in FIG. 36 and FIG. 37, the input device 104 includes a substrate 310, pressure sensors placed on the substrate 310 (the first pressure sensor C1, the second pressure sensor C2, and the third pressure sensor C3), and a metal dome 360 placed on the pressure sensors C1, C2, and C3. According to the input device 104 of the present embodiment, pressing force directed to the pressure sensors C1, C2, and C3 is transferred to the pressure sensors C1, C2, and C3 by way of the metal dome 360. The metal dome 360 is elastically deformed by such pressing force and then can produce a click. Therefore, it is possible to provide the input device 104 which includes the pressure sensors C1, C2, and C3 yet can produce a click.

Further, in the input device 104, the three pressure sensors C1, C2, and C3 include specific pressure sensors C1 and C2 which face a concave surface 360a of the metal dome 360 and support the metal dome 360. Therefore, even before the metal dome 360 is elastically deformed and then a click is produced, pressing force applied on the metal dome 360 (pressing force applied on a convex surface 360b of the metal dome 360) can be measured by the pressure sensors C1 and C2. After the metal dome 360 is elastically deformed and then a click is produced, pressing force applied on the metal dome 360 can be measured by the pressure sensors C1, C2, and C3. To sum up, irrespective of production of a click (irrespective of occurrence of elastic deformation of the metal dome 360), pressing force on the metal dome 360 can be measured.

Figure 31:
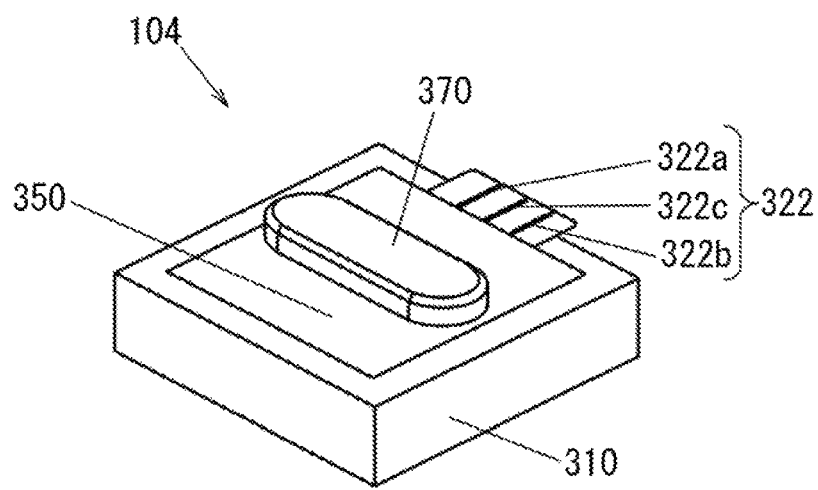
FIG. 31 is a perspective view of the input device.

Hereinafter, using FIG. 30 to FIG. 37, the input device 104 is described. As shown in FIG. 30, the input device 104 includes the substrate 310, a printed substrate 320, an insulating sheet 330, an electrically conductive sheet 340, a protective sheet 350, the metal dome 360, and a pressing member 370. Further, the input device 104 includes a cover which is attached to the substrate 310 and constitutes a housing together with the substrate 310. The cover exposes the pressing member 370 to be allowed to be operated. As shown in FIG. 31, the printed substrate 320 is placed on the substrate 310. In particular, the substrate 310 has a rectangular flat plate shape. The printed substrate 320 is placed on a surface in a thickness axis of the substrate 310 (an upper surface thereof in FIG. 30).

Figure 32:
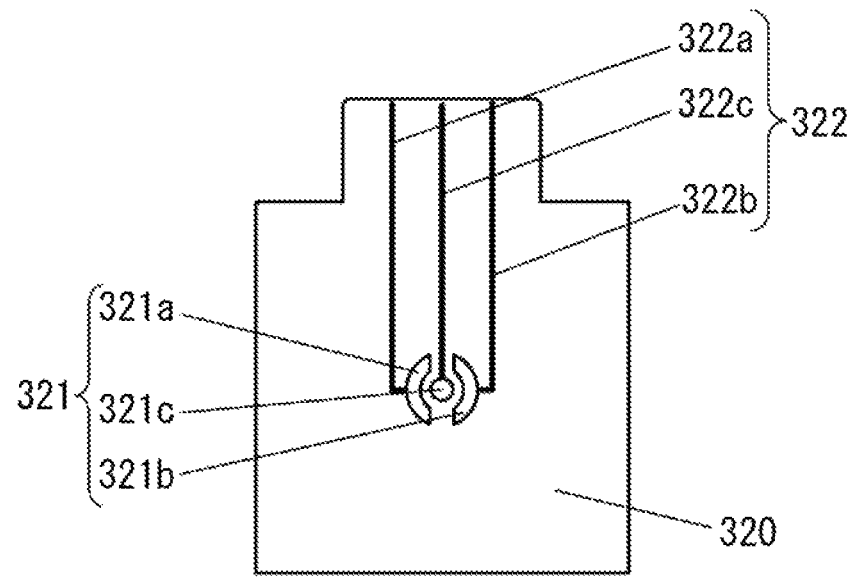
FIG. 32 is a plan of a printed substrate of the input device.
Figure 33:
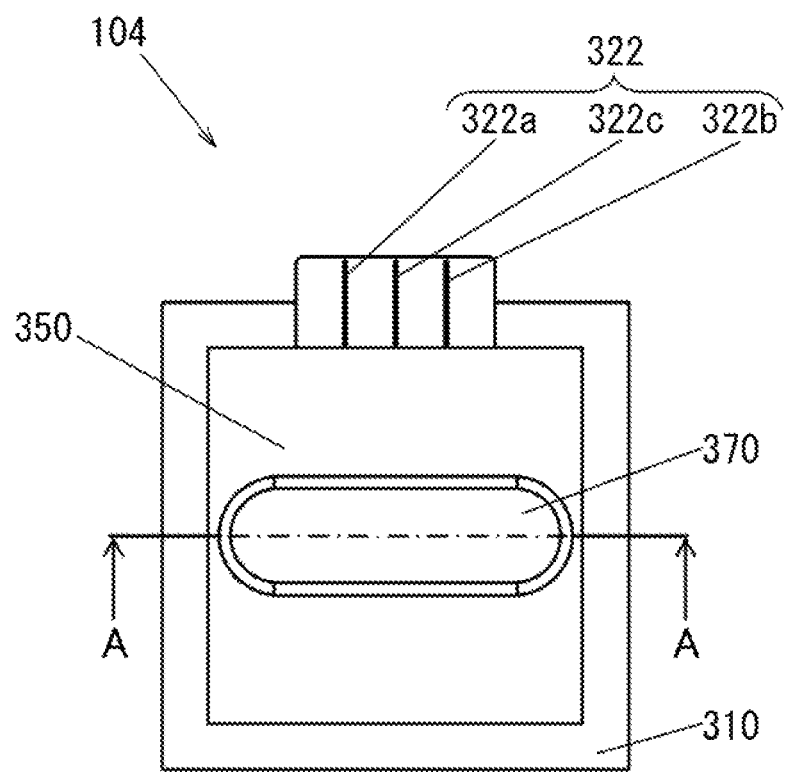
FIG. 33 is a plan of the input device.
Figure 34:
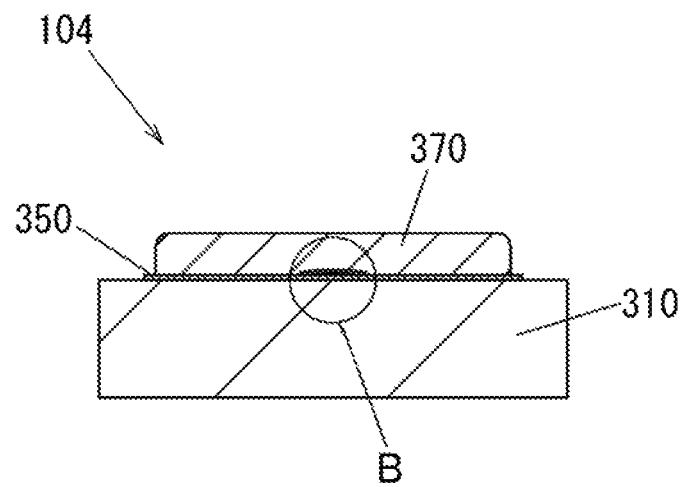
FIG. 34 is a section taken along the line A-A in FIG. 33.
Figure 35:
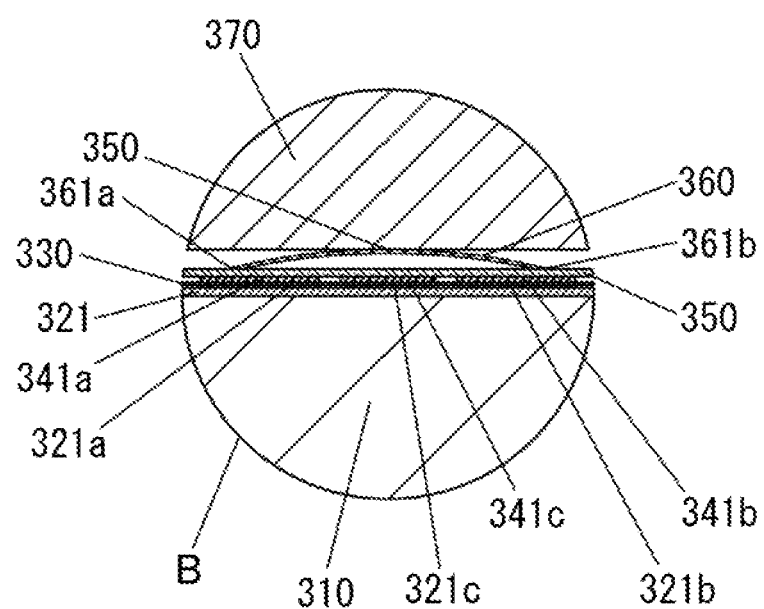
FIG. 35 is an enlarged view of the region B in FIG. 34.

As shown in FIG. 32, the printed substrate 320 includes an electrode 321 and a conductive line 322 electrically connected to the electrode 321. For example, the electrode 321 and the conductive line 322 are patterned conductors formed on an insulating substrate.

As shown in FIG. 32, the electrode 321 include a first electrode 321a, a second electrode 321b, and a third electrode 321c. The first electrode 321a and the second electrode 321b are formed into arc shapes. The first electrode 321a and the second electrode 321b are arranged opposite each other. The third electrode 321c is formed into a circle shape. The third electrode 321c is placed between the first electrode 321a and the second electrode 321b. Note that, as shown in FIG. 32, the first electrode 321a, the second electrode 321b, and the third electrode 321c are formed as separate parts.

As shown in FIG. 32, the conductive line 322 include a first conductive line 322a electrically connected to the first electrode 321a, a second conductive line 322b electrically connected to the second electrode 321b, and a third conductive line 322c electrically connected to the third electrode 321c. The first conductive line 322a, the second conductive line 322b, and the third conductive line 322c each are connected to a micro control unit. Note that, as shown in FIG. 32, the first conductive line 322a, the second conductive line 322b, and the third conductive line 322c are formed as separate parts.

The insulating sheet 330 is placed on the printed substrate 320. And, the insulating sheet 330 covers the printed substrate 320. In particular, the insulating sheet 330 has electrically insulating properties. The insulating sheet 330 covers at least the first electrode 321a, the second electrode 321b, and the third electrode 321c of the printed substrate 320. Further, the insulating sheet 330 does not cover opposite end of the conductive line 322 from the electrode 321.

The electrically conductive sheet 340 is placed on the insulating sheet 330. Further, the electrically conductive sheet 340 is placed facing the electrode 321 with the insulating sheet 330 in-between. The electrically conductive sheet 340 includes a first electrically conductive part 341a, a second electrically conductive part 341b, and a third electrically conductive part 341c. Note that, as shown in FIG. 30, the first electrically conductive part 341a, the second electrically conductive part 341b, and the third electrically conductive part 341c are formed as separate parts.

The first electrically conductive part 341a is placed in a position corresponding to the first electrode 321a. The second electrically conductive part 341b is placed in a position corresponding to the second electrode 321b. The third electrically conductive part 341c is placed in a position corresponding to the third electrode 321c.

Stated differently, the first electrically conductive part 341a and the second electrically conductive part 341b are placed facing each other. The third electrically conductive part 341c is placed between the first electrically conductive part 341a and the second electrically conductive part 341b.

The protective sheet 350 is placed on the electrically conductive sheet 340. The protective sheet 350 covers the electrically conductive sheet 340. Especially, the protective sheet 350 covers the first electrically conductive part 341a, the second electrically conductive part 341b, and the third electrically conductive part 341c collectively.

The metal dome 360 is a metal plate curving in its thickness axis. As shown in FIG. 36, a first surface in the thickness axis of the metal dome 360 (the lower surface in FIG. 36) defines the concave surface 360a and a second surface (the upper surface in FIG. 36) defines the convex surface 360b. When the convex surface 360b of the metal dome 360 is pressed, the metal dome 360 is elastically deformed as shown in FIG. 37 and thus a click is produced.

As shown in FIG. 36, the metal dome 360 is placed on the protective sheet 350 so as to be convex upward. Further, the metal dome 360 is placed in a position corresponding to the electrically conductive sheet 340.

The metal dome 360 includes a first edge 361a, a second edge 361b, and a top 362. The top 362 serves as a pressure receiving part. The first edge 361a and the second edge 361b are a pair of outer edges. The first edge 361a is placed in a position corresponding to the first electrically conductive part 341a and is in contact with the protective sheet 350. The second edge 361b is placed in a position corresponding to the second electrically conductive part 341b and is in contact with the protective sheet 350. The top 362 is formed between the first edge 361a and the second edge 361b so as to be convex upward. The top 362 is placed in a position corresponding to the third electrically conductive part 341c. For example, the first edge 361a and the second edge 361b are opposite ends in the length axis of the metal dome 360 and the top 362 is a central part in the length axis of the metal dome 360.

The pressing member 370 is placed on the metal dome 360. And, the pressing member 370 is in contact with the top 362. In particular, the pressing member 370 has electrically insulating properties. The pressing member 370 has a rectangular plate shape with a length. The pressing member 370 has an outer shape larger than an outer shape of the metal dome 360. The pressing member 370 has a surface in its thickness axis, which is in contact with the convex surface 360b of the metal dome 360.

The input device 104 is formed as described above. The electrode 321, the electrically conductive sheet 340, and the insulating sheet 330 placed between the electrode 321 and the electrically conductive sheet 340 function as capacitors with electrostatic capacitances. In other words, the printed substrate 320, the insulating sheet 330, and the electrically conductive sheet 340 constitute electrostatic pressure sensors (the first pressure sensor C1, the second pressure sensor C2, and the third pressure sensor C3). In more detail, as shown in FIG. 36 and FIG. 37, the first pressure sensor C1 is constituted by the first electrode 321a, the first electrically conductive part 341a, and a first portion 330a of the insulating sheet 330. The first portion 330a of the insulating sheet 330 is portion of the insulating sheet 330 and sandwiched between the first electrode 321a and the first electrically conductive part 341a. And, the second pressure sensor C2 is constituted by the second electrode 321b, the second electrically conductive part 341b, and a second portion 330b of the insulating sheet 330. The second portion 330b of the insulating sheet 330 is portion of the insulating sheet 330 and sandwiched between the second electrode 321b and the second electrically conductive part 341b. And, the third pressure sensor C3 is constituted by the third electrode 321c, the third electrically conductive part 341c, and a third portion 330c of the insulating sheet 330. The third portion 330c of the insulating sheet 330 is portion of the insulating sheet 330 and sandwiched between the third electrode 321c and the third electrically conductive part 341c.

When an inputter (user) presses the pressing member 370 as if lightly touching it, the pressing member 370 slightly presses the metal dome 360. This pressing force presses the first electrically conductive part 341a and the second electrically conductive part 341b by way of the first edge 361a and the second edge 361b. This may cause change in electrostatic capacitance given by the electrode 321, the electrically conductive sheet 340, and the insulating sheet 330 placed between the electrode 321 and the electrically conductive sheet 340. Especially, electrostatic capacitances of the first pressure sensor C1 and the second pressure sensor C2 may be changed. Such changes in electrostatic capacitances are measured by the micro control unit connected to the input device 104 via the conductive line 322.

In that case, the pressing force does not cause a click, but the pressing force can be measured. In other words, the input device 104 can detect a touch (a touch of the pressing member 370 by an inputter). Stated differently, even before the metal dome 360 is elastically deformed and then a click is produced, pressing force applied on the metal dome 360 (pressing force applied on the convex surface 360b of the metal dome 360) can be measured by the pressure sensors C1 and C2.

An inputter further presses the pressing member 370, the metal dome 360 is elastically deformed together with production of a click. The click produced by the metal dome 360 is transferred to the inputter through the pressing member 370. Thus, the inputter can feel the click.

Such elastic deformation of the metal dome 360 allows the top 362 to press the third electrode 321c as shown in FIG. 37. In this situation, the first electrically conductive part 341a, the second electrically conductive part 341b, and the third electrically conductive part 341c can be pressed by way of the first edge 361a, the second edge 361b, and the top 362. Accordingly, change in electrostatic capacitance of the third pressure sensor C3 is caused in addition to changes in electrostatic capacitances of the first pressure sensor C1 and the second pressure sensor C2. Therefore, after the metal dome 360 is elastically deformed and then a click is produced, pressing force applied on the metal dome 360 can be measured by the pressure sensors C1, C2, and C3. Use of the metal dome 360 can increase changes in electrostatic capacitances.

When pressing force just causing elastic deformation of the metal dome 360 is used as a threshold value, the third electrically conductive part 341c and the third electrode 321c (i.e., the third pressure sensor C3) can be used as a sensor for determining whether pressing force equal to or larger than the threshold value is applied to the input device 104. The pressing force just causing elastic deformation of the metal dome 360 is equal to pressing force on the metal dome 360 required to cause elastic deformation of the metal dome 360. Accordingly, change in electrostatic capacitance of the third pressure sensor C3 enables determination as to whether a click is produced.

These changes in electrostatic capacitances (changes in individual electrostatic capacitances of the pressure sensors C1, C2, and C3) can be measured by the micro control unit. The micro control unit outputs an input signal based on results of measurements. In this regard, the micro control unit can be replaced with the determination system 200 of Variation 1. In other words, the input device 104 and the determination system 200 may constitute an input system.

For example, as to the input device 104, the third electrode 321c may serve as a second fixed electrode, one of the first and second electrodes 321a and 321b may serve as a first fixed electrode and the other may serve as a third fixed electrode, and a fourth fixed electrode may be newly provided. In this case, the first to third electrodes 321a to 321c may have the same shape.

b2.5 Other Variations

As shown in FIG. 18, changes in electrostatic capacitances caused by elastic deformation of the metal dome 140 can be seen in the first and second pressure sensors C1 and C2. Therefore, production of a click can be detected by use of the first and second pressure sensors C1 and C2. In this case, the input device (102; 103; 104) may not necessarily include the third pressure sensor C3.

In the input device (102; 103; 104), the number of pressure sensors may not be limited particularly. For example, in the input device 103, the two pressure sensors C1 and C2 (or C4 and C5) are arranged in the first predetermined direction but three or more pressure sensors may be arranged in line. In the input device 103, the two pressure sensors C1 and C4 (or C2 and C5) are arranged in the second predetermined direction but three or more pressure sensors may be arranged in line. In the input device (102; 103; 104), a plurality of pressure sensors may be arranged in a matrix (e.g., 2 by 2, 2 by 3, and 3 by 3).

It is sufficient that the input device (102; 103; 104) includes at least one pressure sensor. For example, the input device 102 may include the first pressure sensor C1 only. In this regard, in the input device 102, the electrodes 111b and 111c of the second and third electrically conductive members 110b and 110c may be exposed from the insulating sheet 130. In this case, the second and third pressure sensors C2 and C3 are not formed. Instead, the electrode 111b is in contact with the metal dome 140 anytime. And, the electrode 111c comes into contact with the metal dome 140 only when the metal dome 140 is elastically deformed. Therefore, based on whether a conduction path between the second and third electrically conductive members 110b and 110c is made or broken, production of a click can be detected.

In the input device 102, the first to third elastic members 120a to 120c may not be electrically conductive. As to each of the first to third elastic members 120a to 120c, opposite surfaces in the thickness axis thereof may be rough surfaces or flat surfaces. Further, the first to third elastic members 120a to 120c may be omitted. This can also apply to the input device 103.

Further, shapes of components of the input device (102; 103; 104) may not be limited to shapes of those of the above embodiments. For example, the outer shape of the metal dome 140 may not be limited to the aforementioned outer shape and the shape of the elastically deformable part 141 may not be limited particularly. The metal dome 140 may be constituted by the elastically deformable part 141 only. However, the metal dome 140 can be placed more stably when it includes the legs 142a to 142b. The shape of the pressing member 150 may be a shape other than the disk shape (e.g., a rectangular plate shape). The shape of the housing 160 may be a shape other than the flat quadrangle box shape (e.g., a hollow cylindrical shape).

Further, in the input device (102; 103; 104), shapes of electrodes (21a to 21c; 111a to 111c; 111d to 111h) may not be limited to shapes of those in the embodiments and may be modified suitably in accordance with the shape of the metal dome (360; 140) and/or applications of pressure sensors.

Figure 38:
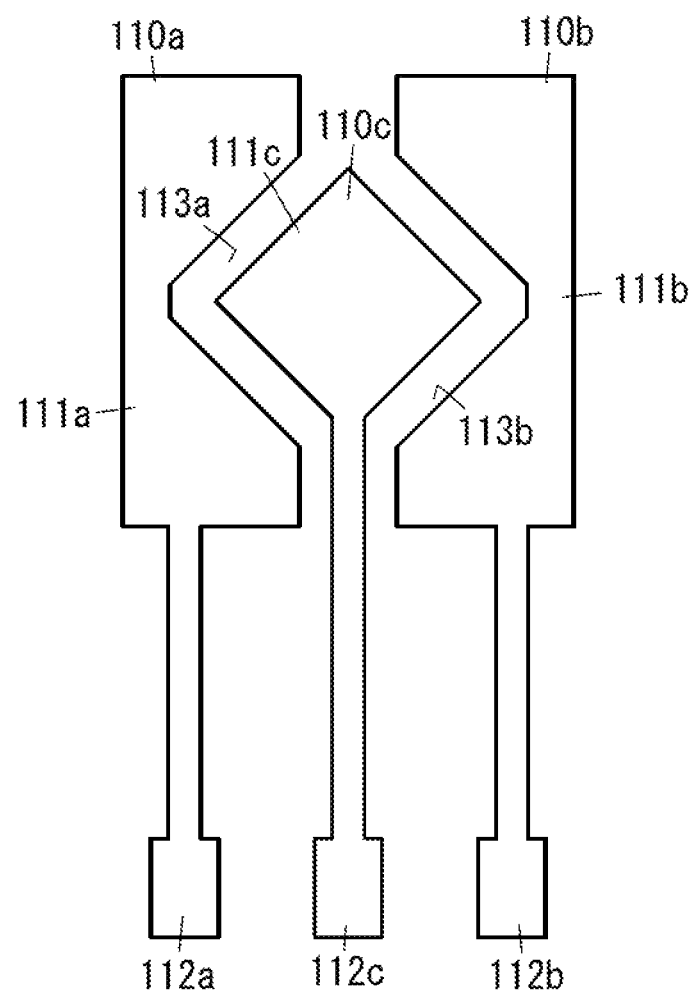
FIG. 38 is a plan of a variation of a set of electrodes of the input device of the input system according to Variation 1.

For example, FIG. 38 shows variations of the electrodes 111a to 111c of the first, second, and third electrically conductive members 110a to 110c of the input device 102 of Variation 1. In FIG. 38, the electrode 111c has a square plate shape. The electrodes 111a and 111b have rectangular plate shapes but include triangle cutouts 113a and 113b in sides close to the electrode 111c for avoiding interference with the electrode 111c.

Figure 39:
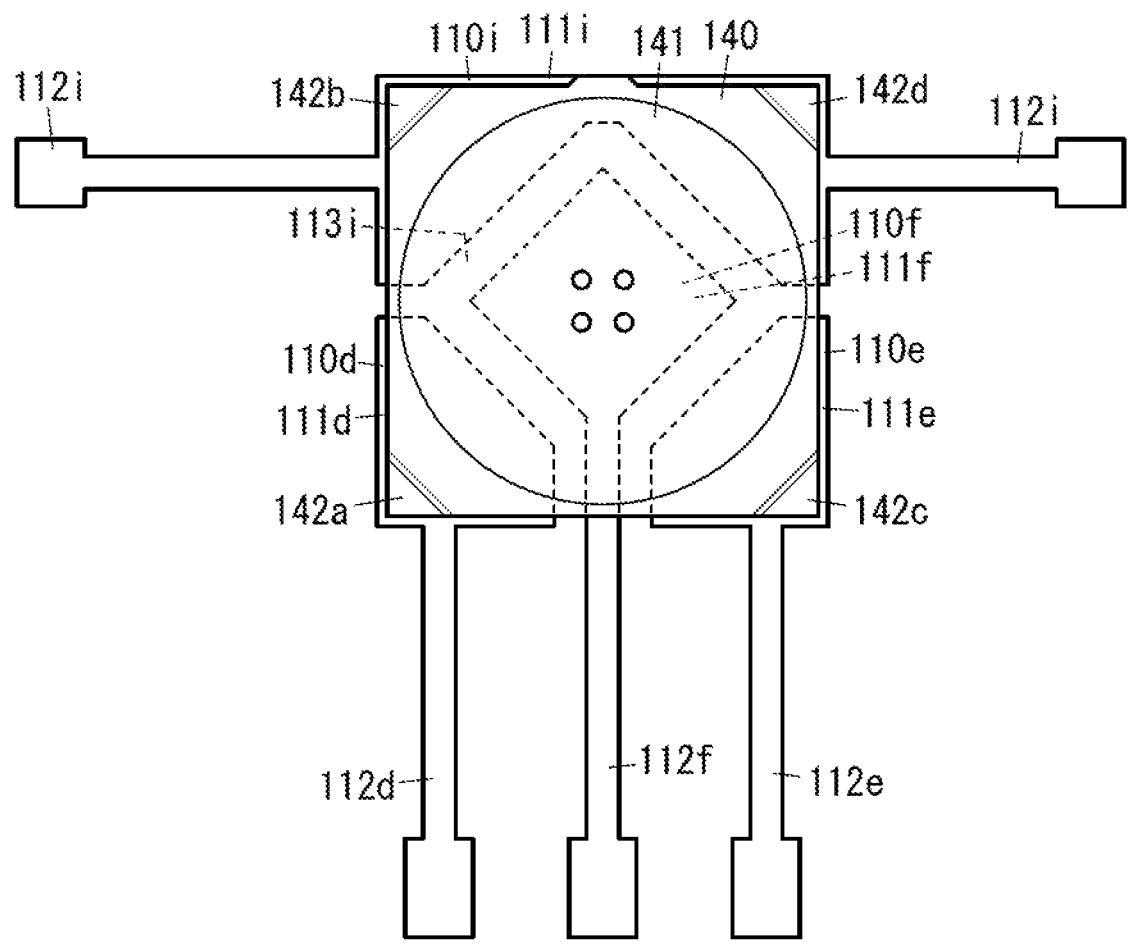
FIG. 39 is a plan of a variation of a set of electrodes of the input device of the input system according to Variation 2.

For example, in the input system of Variation 2, the fourth and fifth pressure sensors C4 and C5 of the input device 103 are grounded. Therefore, the electrodes 111g and 111h of the fourth and fifth electrically conductive member 110g and 110h may be electrically connected to each other. FIG. 39 shows a variation of the input device 103 of the input system of Variation 2. In the variation shown in FIG. 39, the electrode 111f has a square plate shape. Further, in this variation, a sixth electrically conductive member 110i is used instead of the fourth and fifth electrically conductive members 110g and 110h. The sixth electrically conductive member 110i includes an electrode 111i and a pair of terminals 112i. The electrode 111i has a rectangular plate shape but includes a triangle cutout 113i in a side close to the electrode 111f for avoiding interference with the electrode 111f The pair of terminals 112i protrudes from opposite ends in a length axis of the electrode 111i. Note that, the electrodes 111d and 111e have tapered corners close to the electrode 111f for avoiding interference with the electrode 111f.

In the input device 102, the pair of terminals 112a, the pair of terminals 112b, and the pair of terminals 112c may protrude from not the second surface in the thickness axis of the body 161 of the housing 160 but a side surface thereof. According to this, undesired effects of flux used in mounting the input device 102 can be reduced. This configuration may apply to the input device 103. Also the terminals 112d, 112e, 112f, 112g, and 112h may protrude from not the second surface in the thickness axis of the body 161 of the housing 160 but the side surface.

In the input device 104, when direct contact between the electrically conductive sheet 340 and the electrode 321 is prevented, the insulating sheet 330 may not be necessarily required to cover the printed substrate 320 as shown in FIG. 30. Similarly, the protective sheet 350 may have a shape and size capable of preventing direct contact between the metal dome 360 and the electrically conductive sheet 340.

Similarly in the input device 102, the insulating sheet 130 may not be necessarily required to cover the first to third elastic members 120a, 120b, and 120c collectively. It is sufficient that the insulating sheet 130 can prevent direct contact between the metal dome 140 and the first to third electrically conductive members 110a to 110c. Thus, in the input device 102, the insulating sheet 130 may include at least the first to third portions 130a to 130c. This configuration may apply to the input device 103 and the insulating sheet 130 may include at least the first to fifth portions 130d to 130h. In this regard, surfaces of the metal dome 140 corresponding to the first to third elastic members 120a, 120b, and 120c may be covered with insulating layers or subjected to insulating treatment. In this case, the insulating sheet 130 can be omitted. This configuration also may apply to the input device 103.

In the determination system 201, the determining unit 220 may use the fifth pressure sensor C5 for determining which part has been pressed. For example, the determining unit 220 may determine which part of the metal dome 140 in the first predetermined direction has been pressed (inclination), based on a balance between changes in electrostatic capacitances of the fourth and fifth pressure sensors C4 and C5. Or, the determining unit 220 may determine which part of the metal dome 140 in the second predetermined direction has been pressed (inclination), based on a balance between changes in electrostatic capacitances of the second and fifth pressure sensors C2 and C5. The determining unit 220 may determine which part of the metal dome 140 has been pressed, by use of results of these determinations, and consequently accuracy of determination can be improved.

In the determination system (200; 201), the obtaining unit 210 obtains changes in electrostatic capacitances from a plurality of pressure sensors, individually but may treat two or more of the plurality of pressure sensors as a single pressure sensor and obtain change in electrostatic capacitance from that single pressure sensor.

For example, the determination system 200 determines whether a detection target (e.g., fingers of an inputter) is in a vicinity of the metal dome 140, based on each of the plurality of pressure sensors C1 to C3. In this regard, the determination system 200 may use two or more pressure sensors as a single sensor and determine based on this single sensor whether a detection target (e.g., fingers of an inputter) is in a vicinity of the metal dome 140. For example, in step S21, the determination system 200 may apply voltages to all of the first to third terminals 200a to 200c. By doing so, the first to third pressure sensors C1 to C3 functions as a single pressure sensor. Hence, the determination system 200 can obtain the sum of changes in electrostatic capacitances of the first to third pressure sensors C1 to C3 and determine whether a detection target is approaching, based on this sum. In other words, it is possible to improve accuracy of determination as to whether a detection target is approaching, instead of determining which pressure sensor of the plurality of pressure sensors the detection target is approaching. This configuration may apply to the determining unit 220 of the determination system 201. Note that, there is no need to use all of a plurality of pressure sensors as a single sensor, but using two or more of the plurality of pressure sensors as a single sensor can contribute to improvement of sensitivity.

For example, to determine: which part in the first predetermined direction has been pressed; and amount of pressing, the determination system 201 may use the first and fourth pressure sensors C1 and C4 as a single pressure sensor and also use the second and fifth pressure sensors C2 and C5 as another single pressure sensor. In summary, based on a result of comparison between the sum of changes in electrostatic capacitances of the first and fourth pressure sensors C1 and C4 and the sum of changes in electrostatic capacitances of the second and fifth pressure sensors C2 and C5, the determining unit 220 may determine which part in the first predetermined direction has been pressed, and amount of pressing. In this case, the obtaining unit 210 applies voltages to the terminals 112d and 112g and grounds the terminals 112e, 112f, and 112h, thereby obtaining the sum of changes in electrostatic capacitances of the first and fourth pressure sensors C1 and C4. Similarly, the obtaining unit 210 applies voltages to the terminals 112e and 112h and grounds the terminals 112d, 112f, and 112g, thereby obtaining the sum of changes in electrostatic capacitances of the second and fifth pressure sensors C2 and C5. According to this, it is possible to improve detection accuracies for which part in the first predetermined direction of the metal dome 140 has been pressed, and amount of such pressing. Likewise, to determine: which part in the second predetermined direction has been pressed; and amount of C1 and C2 as a single pressure sensor and also use the fourth and fifth pressure sensors C4 and C5 as another single pressure sensor. In summary, based on a result of comparison between the sum of changes in electrostatic capacitances of the first and second pressure sensors C1 and C2 and the sum of changes in electrostatic capacitances of the fourth and fifth pressure sensors C4 and C5, the determining unit 220 may determine which part in the second predetermined direction of the metal dome 140 has been pressed, and amount of pressing. In this case, the obtaining unit 210 applies voltages to the terminals 112d and 112e and grounds the terminals 112f, 112g, and 112h, thereby obtaining the sum of changes in electrostatic capacitances of the first and second pressure sensors C1 and C2. Similarly, the obtaining unit 210 applies voltages to the terminals 112g and 112h and grounds the terminals 112d, 112e, and 112f, thereby obtaining the sum of changes in electrostatic capacitances of the fourth and fifth pressure sensors C4 and C5. According to this, it is possible to improve detection accuracies for which part in the second predetermined direction has been pressed, and amount of such pressing.

3. Aspects

As apparent from the above embodiments and variations, a first aspect is a switch body (100; 101) including: a base (10); and a movable electrode (30). The base (10) includes a first fixed electrode (11A to 11C), a second fixed electrode (12A to 12C), a third fixed electrode (13A to 13C), and a fourth fixed electrode (14A to 14C). The second fixed electrode (12A to 12C) is placed next to the first fixed electrode (11A to 11C) to be electrically independent from the first fixed electrode (12A to 12C). The third fixed electrode (13A to 13C) is placed next to the second fixed electrode (12A to 12C) and on an opposite side of the second fixed electrode (12A to 12C) from the first fixed electrode (11A to 11C). The fourth fixed electrode (14A to 14C) is placed next to the first fixed electrode (11A to 11C) and on an opposite side of the first fixed electrode (11A to 11C) from the second fixed electrode (12A to 12C). The movable electrode (30) includes a pressure receiving part (30A) opposite from the second fixed electrode (12A to 12C) of the base (10), a first outer edge (31A) facing the first fixed electrode (11A to 11C), and a second outer edge (31B) facing the third fixed electrode (13A to 13C). The movable electrode (30) is designed to allow movement of an opposite surface from the pressure receiving part (30A) toward the second fixed electrode (12A to 12C) when the pressure receiving part (30A) is pressed toward the base (10) and then deformed. The fourth fixed electrode (14A to 14C) is formed in a region outside a projection region being a projection of the movable electrode (30) on the base (10). The fourth fixed electrode (14A to 14C) is in a position facing the first outer edge (31A) of the movable electrode (30) when the second outer edge (31B) of the movable electrode (30) is moved to a region where the second fixed electrode (12A to 12C) is formed. According to the first aspect, it is possible to change the position of the movable electrode (30) relative to the base (10) without changing the positions of the fixed electrodes (first to fourth electrodes) formed in the base (10).

A second aspect is a switch body (100) which would be realized in combination with the first aspect. In the second aspect, the first outer edge (31A) is in contact with the first fixed electrode (11A to 11C). The second outer edge (31B) is in contact with the second fixed electrode (12A to 12C). The movable electrode (30) is designed to electrically interconnect the first fixed electrode (11A to 11C) and the second fixed electrode (12A to 12C) by making the opposite surface from the pressure receiving part (30A) in contact with the second fixed electrode (12A to 12C) when the pressure receiving part (30A) is pressed toward the base (10) and then deformed. The fourth fixed electrode (14A to 14C) is formed in the region outside the projection region being the projection of the movable electrode (30) on the base (10). The fourth fixed electrode (14A to 14C) is in a position in contact with the first outer edge (31A) of the movable electrode (30)

when the second outer edge (31B) of the movable electrode (30) is moved to the region where the second fixed electrode (12A to 12C) is formed. According to the second aspect, it is possible to change the position of the movable electrode (30) relative to the base (10) without changing the positions of the fixed electrodes (first to fourth electrodes) formed in the base (10).

A third aspect is a switch body (100) which would be realized in combination with the second aspect. In the third aspect, a shape of the first fixed electrode (11A to 11C) is same as a shape of the second fixed electrode (12A to 12C). According to the third aspect, it is possible to change the position of the movable electrode (30) relative to the base (10) without changing the positions of the fixed electrodes (first to fourth electrodes) formed in the base (10).

A fourth aspect is a switch body (100) which would be realized in combination with the second or third aspect. In the fourth aspect, the third fixed electrode (13A to 13C) is electrically connected to the first fixed electrode (11A to 11C) in the base (10). According to the fourth aspect, it is possible to change the position of the movable electrode (30) relative to the base (10) without changing the positions of the fixed electrodes (first to fourth electrodes) formed in the base (10).

A fifth aspect is a switch body (100) which would be realized in combination with any one of the second to fourth aspects. In the fifth aspect, the fourth fixed electrode (14A to 14C) is electrically connected to the second fixed electrode (12A to 12C) in the base (10). According to the fifth aspect, it is possible to change the position of the movable electrode (30) relative to the base (10) without changing the positions of the fixed electrodes (first to fourth electrodes) formed in the base (10).

A sixth aspect is a switch body (101) which would be realized in combination with the first aspect. In the sixth aspect, the switch body (101) includes a first insulator (61A to 61C), a second insulator (62A to 62C), and a third insulator (63A to 63C). The first insulator (61A to 61C) is present on a surface of the first fixed electrode (11A to 11C) facing the movable electrode (30). The second insulator (62A to 62C) is present on a surface of the second fixed electrode (12A to 12C) facing the movable electrode (30). The third insulator (63A to 63C) is present on a surface of the third fixed electrode (13A to 13C) facing the movable electrode (30). According to the sixth aspect, the movable electrode (30), the first to third fixed electrodes (11A to 11C, 12A to 12C, 13A to 13C), and the first to third insulators (61A to 61C, 62A to 62C, 63A to 63C) constitute electrostatic pressure sensors. Therefore, it is possible to determine which part of the movable electrode (30) has been pressed.

A seventh aspect is a switch body (101) which would be realized in combination with the sixth aspect. In the seventh aspect, the switch body (101) includes a first elastic member (71A to 71C), a second elastic member (72A to 72C), and a third elastic member (73A to 73C). The first elastic member (71A to 71C) is between the first fixed electrode (11A to 11C) and the first insulator (61A to 61C). The second elastic member (72A to 72C) is between the second fixed electrode (12A to 12C) and the second insulator (62A to 62C). The third elastic member (73A to 73C) is between the third fixed electrode (13A to 13C) and the third insulator (63A to 63C). According to the seventh aspect, it is possible to improve the sensitivities of the pressure sensors.

An eighth aspect is a switch body (101) which would be realized in combination with the seventh aspect. In the eighth aspect, the first elastic member (71A to 71C), the second elastic member (72A to 72C), and the third elastic member (73A to 73C) each are electrically conductive. According to the eighth aspect, it is possible to improve the sensitivities of the pressure sensors.

A ninth aspect is a switch body (100; 101) which would be realized in combination with any one of the first to eighth aspects. In the ninth aspect, the switch body (100; 101) further includes a spacer (20) including an opening (20A, 20B, 20C) accommodating the movable electrode (30). The spacer (20) is placed over the base (10) to cover the fourth fixed electrode (14A to 14C) with a region outside the opening (20A to 20C) of the spacer (20). According to the ninth aspect, it is possible to reduce unnecessary exposure of the fourth fixed electrode (14A to 14C) and also reduce undesired corrosion such as oxidation.

A tenth aspect is a switch body (100; 101) which would be realized in combination with any one of the first to ninth aspects. In the tenth aspect, the first fixed electrode (11A to 11C) is one of a plurality of first fixed electrodes (11A to 11C). The second fixed electrode (12A to 12C) is one of a plurality of second fixed electrodes (12A to 12C). The third fixed electrode (13A to 13C) is one of a plurality of third fixed electrodes (13A to 13C). The fourth fixed electrode (14A to 14C) is one of a plurality of fourth fixed electrodes (14A to 14C). The movable electrode (30) is one of a plurality of movable electrodes (30). According to the tenth aspect, it is possible to change the position of the movable electrode (30) relative to the base (10) without changing the positions of the fixed electrodes (first to fourth electrodes) formed in the base (10).

INDUSTRIAL APPLICABILITY

A switch body of any of the aspects according to the present disclosure enable change of a position of a movable electrode relative to a base without changing positions of fixed electrodes formed in the base, and accordingly may be very useful for an electronic device where a switch body of any of the aspects according to the present disclosure.

REFERENCE SINGS LIST 100, 101 Switch Body
10 Wiring Substrate (Base)
11A, 11B, 11C First Fixed Electrode
12A, 12B, 12C Second Fixed Electrode
13A, 13B, 13C Third Fixed Electrode
14A, 14B, 14C Fourth Fixed Electrode
20 Spacer
20A, 20B, 20C Opening
30 Movable Electrode
30A Pressure Receiving Part
31A, 31B Outer Edge (First Outer Edge, Second Outer Edge)
61A, 61B, 61C First Insulator
62A, 62B, 62C Second Insulator
63A, 63B, 63C Third Insulator
71A, 71B, 71C First Elastic Member
72A, 72B, 72C Second Elastic Member
73A, 73B, 73C Third Elastic Member

The invention claimed is:
1. A switch body comprising:
a base including a first fixed electrode, a second fixed electrode placed next to the first fixed electrode to be electrically independent from the first fixed electrode, a third fixed electrode placed next to the second fixed electrode and on an opposite side of the second fixed electrode from the first fixed electrode, and a fourth fixed electrode placed next to the first fixed electrode and on an opposite side of the first fixed electrode from the second fixed electrode; and a movable electrode including a pressure receiving part opposite from the second fixed electrode of the base, a first outer edge facing the first fixed electrode, and a second outer edge facing the third fixed electrode, and the movable electrode being designed to allow movement of an opposite surface from the pressure receiving part toward the second fixed electrode when the pressure receiving part is pressed toward the base and then deformed a spacer holding the movable electrode with position thereof limited on the base, the fourth fixed electrode being formed in a region outside a projection region, wherein the projection region being a projection of the movable electrode on the base and the fourth fixed electrode is placed so that a distance between inner edges of the second fixed electrode and the fourth fixed electrode is shorter than a distance between the first outer edge and the second outer edge and a distance between outer edges of the second fixed electrode and the fourth fixed electrode is longer than the distance between the first outer edge and the second outer edge, the spacer including a flat region, the spacer being placed over the base to cover all of the fourth fixed electrode with the flat region.

2. The switch body according to claim 1, wherein:

the first outer edge is in contact with the first fixed electrode;

the second outer edge is in contact with the third fixed electrode;

the movable electrode is designed to electrically interconnect the first fixed electrode and the second fixed electrode by making the opposite surface from the pressure receiving part in contact with the second fixed electrode when the pressure receiving part is pressed toward the base and then deformed.

3. The switch body according to claim 2, wherein a shape of the first fixed electrode is same as a shape of the second fixed electrode.

4. The switch body according to claim 2, wherein the third fixed electrode is electrically connected to the first fixed electrode in the base.

5. The switch body according to claim 2, wherein the fourth fixed electrode is electrically connected to the second fixed electrode in the base.

6. The switch body according to claim 1, comprising:
a first insulator present on a surface of the first fixed electrode facing the movable electrode;
a second insulator present on a surface of the second fixed electrode facing the movable electrode; and
a third insulator present on a surface of the third fixed electrode facing the movable electrode.

7. The switch body according to claim 6, comprising:
a first elastic member between the first fixed electrode and the first insulator;
a second elastic member between the second fixed electrode and the second insulator; and
a third elastic member between the third fixed electrode and the third insulator.

8. The switch body according to claim 7, wherein the first elastic member, the second elastic member, and the third elastic member each are electrically conductive.

9. The switch body according to claim 1, wherein the spacer includes an opening accommodating the movable electrode,
wherein the spacer is placed over the base to cover the fourth fixed electrode with a region outside the opening of the spacer.

10. The switch body according to claim 1, wherein:
the first fixed electrode is one of a plurality of first fixed electrodes;
the second fixed electrode is one of a plurality of second fixed electrodes;
the third fixed electrode is one of a plurality of third fixed electrodes;
the fourth fixed electrode is one of a plurality of fourth fixed electrodes; and
the movable electrode is one of a plurality of movable electrodes.

* * * * *